United States Patent
Tsumura et al.

(10) Patent No.: US 7,371,462 B2
(45) Date of Patent: May 13, 2008

(54) HARDENABLE COMPOSITION, HARDENING PRODUCT, PROCESS FOR PRODUCING THE SAME AND LIGHT EMITTING DIODE SEALED WITH THE HARDENING PRODUCT

(75) Inventors: Manabu Tsumura, Settsu (JP); Masahito Ide, Settsu (JP); Katsuya Ouchi, Nishinomiya (JP); Masafumi Kuramoto, Anan (JP); Tomohide Miki, Anan (JP); Ikuya Nii, Anan (JP)

(73) Assignee: Kaneka Corporation, Osaka-Shi (JP)

( * ) Notice: Subject to any disclaimer, the term of this patent is extended or adjusted under 35 U.S.C. 154(b) by 60 days.

(21) Appl. No.: 10/512,135

(22) PCT Filed: Apr. 23, 2003

(86) PCT No.: PCT/JP03/05142

§ 371 (c)(1),
(2), (4) Date: May 3, 2005

(87) PCT Pub. No.: WO03/091338

PCT Pub. Date: Nov. 6, 2003

(65) Prior Publication Data

US 2005/0209400 A1    Sep. 22, 2005

(30) Foreign Application Priority Data

| Apr. 26, 2002 | (JP) | 2002-125947 |
| May 9, 2002 | (JP) | 2002-133412 |
| May 10, 2002 | (JP) | 2002-135022 |
| Aug. 1, 2002 | (JP) | 2002-225189 |
| Feb. 4, 2003 | (JP) | 2003-026649 |

(51) Int. Cl.
*B32B 9/04* (2006.01)
*C08G 77/06* (2006.01)

(52) U.S. Cl. .................. 428/447; 525/478; 525/479; 528/15; 528/34; 528/13; 438/137

(58) Field of Classification Search ............ None
See application file for complete search history.

(56) References Cited

U.S. PATENT DOCUMENTS

| 4,943,601 A | * | 7/1990 | Dinallo, Sr. ............ 524/265 |
| 5,684,110 A | * | 11/1997 | Kawamura ................ 528/15 |
| 2003/0144420 A1 | | 7/2003 | Tsumura et al. |
| 2004/0126504 A1 | * | 7/2004 | Ouchi et al. ............. 428/1.1 |

FOREIGN PATENT DOCUMENTS

| EP | 0 803 529 A1 | 10/1997 |
| EP | 1 369 458 A1 | 12/2003 |
| JP | 48-48500 | 5/1973 |
| JP | 59-155483 | 9/1984 |
| JP | 3-14838 | 1/1991 |
| JP | 3-247686 | 11/1991 |
| JP | 5-140459 | 6/1993 |
| JP | 8-183934 | 7/1996 |
| JP | 9-291214 | 11/1997 |
| JP | 9-316293 | 12/1997 |
| JP | 2000-124475 | 4/2000 |
| JP | 2002-80733 | 3/2002 |
| JP | 2002-194215 | 7/2002 |
| JP | 2002-235005 | 8/2002 |
| JP | 3354973 | 9/2002 |
| JP | 2002-314140 | 10/2002 |
| JP | 2002-317048 | 10/2002 |
| JP | 2002-324920 | 11/2002 |
| JP | 2002-338833 | 11/2002 |
| JP | WO 02/053648 | * 11/2002 |
| JP | 2003-113310 | 4/2003 |
| JP | 2003-128921 | 5/2003 |
| WO | WO 01/81475 A1 | 11/2001 |

\* cited by examiner

*Primary Examiner*—Marc S. Zimmer
(74) *Attorney, Agent, or Firm*—Kenyon & Kenyon LLP

(57) ABSTRACT

The present invention provides a curable composition providing a curing product having excellent adhesive properties and high transparency, or a curing product having high toughness and transparency.

A curable composition which contains (A) an organic compound containing at least two carbon-carbon double bonds reactive with a SiH group in each molecule, (B) a silicon compound having at least two SiH groups in each molecule, (C) a hydrosilylation catalyst, (D) a silane coupling agent and/or an epoxy group-containing compound, and (E) a silanol condensation catalyst. A light-emitting diode sealed with a curing product obtainable by curing said curable composition.

55 Claims, No Drawings

HARDENABLE COMPOSITION, HARDENING PRODUCT, PROCESS FOR PRODUCING THE SAME AND LIGHT EMITTING DIODE SEALED WITH THE HARDENING PRODUCT

This application is a 371 national phase application of PCT/JP03/05142 filed on 13 Apr. 2003, claiming priority to JP 2002-125947, filed on 26 Apr. 2002, JP 2002-133412 filed 9 May 2002, JP 2002-135022 filed 10 May 2002, JP 2002-225189 filed 1 Aug. 2002, and JP 2002-26649 filed 4 Feb. 2003, the contents of which are incorporate herein by reference in their entireties.

TECHNICAL FIELD

The present invention relates to a curable composition, a curing product thereof, a process for producing the curing product, and a light-emitting diode sealed with the curing product.

BACKGROUND ART

As an optical material including a sealing material for light-emitting diodes (LED), with the change of using environment in recent years, those having not only high optical transparency but also high adhesive properties have been demanded. When the adhesive properties are low, peeling occurs between an LED package and a sealant resin surface. By the occurrence of peeling, reflectivity may decrease, or in the case where the adhesive properties are significantly low, a sealant resin may possibly become unstuck from the package, thus leading to problems on credibility of final products. For example, a surface-packaged type LED is desired to have preferable adhesive properties with package constituent materials such as plastic, ceramics and silver.

On the other hand, as the optical material including a sealing material for light-emitting diodes (LED), with the change of using environment in recent years, those having not only high optical transparency but also high toughness have been also demanded. When the toughness of the sealant resin is low, for example, problems such as generation of a crack in reflowing a solder at the time of packaging an LED occur. Furthermore, problems such as generation of a crack due to irresistible change of using environment e.g. temperature change from high temperatures to low temperatures, etc. may also occur.

In the prior art, a technology applicable to adhesive sheets, finished cloths and the like has been proposed which utilizes a curable composition comprising an organosilicon compound, which is an addition reaction-curable (hydrosilylated) silicone having epoxy group- and alkoxy group-bound silicon atoms, and an organoaluminum compound and showing good adhesive properties (Japanese Kokai Publication Hei-08-183934, Japanese Kokai Publication Hei-05-140459). From the hardness, tucking ability, and optical characteristics viewpoint, however, the materials obtained by this technology are not suited for use as the transparent optical material, particularly the light-emitting diodes. Further, a technology of improving the adhesive properties of addition reaction-curable (hydrosilylated) liquid compositions by adding an epoxy resin and an aluminum compound has been proposed (Japanese Patent No. 3354973). However, there is no disclosure therein about the transparency of the obtained curing product, or the use in optical material, particularly light-emitting diodes.

Further, it has been disclosed that when a condensation reaction-curable silicone is used as a sealing material for building joints, the addition of a borate ester thereto enables manifestation of good adhesion to adherends even when the joints are shallow (Japanese Kokai Publication Sho-59-155483). However, this system is a room temperature curing one, and there is no disclosure either about effect manifestation upon heating for curing or about effect manifestation in the case of application to addition reaction type systems differing therefrom in mode of reaction.

On the other hand, a curable composition is known which comprises an aliphatic organic compound having, within the molecule, at least two carbon-carbon double bonds reactive with a SiH group, a compound containing at least two SiH groups within the molecule, and a hydrosilylation catalyst (WO 01-81475). A curing product obtainable by curing this curable composition can be preferably used as an optical material. However, in applications for films as optical materials, e.g. molded products such as lens, or sealing materials, high mechanical properties are demanded in addition to the optical characteristics in view of long-term reliability of materials. Herein, when the crosslinking density is high, the material becomes fragile, thus a problem of decrease in tensile characteristics arose.

Furthermore, a curable composition containing triallyl isocyanurate as a component has been also proposed (Japanese Kokai Publication Sho-50-100, Japanese Kokai Publication Hei-09-291214). The curable composition described in Japanese Kokai Publication Sho-50-100 is not sufficient in view of heat resistance since the obtained curing product is low in the glass transition temperature. Japanese Kokai Publication Hei-09-291214 does not disclose about the transparency of the obtained curing product from the curable composition, and also there is no disclosure about measures regarding the toughness control of a curing product.

SUMMARY OF THE INVENTION

Accordingly, the first object of the present invention is to provide a curable composition providing a curing product excellent in adhesive properties and high in transparency, and/or a curable composition providing a curing product excellent in adhesive properties, and high in toughness and transparency; a curing product obtainable by curing said curable composition; a process for producing said curing product; and a light-emitting diode using said curing product. The second and third objects of the present invention are to provide a curable composition providing a curing product high in toughness and transparency, a curing product obtainable by curing said curable composition, and a process for producing said curing product. The fourth object of the present invention is to provide a light-emitting diode using a curing product excellent in adhesive properties and high in transparency, and/or a light-emitting diode using a curing product excellent in adhesive properties and high in toughness and transparency. Thus, the first aspect of the present invention relates to:

a curable composition which contains (A) an organic compound containing at least two carbon-carbon double bonds reactive with a SiH group in each molecule, (B) a compound having at least two SiH groups in each molecule, (C) a hydrosilylation catalyst, (D) a silane coupling agent and/or an epoxy group-containing compound, and (E) a silanol condensation catalyst (Claim 1).

The preferable mode of the first aspect of the present invention is as follows.

The curable composition according to Claim 1, wherein the component (E) is an organoaluminum compound and/or a borate ester (Claim 2).

The curable composition according to Claim 1 or 2, wherein the component (D) is a silane coupling agent having at least one functional group selected from the group consisting of epoxy, methacryl, acryl, isocyanate, isocyanurate, vinyl and carbamate group and a hydrolyzable silyl group in each molecule (Claim 3).

The curable composition according to Claim 1 or 2, wherein the component (D) is a silane coupling agent having an epoxy group and a hydrolyzable silyl group in each molecule (Claim 4).

The curable composition according to any one of Claims 1 to 4, wherein the component (E) is an aluminum chelate compound and/or an aluminum alcoholate compound (Claim 5).

The curable composition according to any one of Claims 1 to 4, wherein the component (E) is at least one species selected from the group consisting of aluminum ethyl acetoacetate diisopropylate, aluminum ethyl acetoacetate diisobutylate, aluminum tris(ethyl acetoacetate), aluminum bis(ethyl acetoacetate) monoacetylacetonate, and aluminum tris(acetylacetonate) (Claim 6).

The curable composition according to any one of Claims 1 to 4, wherein the component (E) is at least one species selected from the group consisting of trinormaloctadecyl borate, trinormaloctyl borate, trinormalbutyl borate, triisopropyl borate, trinormalpropyl borate, triethyl borate and trimethyl borate (Claim 7).

The curable composition according to any one of Claims 1 to 7, wherein the component (A) is a compound represented by the following general formula (I):

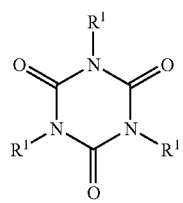

(I)

in the formula, each R¹ represents a univalent organic group containing 1 to 50 carbon atoms and each R¹ groups may be the same or different (Claim 8).

The curable composition according to any one of Claims 1 to 7, wherein the component (A) is triallyl isocyanurate and the component (B) is a reaction product from 1,3,5,7-tetramethylcyclotetrasiloxane and triallyl isocyanurate (Claim 9).

The curable composition according to any one of Claims 1 to 7, which contains a compound represented by the following general formula (II) as the component (A):

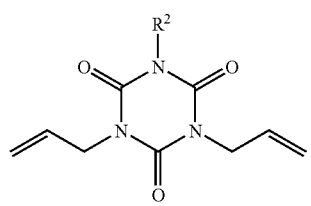

(II)

in the formula, R² represents a hydrogen atom, or an organic group which does not contain a functional group subjectable to hydrosilylation reaction (Claim 10).

The curable composition according to Claim 10, which further contains triallyl isocyanurate as the component (A) (Claim 11).

The curable composition according to Claim 10 or 11, wherein R² represents a hydrogen atom, or a univalent organic group containing 1 to 50 carbon atoms (Claim 12).

The curable composition according to any one of Claims 10 to 12, wherein the compound represented by the general formula (II) accounts for 20% by weight or more in the component (A) (Claim 13).

The curable composition according to any one of Claims 11 to 13, wherein the compound represented by the general formula (II) is diallyl monoglycidyl isocyanurate (Claim 14).

The curable composition according to Claim 14, wherein the component (B) is a reaction product from 1,3,5,7-tetramethylcyclotetrasiloxane and triallyl isocyanurate (Claim 15).

The curable composition according to any one of Claims 1 to 15, wherein the component (B) contains a compound obtainable by hydrosilylation reaction between a compound represented by the following general formula (III):

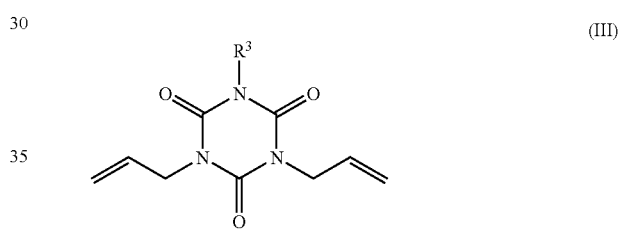

(III)

(in the formula, R³ represents a hydrogen atom, or an organic group which does not contain a functional group subjectable to hydrosilylation reaction) and a compound having at least two SiH groups in each molecule, and/or a compound obtainable by hydrosilylation reaction between a compound represented by the following general formula (IV):

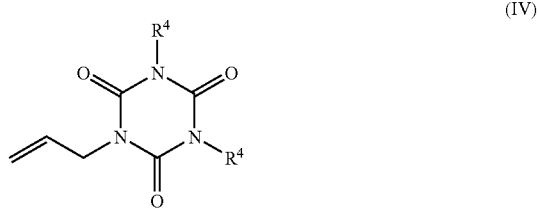

(IV)

(in the formula, R⁴ represents a hydrogen atom, or an organic group which does not contain a functional group subjectable to hydrosilylation reaction, and each R⁴ may be the same or different) and a compound having at least three SiH groups in each molecule (Claim 16).

The curable composition according to Claim 16, wherein R³ and R⁴ represent hydrogen atoms or univalent organic groups containing 1 to 50 carbon atoms (Claim 17).

The curable composition according to Claim 16, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate (Claim 18).

The curable composition according to Claim 16, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate as exclusive constituents (Claim 19).

The curable composition according to any one of Claims 16 to 19, wherein the component (A) is triallyl isocyanurate (Claim 20).

The curable composition according to any one of Claims 16 to 19, wherein the component (A) is a mixture of triallyl isocyanurate and diallyl monoglycidyl isocyanurate (Claim 21).

In addition, the first aspect of the present invention is a curing product which is obtainable by curing the curable composition according to any one of Claims 1 to 21 (Claim 22).

Moreover, the first aspect of the present invention is a process for producing a curing product which comprises curing the curable composition according to any one of Claims 1 to 21 (Claim 23).

Furthermore, the first aspect of the present invention is a light-emitting diode which is sealed with the curing product according to Claim 22 (Claim 24).

The second aspect of the present invention relates to a curable composition which contains (A) an organic compound containing at least two carbon-carbon double bonds reactive with a SiH group in each molecule, (B) a compound having at least two SiH groups in each molecule, and (C) a hydrosilylation catalyst, in which a compound represented by the following general formula (II):

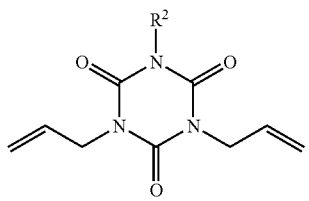

(II)

(in the formula, $R^2$ represents a hydrogen atom, or an organic group which does not contain a functional group subjectable to hydrosilylation reaction) is contained as the component (A) (Claim 25).

The preferable mode of the second aspect of the present invention is as follows.

The curable composition according to Claim 25, which further contains triallyl isocyanurate as the component (A) (Claim 26).

The curable composition according to Claim 25 or 26, wherein $R^2$ represents a hydrogen atom, or a univalent organic group containing 1 to 50 carbon atoms (Claim 27).

The curable composition according to any one of Claims 25 to 27, wherein the compound represented by the general formula (II) accounts for 20% by weight or more in the component (A) (Claim 28).

The curable composition according to any one of Claims 26 to 28, wherein the compound represented by the general formula (II) is diallyl monoglycidyl isocyanurate (Claim 29).

The curable composition according to Claim 29, wherein the component (B) is a reaction product from 1,3,5,7-tetramethylcyclotetrasiloxane and triallyl isocyanurate (Claim 30).

Moreover, the second aspect of the present invention is a curing product which is obtainable by curing the curable composition according to any one of Claims 25 to 30 (Claim 31).

Furthermore, the second aspect of the present invention is a process for producing a curing product which comprises curing the curable composition according to any one of Claims 25 to 30 (Claim 32).

The third aspect of the present invention relates to a curable composition which contains (A) an organic compound containing at least two carbon-carbon double bonds reactive with a SiH group in each molecule, (B) a compound having at least two SiH groups in each molecule, and (C) a hydrosilylation catalyst, in which the component (B) contains a compound obtainable by hydrosilylation reaction between a compound represented by the following general formula (III):

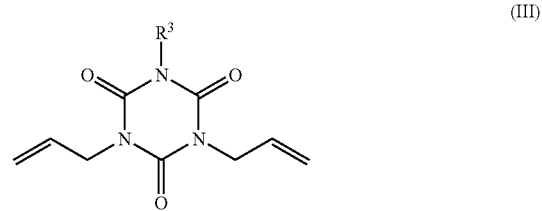

(III)

(in the formula, $R^3$ represents a hydrogen atom, or an organic group which does not contain a functional group subjectable to hydrosilylation reaction) and a compound having at least two SiH groups in each molecule, and/or a compound obtainable by hydrosilylation reaction between a compound represented by the following general formula (IV):

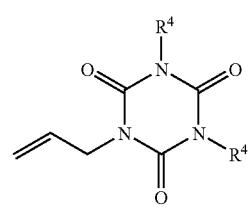

(IV)

(in the formula, $R^4$ represents a hydrogen atom, or an organic group which does not contain a functional group subjectable to hydrosilylation reaction, and each $R^4$ may be the same or different) and a compound having at least three SiH groups in each molecule (Claim 33).

The preferable mode of the third aspect of the present invention is as follows.

The curable composition according to Claim 33, wherein $R^3$ and $R^4$ represent hydrogen atoms, or univalent organic groups containing 1 to 50 carbon atoms (Claim 34).

The curable composition according to Claim 33, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate (Claim 35).

The curable composition according to Claim 33, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate as exclusive constituents (Claim 36).

The curable composition according to any one of Claims 33 to 36, wherein the component (A) is triallyl isocyanurate (Claim 37).

The curable composition according to any one of Claims 33 to 36, wherein the component (A) is a mixture of triallyl isocyanurate and diallyl monoglycidyl isocyanurate (Claim 38).

Moreover, the third aspect of the present invention is a curing product which is obtainable by curing the curable composition according to any one of Claims 33 to 38 (Claim 39).

Furthermore, the third aspect of the present invention is a process for producing a curing product which comprises curing the curable composition according to any one of Claims 33 to 38 (Claim 40).

The fourth aspect of the present invention relates to a light-emitting diode which comprises a light emitting element, a substrate on the top surface of which is formed with an external electrode to be disposed with said light emitting element, and a sealing member disposed adjacently onto said substrate, the contact surface between said electrode and said sealing member being 50 to 90% when the contact surface between said substrate and said sealing member is set at 100%, and said sealing member being a curing product obtainable from a curable composition containing (A) an organic compound containing at least two carbon-carbon double bonds reactive with a SiH group in each molecule, (B) a compound having at least two SiH groups in each molecule, (C) a hydrosilylation catalyst, (D) a silane coupling agent and/or an epoxy group-containing compound, and (E) a silanol condensation catalyst (Claim 41).

In the light emitting element according to Claim 41, preferably, the substrate is formed from a composition containing a semicrystalline polymer resin (Claim 42).

Furthermore, the fourth aspect of the present invention relates to a light-emitting diode which comprises a light emitting element, a package comprising an aperture having a bottom surface to be disposed with said light emitting element and sidewalls, and a sealing member for sealing said aperture, said package being formed of a molding resin by a monolithic process with one end of the external electrode being exposed on said aperture bottom, the area of said external electrode on said aperture bottom being 50 to 90% when the surface area of said aperture bottom is set at 100% and said sealing member being a curing product obtainable from a curable composition containing (A) an organic compound containing at least two carbon-carbon double bonds reactive with a SiH group in each molecule, (B) a compound having at least two SiH groups in each molecule, (C) a hydrosilylation catalyst, (D) a silane coupling agent and/or an epoxy group-containing compound, and (E) a silanol condensation catalyst (Claim 43).

In the light-emitting diode according to Claim 43, preferably, the package is formed of a molding resin by a monolithic process with the respective ends of an external positive electrode and an external negative electrode being exposed at a predetermined distance on the aperture bottom, and the respective exposed external electrode on said aperture bottom having at least one pair of resin exposure parts of the molding resin of the package (Claim 44).

In the light-emitting diode according to Claim 43 or 44, preferably, the molding resin of the package is a composition containing a semicrystalline polymer resin (Claim 45).

The preferable mode of the fourth aspect of the present invention is as follows.

The light-emitting diode according to any one of Claims 41 to 45, wherein the component (D) is a silane coupling agent having at least one functional group selected from the group consisting of epoxy, methacryl, acryl, isocyanate, isocyanurate, vinyl and carbamate group and a hydrolyzable silyl group in each molecule (Claim 46).

The light-emitting diode according to any one of Claims 41 to 46, wherein the component (E) is an organoaluminum compound and/or a borate ester (Claim 47).

The light-emitting diode according to any one of Claims 41 to 46, wherein the component (E) is at least one species selected from the group consisting of aluminum ethyl acetoacetate diisopropylate, aluminum ethyl acetoacetate diisobutylate, aluminum tris(ethyl acetoacetate), aluminum bis(ethyl acetoacetate) monoacetylacetonate, and aluminum tris(acetylacetonate) (Claim 48).

The light-emitting diode according to any one of Claims 41 to 46, wherein the component (E) is at least one species selected from the group consisting of trinormaloctadecyl borate, trinormaloctyl borate, trinormalbutyl borate, triisopropyl borate, trinormalpropyl borate, triethyl borate and trimethyl borate (Claim 49).

The light-emitting diode according to any one of Claims 41 to 49, wherein the component (A) is triallyl isocyanurate and the component (B) is a reaction product from 1,3,5,7-tetramethylcyclotetrasiloxane and triallyl isocyanurate (Claim 50).

The light-emitting diode according to any one of Claims 41 to 49, wherein the curable composition contains a compound represented by the following general formula (II) as the component (A):

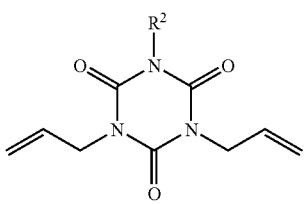

(II)

in the formula, $R^2$ represents a hydrogen atom, or an organic group which does not contain a functional group subjectable to hydrosilylation reaction (Claim 51).

The light-emitting diode according to Claim 51, wherein the curable composition further contains triallyl isocyanurate as the component (A) (Claim 52).

The light-emitting diode according to Claim 51 or 52, wherein the compound represented by the general formula (II) accounts for 20% by weight or more in the component (A) (Claim 53).

The light-emitting diode according to any one of Claims 51 to 53, wherein the compound represented by the general formula (II) is diallyl monoglycidyl isocyanurate (Claim 54).

The light-emitting diode according to Claim 54, wherein the component (B) is a reaction product from 1,3,5,7-tetramethylcyclotetrasiloxane and triallyl isocyanurate (Claim 55).

The light-emitting diode according to any one of Claims 41 to 54, wherein the component (B) contains a compound obtainable by hydrosilylation reaction between a compound represented by the following general formula (III):

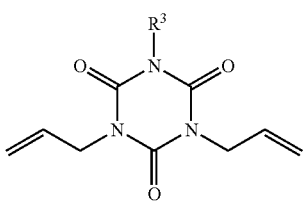

(III)

(in the formula, $R^3$ represents a hydrogen atom, or an organic group which does not contain a functional group subjectable to hydrosilylation reaction) and a compound having at least two SiH groups in each molecule, and/or a compound obtainable by hydrosilylation reaction between a compound represented by the following general formula (IV):

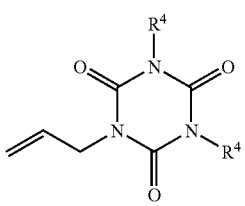

(IV)

(in the formula, $R^4$ represents a hydrogen atom, or an organic group which does not contain a functional group subjectable to hydrosilylation reaction and each $R^4$ may be the same or different) and a compound having at least three SiH groups in each molecule (Claim 56).

The light-emitting diode according to Claim 56, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate (Claim 57).

The light-emitting diode according to Claim 56, wherein the curable composition contains, as the component (B), a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate as exclusive constituents (Claim 58).

The light-emitting diode according to any one of Claims 56 to 58, wherein the component (A) is triallyl isocyanurate (Claim 59).

The light-emitting diode according to any one of Claims 56 to 58, wherein the component (A) is a mixture of triallyl isocyanurate and diallyl monoglycidyl isocyanurate (Claim 60).

Furthermore, the fourth aspect of the present invention relates to a light-emitting diode which comprises a light emitting element, a package comprising an aperture having a bottom surface to be disposed with said light emitting element and sidewalls, and a sealing member for sealing said aperture, said package being formed of a molding resin by a monolithic process with one end of the external electrode being exposed on said aperture bottom, the area of said external electrode on said aperture bottom being 50 to 90% when the surface area of said aperture bottom is set at 100% and said sealing member containing the curing product according to Claim 31 or 39 (Claim 61).

In the light-emitting diode according to Claim 61, preferably, the package is formed of a molding resin by a monolithic process with the respective ends of an external positive electrode and an external negative electrode being exposed at a predetermined distance on the aperture bottom, and the respective exposed external electrode on said aperture bottom having at least one pair of resin exposure parts of the molding resin of the package.

In the light-emitting diode according to Claim 61 or 62, preferably, the molding resin of the package is a composition containing a semicrystalline polymer resin (Claim 63).

DETAILED DESCRIPTION OF THE INVENTION

In the following, the present invention is described in detail.

<First Aspect of the Invention>

First, the component (A) of the present invention is described.

The component (A) is not particularly restricted but may be any organic compound having at least two carbon-carbon double bonds reactive with a SiH group in each molecule. The above organic compound is preferably a compound other than a polysiloxane-organic block copolymer, a polysiloxane-organic graft copolymer or a like siloxane unit (Si—O—Si)-containing one, and more preferably a compound comprising C, H, N, O, S and/or halogen, as exclusive constituent elements. Siloxane unit-containing compounds have gas permeability and cissing problems.

The sites of occurrence of the carbon-carbon double bonds reactive with a SiH group are not particularly restricted but may be anywhere within the molecule.

The component (A) to be used may contain one single species or a mixture of two or more species.

The component (A) compound may be classified as an organic polymer type compound or as an organic monomer type compound.

The organic polymer type compounds are not particularly restricted, but for example, there may be mentioned polyether type, polyester type, polyarylate type, polycarbonate type, saturated hydrocarbon type, unsaturated hydrocarbon type, polyacrylic ester type, polyamide type, phenol-formaldehyde type (phenol resin type), and polyimide type compounds, etc.

The organic monomer type compounds are not particularly restricted, but for example, there maybe mentioned phenol type, bisphenol type, benzene, naphthalene or like aromatic hydrocarbon type compounds; aliphatic (e.g. chain, cyclic) hydrocarbon type compounds; heterocyclic type compounds; mixtures of these, etc.

The carbon-carbon double bonds reactive with a SiH group in the component (A) are not particularly restricted but, from the reactivity viewpoint, those groups represented by the following general formula (V):

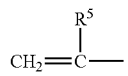

(V)

wherein $R^2$ represents a hydrogen atom or a methyl group, are preferred. Among the groups represented by the above general formula (V), from the material availability viewpoint, the group represented by

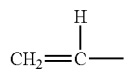

is particularly preferred.

Moreover, preferred as the carbon-carbon double bonds reactive with a SiH group in the component (A) are alicyclic groups having a partial structure represented by the following general formula (VI):

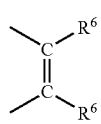

(VI)

wherein each $R^6$ represents a hydrogen atom or a methyl group and the two $R^6$ groups may be the same or different, in the ring structure, since high heat resistance can be given to curing products. Among them, from the material availability viewpoint, alicyclic groups having a partial structure represented by the following formula

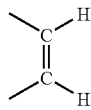

in the ring structure are preferred.

The carbon-carbon double bonds reactive with a SiH group each may be directly bonded to the skeletal portion of the component (A) or covalently bonded thereto via a bivalent or polyvalent substituent. The above bivalent or polyvalent substituent is not particularly restricted but preferably a substituent containing 0 to 10 carbon atoms, and more preferably one containing C, H, N, O, S and halogen, as exclusive constituent elements. Examples of the above-mentioned bivalent or polyvalent substituent are:

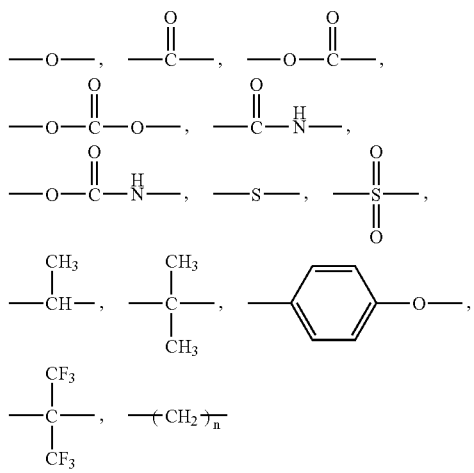

(n representing a number of 1 to 10),

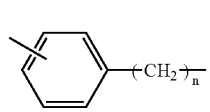

(n representing a number of 0 to 4), and

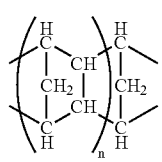

(n representing a number of 0 to 4), etc. Two or more of the bivalent or polyvalent substituents recited above may be covalently bonded together to form one bivalent or polyvalent substituent.

As examples of the group covalently bonded to a skeletal portion of the component (A), there may be mentioned vinyl, allyl, methallyl, acryl, methacryl, 2-hydroxy-3-(allyloxy)propyl, 2-allylphenyl, 3-allylphenyl, 4-allylphenyl, 2-(allyloxy)phenyl, 3-(allyloxy)phenyl, 4-(allyloxy)phenyl, 2-(allyloxy)ethyl, 2,2-bis(allyloxymethyl)butyl, 3-allyloxy-2,2-bis(allyloxymethyl)propyl, —(CH—CH$_2$—O)$_n$CH$_2$—CH=CH$_2$ (n representing a number satisfying the relation 5≧n≧2),

(R representing a bivalent group selected from among

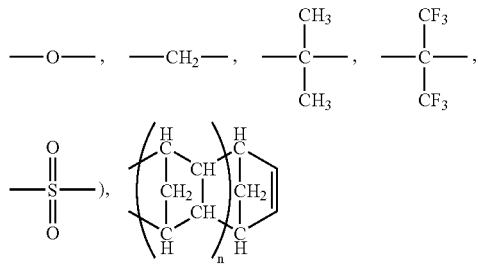

(n representing a number of 0 to 4), and the like.

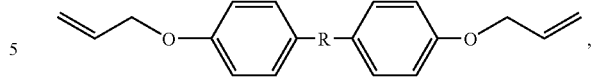

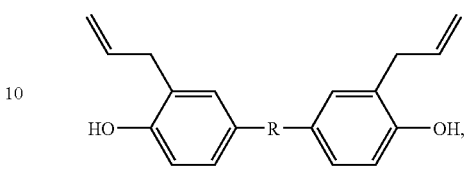

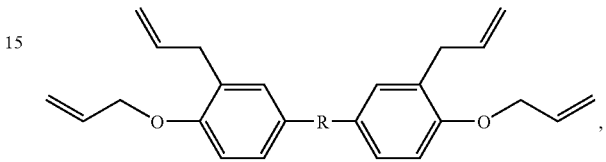

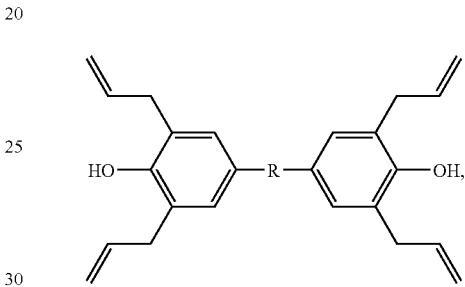

(R representing a bivalent group selected from among

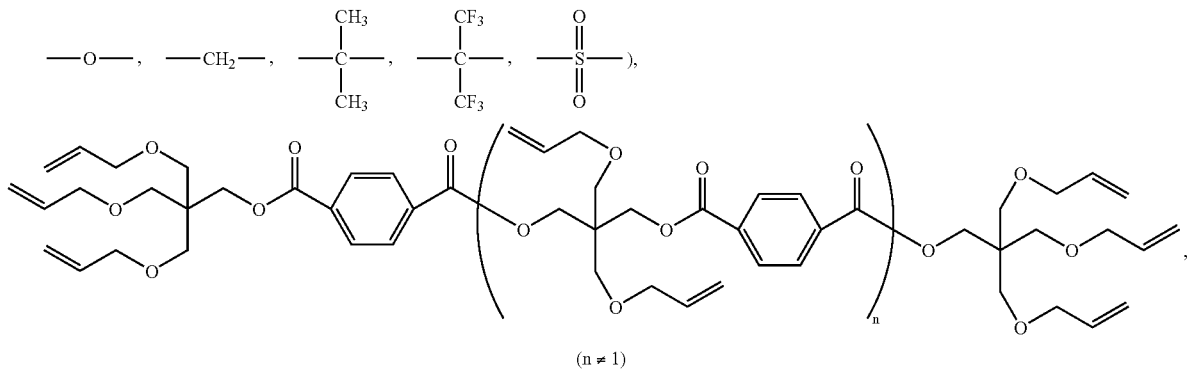

(n ≠ 1)

As specific examples of the component (A), there may be mentioned diallyl phthalate, triallyl trimellitate, diethylene glycol bis(allyl carbonate), trimethylolpropane diallyl ether, pentaerythritol triallyl ether, 1,1,2,2-tetraallyloxyethane, diallylidenepentaerythritol, triallyl cyanurate, triallyl isocyanurate, 2,2-bis(4-hydroxy cyclohexyl)propane diallyl ether, 1,2,4-trivinylcyclohexane, divinylbenzenes (purity 50 to 100%, preferably 80 to 100%), divinylbiphenyl, 1,3-diisopropenylbenzene, 1,4-diisopropenylbenzene, and oligomers thereof, 1,2-polybutadiene (1,2 content 10 to 100%, preferably 50 to 100%), novolak phenol allyl ether, allylated poly(phenylene oxide),

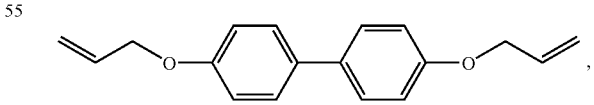

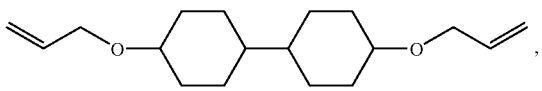

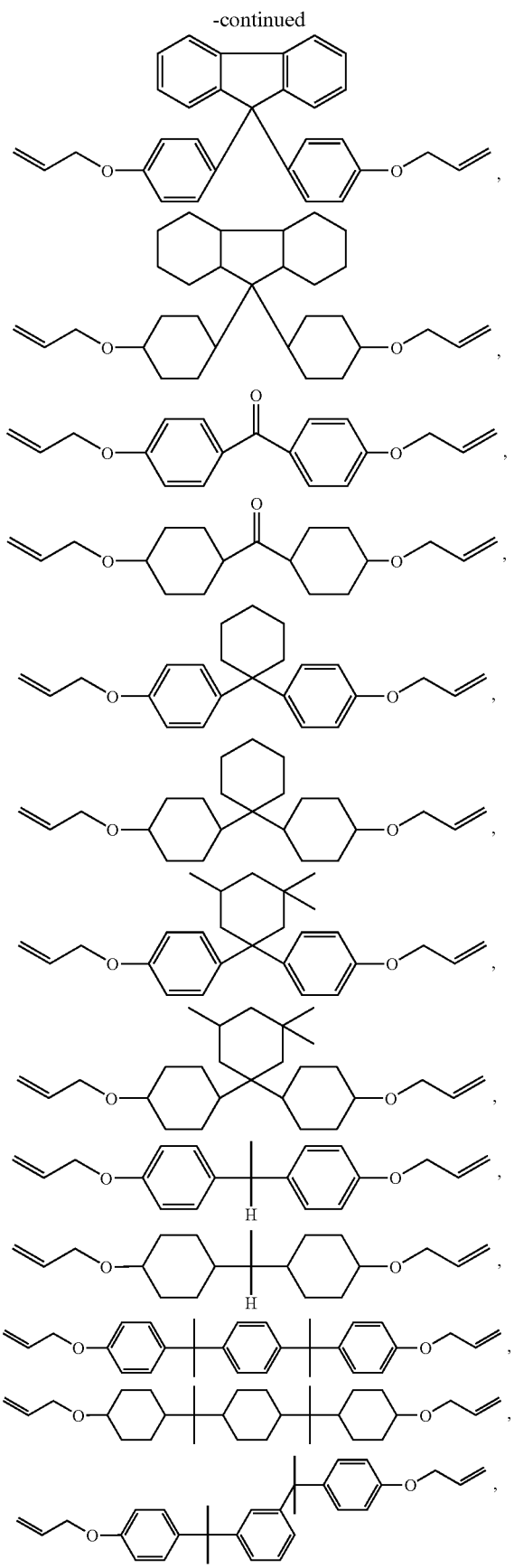

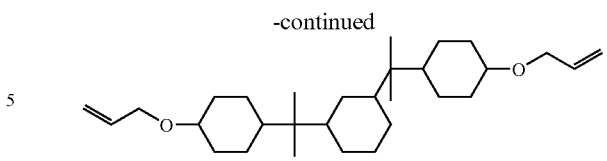

and, further, products derived from epoxy resins by allyl group substitution for part or all of the glycidyl groups of the resins.

Also usable as the component (A) are low-molecular-weight compounds which can hardly be expressed dividedly in terms of a skeletal portion and a carbon-carbon double bond. As specific examples of the above low-molecular-weight compounds, there may be mentioned aliphatic linear polyene compounds such as butadiene, isoprene, octadiene and decadiene, alicyclic polyene compounds such as cyclopentadiene, cyclohexadiene, cyclooctadiene, dicyclopentadiene, tricyclopentadiene and norbornadiene, substituted alicyclic olefin compounds such as vinylcyclopentene and vinylcyclohexene, etc.

From the viewpoint of the possibility of achieving further improvements in heat resistance, it is preferred that the component (A) contain the carbon-carbon double bonds reactive with a SiH group in an amount of not less than 0.001 mole, more preferably not less than 0.005 mole, still more preferably not less than 0.008 mole, per gram of the component (A).

As for the number of carbon-carbon double bonds reactive with a SiH group in the component (A), it is only required that the number be at least 2 per molecule. For achieving further improvements in mechanical strength, the number is preferably more than 2, more preferably not less than 3. However, when the component (A) is a mixture comprising various compounds, and the number of the above carbon-carbon double bonds of the respective compounds cannot be identified, the average number of the above carbon-carbon double bond per molecule in the above entire mixture is determined, and then that number is taken as the number of the carbon-carbon double bonds of the component (A). If the number of carbon-carbon double bonds reactive with a SiH group in the component (A) is 1 or less per molecule, the component (A), upon reacting with the component (B), will only give a graft structure but will fail to give a crosslinked structure.

From the good reactivity viewpoint, the component (A) preferably contains at least one vinyl group, more preferably two or more vinyl groups, in each molecule. From the viewpoint of tendency toward better storage stability, it preferably contains not more than 6 vinyl groups, more preferably not more than 4 vinyl groups, in each molecule.

From the viewpoint of high mechanical heat resistance and from the viewpoint of less stringiness, good moldability, and handleability, the component (A) preferably has a molecular weight lower than 900, more preferably lower than 700, still more preferably lower than 500.

For attaining uniform admixture with other components and good workability, the component (A) preferably has a viscosity at 23° C. of lower than 100 Pa·s, more preferably lower than 30 Pa·s, still more preferably lower than 3 Pa·s. The viscosity can be determined using an E type viscometer.

From the viewpoint of inhibition of coloration (in particular yellowing), the component (A) is preferably low in content of a compound having a phenolic hydroxyl group and a group derived from a phenolic hydroxyl group and, more preferably, it is free of any compound having a phenolic hydroxyl group and a group derived from a phenolic hydroxyl group. The term "phenolic hydroxyl group" so referred to herein means a hydroxyl group directly bound to an aromatic hydrocarbon moiety, for example a benzene, naphthalene or anthracene ring, and the "group derived from a phenolic hydroxyl group" means a group resulting from substitution of an alkyl (e.g. methyl, ethyl, etc.), alkenyl (e.g. vinyl, allyl, etc.), acyl (e.g. acetoxyl, etc.) group for the hydrogen atom of the above phenolic hydroxyl group.

From the viewpoint of preferable optical characteristics such as low complex reflective index and low optical elastic coefficient as well as preferable weather resistance, the component (A) preferably contains the aromatic ring component weight ratio of not more than 50% by weight, more preferably 40% by weight, and still more preferably 30% by weight. Most preferably, the component (A) does not contain any aromatic hydrocarbon ring.

Preferred as the component (A) from the viewpoint of less coloration, high optical transparency and high light resistance of the curing product obtained are vinylcyclohexene, dicyclopentadiene, triallyl isocyanurate, 2,2-bis(4-hydroxycyclohexyl)propane diallyl ether, and 1,2,4-trivinylcyclohexane. Particularly preferred are triallyl isocyanurate, 2,2-bis(4-hydroxycyclohexyl)propane diallyl ether, and 1,2,4-trivinylcyclohexane.

The component (A) may have other reactive group than the carbon-carbon double bonds reactive with a SiH group. The above reactive group is not particularly restricted, but there may be mentioned the following groups, for example: epoxy, amino, radical-polymerizable unsaturated group, carboxyl, isocyanate, hydroxyl, alkoxysilyl group and so on. In cases where the component (A) has the above functional group, the curable composition obtained tends to show increased adhesive properties and the strength of the resulting curing product tends to become high. An epoxy group is preferred among those functional groups in view of the tendency for the resulting curable composition to have better adhesive properties. In view of the tendency for the resulting curing product to become higher in heat resistance, it is preferred that the component (A) has not less than one reactive group mentioned above per molecule on average.

From the high heat resistance and transparency viewpoint, the component (A) is preferably a compound represented by the following general formula (I):

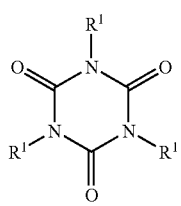
(I)

wherein each $R^1$ represents a univalent organic group containing 1 to 50 carbon atoms and the three $R^1$ groups may be the same or different.

From the viewpoint that the curing product obtained can have higher heat resistance, the group $R^1$ in the above general formula (I) is preferably a univalent organic group containing 1 to 20 carbon atoms, more preferably a univalent organic group containing 1 to 10 carbon atoms, still more preferably a univalent organic group containing 1 to 4 carbon atoms. As preferred examples of $R^1$, there may be mentioned methyl, ethyl, propyl, butyl, phenyl, benzyl, phenethyl, vinyl, allyl, glycidyl,

(n being a number of 4 to 19),

(n being a number of 2 to 18),

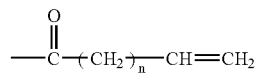

(n being a number of 0 to 17),

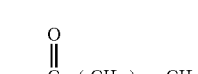

(n being a number of 0 to 19),

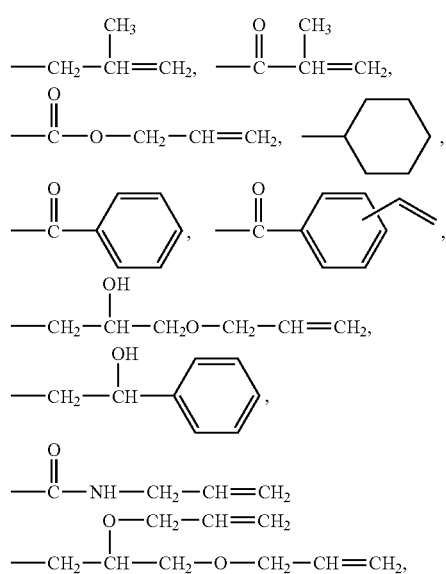

and the like.

From the viewpoint that the curing product to be obtained can be improved in adhesion to various materials, it is preferable that at least one of the three $R^1$ groups in the above general formula (I) is preferably a univalent organic group containing 1 to 50 carbon atoms and containing one or more epoxy groups, more preferably a univalent organic group containing 1 to 50 carbon atoms and containing one or more epoxy groups represented by the formula.

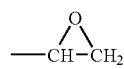

As the univalent organic group containing 1 to 50 carbon atoms and containing one or more epoxy group, preferably, glycidyl,

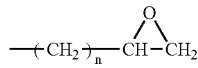

(n being a number of 2 to 18), and

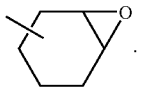

From the viewpoint that the curing product to be obtained can be improved in chemical heat resistance, the $R^1$ group in the above general formula (I) is preferably a univalent organic group containing 1 to 50 carbon atoms and containing no or at most two oxygen atoms and comprising C, H, N and/or O, as exclusive constituent elements, more preferably a univalent organic group containing 1 to 50 carbon atoms and containing no or at most two oxygen atoms and comprising C, H and/or O, as exclusive constituent elements, and sill more preferably a univalent hydrocarbon group containing 1 to 50 carbon atoms. As preferred examples of such $R^1$, there may be mentioned methyl, ethyl, propyl, butyl, phenyl, benzyl, phenethyl, vinyl, allyl, glycidyl,

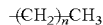

(n being a number of 4 to 19),

(n being a number of 2 to 18),

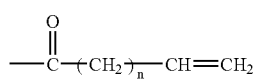

(n being a number of 0 to 17),

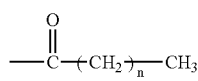

(n being a number of 0 to 19),

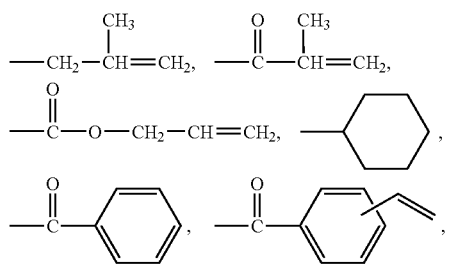

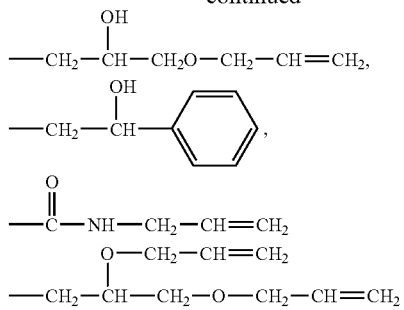

and the like.

From the better reactivity viewpoint, at least one of the three $R^1$ groups in the above general formula (I) is preferably a univalent organic group containing 1 to 50 carbon atoms and containing one or more groups represented by the formula:

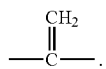

More preferably, at least one of the three $R^1$ groups is a univalent organic group containing 1 to 50 carbon atoms and containing one or more groups represented by the following general formula (VII):

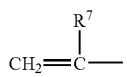

(VII)

wherein $R^7$ represents a hydrogen atom or a methyl group. Still more preferably, at least two of the three $R^1$ groups are organic groups each represented by the following general formula (VIII):

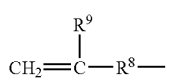

(VIII)

wherein $R^8$ represents a direct bond or a bivalent organic group containing 1 to 48 carbon atoms and $R^9$ represents a hydrogen atom or a methyl group (the plurality each of $R^8$ and $R^9$ groups may be the same or different).

From the viewpoint that the curing product obtained can be higher in heat resistance, $R^8$ in the above general formula (VIII), which may be a direct bond or a bivalent organic group containing 1 to 48 carbon atoms, is preferably a direct bond or a bivalent organic group containing 1 to 20 carbon atoms, more preferably a direct bond or a bivalent organic group containing 1 to 10 carbon atoms, still more preferably a direct bond or a bivalent organic group containing 1 to 4 carbon atoms. As examples of $R^8$ in such preferred cases, there maybe mentioned

(n being a number of 1 to 17),

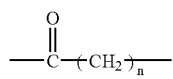

(n being a number of 0 to 16),

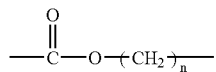

(n being a number of 0 to 16),

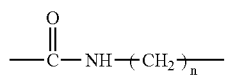

(n being a number of 0 to 16),

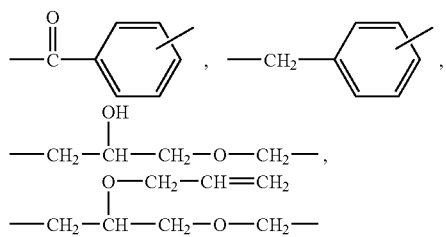

and the like.

From the viewpoint that the curing product obtained can be improved in chemical heat stability, $R^8$ in the above general formula (VIII) is preferably a direct bond or a bivalent organic group containing 1 to 48 carbon atoms and containing not more than two oxygen atoms and containing C, H and/or O, as exclusive constituent elements, more preferably a direct bond or a bivalent hydrocarbon group containing 1 to 48 carbon atoms. As examples of $R^8$ in such preferred cases, there may be mentioned —(CH$_2$)$_n$—

(n being a number of 1 to 17),

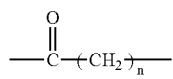

(n being a number of 0 to 16),

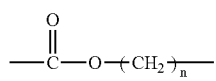

(n being a number of 0 to 16),

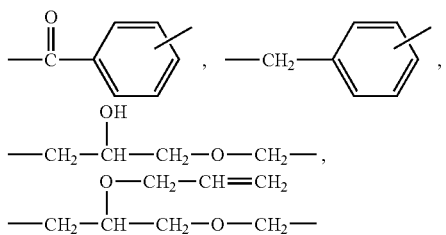

and the like.

From the better reactivity viewpoint, $R^9$ in the above general formula (VIII), which may be a hydrogen atom or a methyl group, is preferably a hydrogen atom.

Even in the organic compound of general formula (I) as mentioned above, however, it is necessary that there are at least two carbon-carbon double bonds reactive with a SiH group in each molecule. From the viewpoint of the possibility of further improvements in heat resistance, the compound of general formula (I) is more preferably an organic compound containing three or more carbon-carbon double bonds reactive with a SiH group in each molecule.

As preferred specific examples of the organic compound represented by the general formula (I), there may be mentioned triallyl isocyanurate,

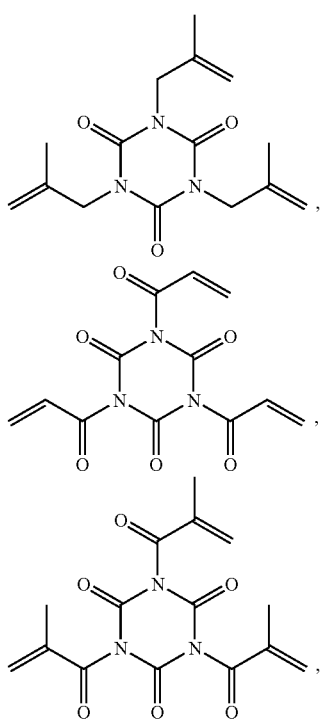

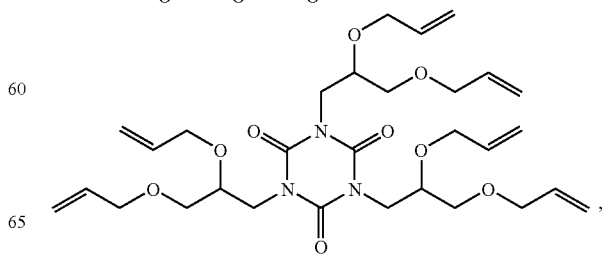

-continued
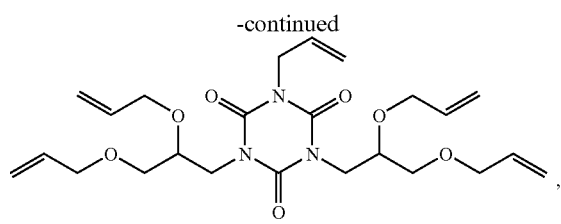
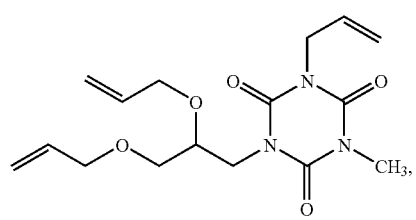
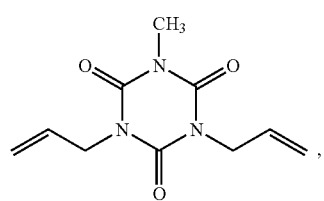
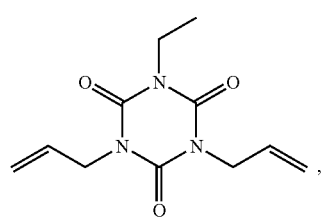
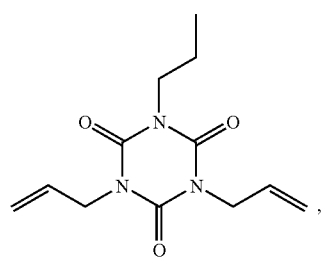
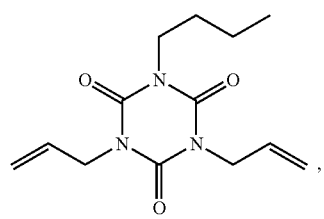
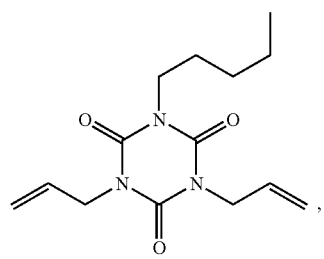
-continued
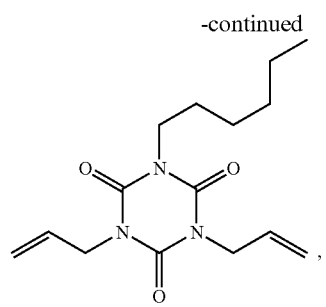
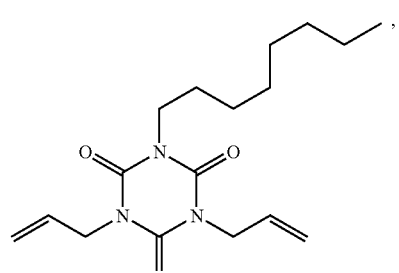
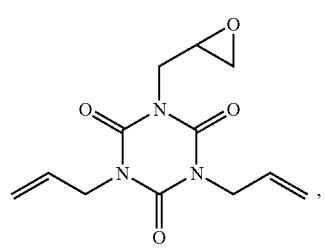
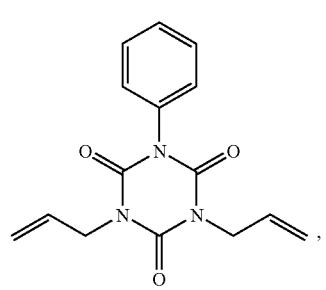
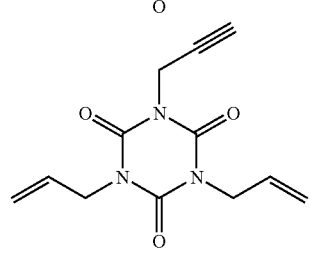

and the like. For improving the adhesive properties, triallyl isocyanurate is preferred as the component (A).

As the component (A), from the viewpoint of improving the mechanical properties, the compound represented by the following general formula (II) is preferred:

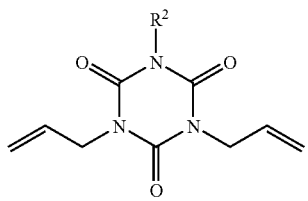

(II)

in the formula, $R^2$ represents a hydrogen atom, or an organic group which does not contain a functional group subjectable to hydrosilylation reaction.

The functional group subjectable to hydrosilylation reaction refers to a carbon-carbon unsaturated bond reactive with a SiH group, or a SiH group.

$R^2$ is not particularly restricted and may be a hydrogen atom or any organic groups which does not contain the above functional group, but preferably a hydrogen atom or a univalent organic group containing 1 to 50 carbon atoms, more preferably a hydrogen atom or a univalent organic group containing 1 to 20 carbon atoms, and still more preferably a hydrogen atom or a univalent organic group containing 1 to 10 carbon atoms. Specifically, there may be mentioned a hydrocarbon group, an organic group having an epoxy structure, and the like.

The compound represented by the above general formula (II) is not particularly restricted, but for example, there may be mentioned the following compounds, and the like.

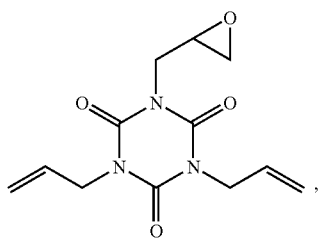

,

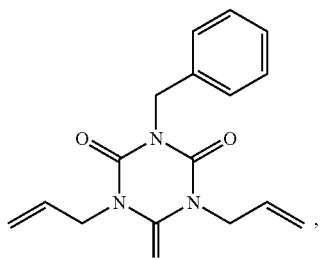

,

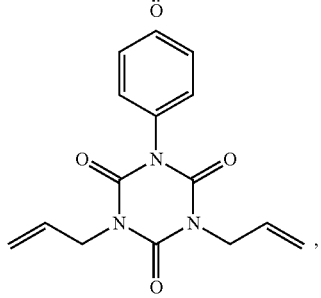

,

-continued

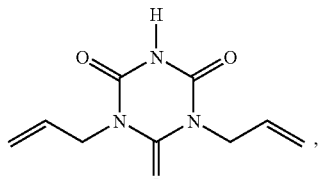

,

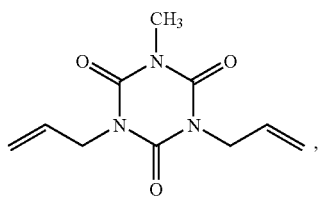

,

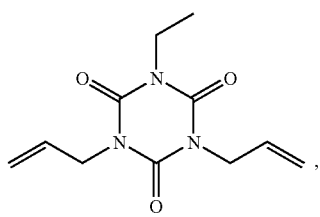

,

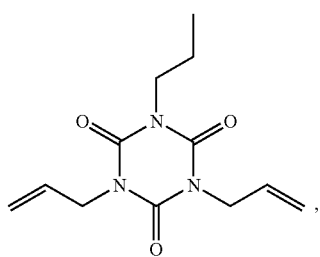

,

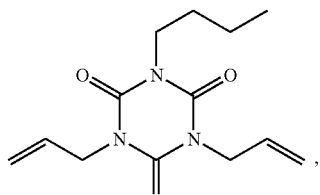

,

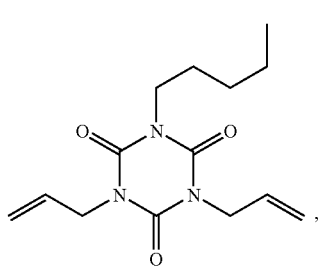

,

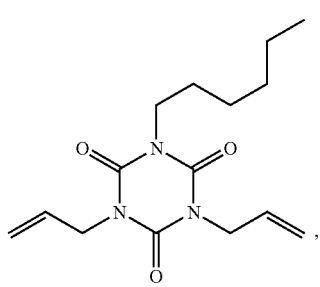

,

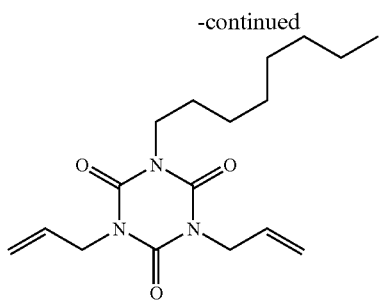

As the compound represented by the above general formula (II), preferred are diallyl monoglycidyl isocyanurate, diallyl monomethyl isocyanurate, diallyl monoethyl isocyanurate, diallyl monopropyl isocyanurate, diallyl monophenyl isocyanurate, and diallyl monobenzyl isocyanurate. Among them, from the viewpoint that the mechanical and adhesive properties can be both obtained, diallyl monoglycidyl isocyanurate is particularly preferred.

From the viewpoint of the balance between the mechanical and adhesive properties, it is preferable to use the compound represented by the general formula (II) being mixed with other species of the component (A), and in that case, it is more preferable that the compound represented by the general formula (II) accounts for not less than 20% by weight in the component (A).

For attaining a proper balance between the adhesive properties and light resistance, a mixture of triallyl isocyanurate and diallyl monoglycidyl isocyanurate is preferred as the component (A). The mixing ratio can be optionally selected. For achieving the above object, the triallyl isocyanurate/allyl monoglycidyl isocyanurate mole ratio is preferably 9/1 to 1/9, more preferably 8/2 to 2/8, most preferably 7/3 to 3/7.

An explanation is now made of the component (B) of the first aspect of the present invention.

The component (B) may be any compound containing at least two SiH groups in each molecule, without any other restriction. Thus, for example, those compounds which are described in International Laid-open Patent Application WO 96/15194 and have at least two SiH groups in each molecule and the like can be used.

From the availability viewpoint, linear and/or cyclic organopolysiloxanes having at least two SiH groups in each molecule are preferred. More specifically, there may be mentioned:

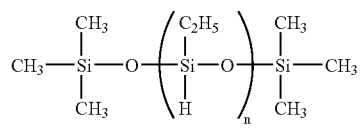

(n = 2~1000)

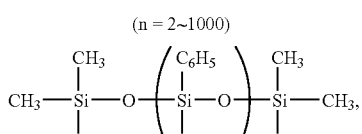

(n = 2~1000)

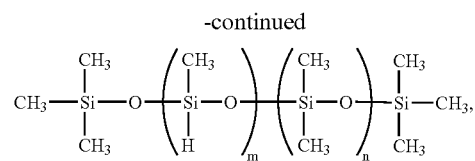

(m = 2~1000, n = 0~1000)

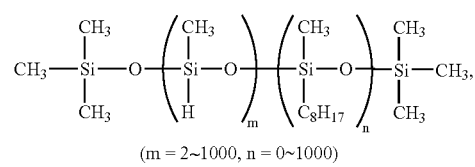

(m = 2~1000, n = 0~1000)

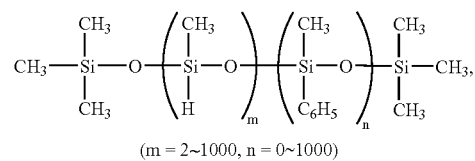

(m = 2~1000, n = 0~1000)

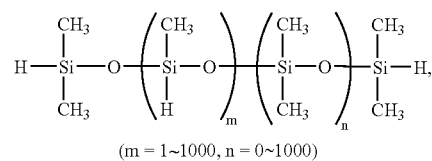

(m = 1~1000, n = 0~1000)

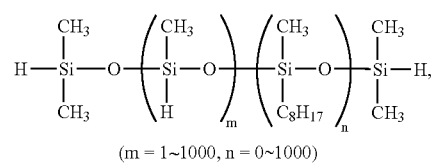

(m = 1~1000, n = 0~1000)

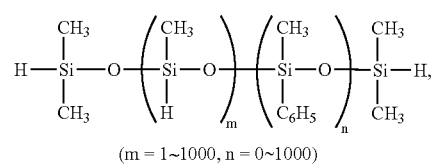

(m = 1~1000, n = 0~1000)

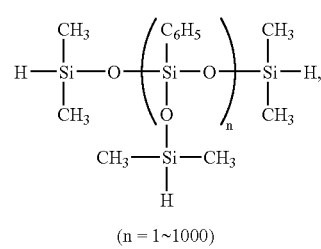

(n = 1~1000)

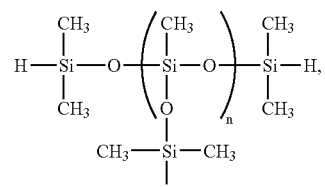

(n = 1~1000)

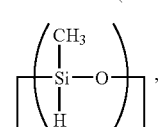

(n = 2~10)

-continued

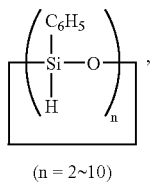

(n = 2~10)

and the like.

From the viewpoint of compatibility with the component (A), those cyclic organopolysiloxanes having at least two SiH groups in each molecule which are represented by the following general formula (IX):

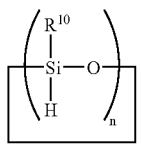

(IX)

wherein $R^{10}$ represents an organic group containing 1 to 6 carbon atoms and n represents a number of 3 to 10, are more preferred.

The substituent $R^{10}$ in the compounds represented by the general formula (IX) is preferably a substituent containing C, H and/or O as exclusive constituent elements, more preferably a hydrocarbon group, still more preferably a methyl group.

From the ready availability viewpoint, 1,3,5,7-tetramethylcyclotetrasiloxane is preferred as the compound represented by the general formula (IX).

The molecular weight of the component (B) is not particularly restricted but may be optionally selected. From the viewpoint that the fluidity can be manifested more easily, low molecular weights are preferred. In this case, the lower limit to the molecular weight is preferably 50, and the upper limit thereto is preferably 100,000, more preferably 1,000, still more preferably 700.

The component (B) to be used may contain one single species or a mixture of two or more species.

Further, from the viewpoint of good compatibility with the component (A) and from the viewpoint that the component (B) is low in volatility and the problem of outgassing from the resulting composition hardly occurs, those compounds which can be obtained by subjecting an organic compound (α) having one or more carbon-carbon double bonds reactive with a SiH group in each molecule and a linear and/or cyclic polyorganosiloxane (β) having at least two SiH groups in each molecule to hydrosilylation reaction are preferred as the component (B)

(Component (α))

Usable here as the component (α) are organic compounds (α1) which have at least two carbon-carbon double bonds reactive with a SiH group in each molecule and are to serve as the component (A) mentioned above. The use of such component (α1) tends to result in a high crosslink density and high mechanical strength of the curing product.

In addition, as the component (α), compounds (α2) having one carbon-carbon double bond reactive with a SiH group in each molecule can also be used. The use of the component (α2) tends to render the curing product low in elasticity.

The component (α2) is not particularly restricted but may be any compound having one carbon-carbon double bond reactive with a SiH group in each molecule. From the viewpoint of better compatibility between the component (B) and the component (A), however, an organic compound is preferred, more preferably a compound other than a polysiloxane-organic block copolymer, a polysiloxane-organic graft copolymer or a like siloxane unit (Si—O—Si)-containing one, and still more preferably a compound containing C, H, N, O, S and halogen, as exclusive constituent elements.

The sites of occurrence of the carbon-carbon double bonds reactive with a SiH group in component (α2) are not particularly restricted but may be anywhere within the molecule.

The component (α2) compound may be classified as a polymer type compound or as a monomer type compound.

Usable as the polymer type compound are not particularly restricted, but for example, polysiloxane type, polyether type, polyester type, polyarylate type, polycarbonate type, saturated hydrocarbon type, unsaturated hydrocarbon type, polyacrylic ester type, polyamide type, phenol-formaldehyde type (phenol resin type), polyimide type compounds, etc.

The monomer type compound are not particularly restricted, but for example, there may be mentioned phenol type, bisphenol type, benzene, naphthalene or like aromatic hydrocarbon type compounds; aliphatic (e.g. chain, cyclic, etc.) hydrocarbon type compounds; heterocyclic type compounds; silicon compounds; mixtures of these; etc.

The carbon-carbon double bonds reactive with a SiH group in the component (α2) are not particularly restricted but, from the reactivity viewpoint, those groups represented by the following general formula (V):

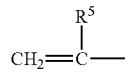

(V)

wherein $R^5$ represents a hydrogen atom or a methyl group, are preferred. Among the group represented by the general formula (V), from the material availability viewpoint, the group represented by

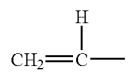

is particularly preferred.

Furthermore, preferred as the carbon-carbon double bonds reactive with a SiH group in the component (α2) are alicyclic groups having a partial structure represented by the following general formula (VI):

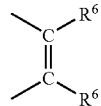

(VI)

wherein each $R^6$ represents a hydrogen atom or a methyl group and the two $R^6$ groups may be the same or different, in the ring structure, since high heat resistance can be given to curing products. From the material availability viewpoint, alicyclic groups having a partial structure represented by the following formula

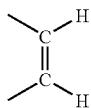

in the ring structure are preferred.

The carbon-carbon double bonds reactive with a SiH group each may be directly bonded to the skeletal portion of the component (α2) or covalently bonded thereto via a bivalent or polyvalent substituent. The above bivalent or polyvalent substituent is not particularly restricted but is preferably a substituent containing 0 to 10 carbon atoms. From the viewpoint of better compatibility between the component (B) and the component (A), however, a substituent containing C, H, N, O, S and halogen, as exclusive constituent elements is preferred. Examples of the above bivalent or polyvalent substituent are:

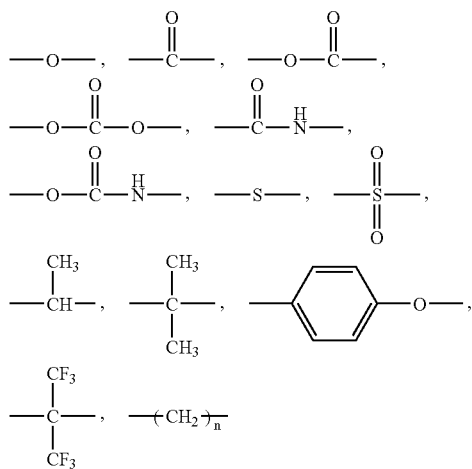

(n representing a number of 1 to 10),

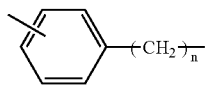

(n representing a number of 0 to 4), and

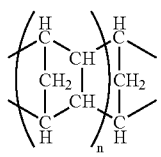

(n representing a number of 0 to 4), etc. Two or more of the bivalent or polyvalent substituents recited above may be covalently bonded together to form one bivalent or polyvalent substituent.

As examples of the group covalently bonded to the skeletal portion of the component (α2), there may be mentioned vinyl, allyl, methallyl, acryl, methacryl, 2-hydroxy-3-(allyloxy)propyl, 2-allylphenyl, 3-allylphenyl, 4-allylphenyl, 2-(allyloxy)phenyl, 3-(allyloxy)phenyl, 4-(allyloxy)phenyl, 2-(allyloxy)ethyl, 2,2-bis(allyloxymethyl)butyl, 3-allyloxy-2,2-bis(allyloxymethyl)propyl,

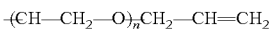

(n representing a number satisfying the relation 5≧n≧2),

(R representing a bivalent group selected from among

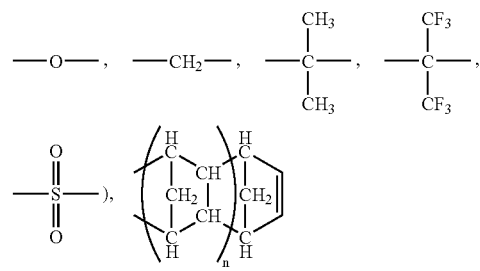

(n representing a number of 0 to 4), and the like.

As specific examples of the component (α2), there may be mentioned linear aliphatic hydrocarbon compounds such as propene, 1-butene, 1-pentene, 1-hexene, 1-heptene, 1-octene, 1-nonene, 1-decene, 1-dodecene, 1-undecene, Idemitsu Petrochemical's Linealene, 4,4-dimethyl-1-pentene, 2-methyl-1-hexene, 2,3,3-trimethyl-1-butene and 2,4,4-trimethyl-1-pentene; alicyclic hydrocarbon compounds such as cyclohexene, methylcyclohexene, methylenecyclohexane, norbornylene, ethylidenecyclohexane, vinylcyclohexane, camphene, carene, α-pinene and β-pinene; aromatic hydrocarbon compounds such as styrene, α-methylstyrene, indene, allylbenzene and 4-phenyl-1-butene; allyl ethers such as alkyl allyl ethers and allyl phenyl ether; aliphatic compounds such as glycerol monoallyl ether, ethylene glycol monoallyl ether and 4-vinyl-1,3-dioxolan-2-one; aromatic compounds such as 1,2-dimethoxy-4-allylbenzene and o-allylphenol; substituted isocyanurates such as monoallyl dibenzyl isocyanurate and monoallyl diglycidyl isocyanurate; silicon compounds such as vinyltrimethylsilane, vinyltrimethoxysilane and vinyltriphenylsilane; etc.

Furthermore, as the component (α2), there may be mentioned polymers and oligomers having a vinyl group at one end, for example polyether resins such as polyethylene oxide allylated at one end and polypropylene oxide allylated at one end; hydrocarbon resins such as polyisobutylene allylated at one end; acrylic resins such as poly(butyl acrylate) allylated at one end and poly (methyl methacrylate) allylated at one end; etc.

The structure may be linear or branched. The molecular weight is not particularly restricted but may be at any of various levels. The molecular weight distribution is not particularly restricted, either, but may be diverse. From the viewpoint that the mixture viscosity tends to become low and the moldability tends to become better, however, the molecular weight distribution is preferably not more than 3, more preferably not more than 2, still more preferably not more than 1.5.

The glass transition temperature of the component (α2), if any, is not particularly restricted, either, but may be diverse. In view of the tendency for the curing product obtained to become tough, however, the glass transition temperature is preferably not higher than 100° C., more preferably not higher than 50° C., still more preferably not higher than 0° C. As preferred examples of the polymer or oligomer, there may be mentioned poly(butyl acrylate) and the like. Conversely, in view of the tendency for the curing product obtained to become highly resistant to heat, the glass transition temperature is preferably not lower than 100° C., more preferably not lower than 120° C., still more preferably not lower than 150° C., most preferably not lower than 170° C.

The glass transition temperature can be determined by dynamic viscoelasticity measurement and expressed in terms of the temperature at which a maximum tanδ value is obtained.

In view of the tendency for the curing product obtained to become high in heat resistance, the component (α2) is preferably a hydrocarbon compound. In this case, the lower limit to the number of carbon atoms is 7, and a preferred upper limit thereto is 10.

The component (α2) may have other reactive group than the carbon-carbon double bonds reactive with a SiH group. The above reactive group is not particularly restricted, but there may be mentioned the following groups, for example: epoxy, amino, radical-polymerizable unsaturated group, carboxyl, isocyanate, hydroxyl, alkoxysilyl group and so on. In cases where the above component has the above functional group, the adhesive properties of the curable composition obtained tends to become higher and the strength of the curing product obtained tends to become high. From the higher adhesive properties viewpoint, an epoxy group is preferred among those functional groups. In view of the tendency for the resulting curing product to have a higher level of heat resistance, it is preferred that the above component have not less than one reactive group mentioned above per molecule on average. As specific examples, there may be mentioned monoallyl diglycidyl isocyanurate, allyl glycidyl ether, allyloxyethyl methacrylate, allyloxyethyl acrylate, vinyltrimethoxysilane, etc.

The components (α2) may be used singly or in combination of a plurality thereof.

(Component (β))

The component (β) is a linear and/or cyclic polyorganosiloxane having at least two SiH groups in each molecule. Specifically, there may be mentioned:

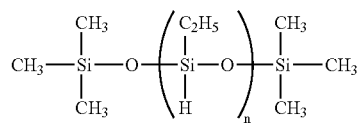

(n = 2~1000)

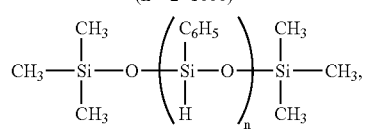

(n = 2~1000)

-continued

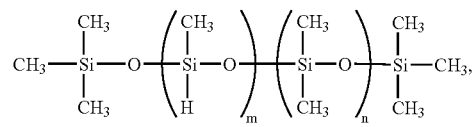

(m = 2~1000, n = 0~1000)

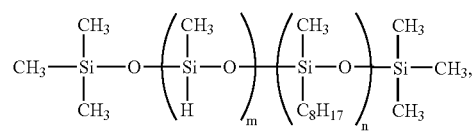

(m = 2~1000, n = 0~1000)

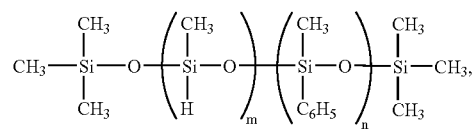

(m = 2~1000, n = 0~1000)

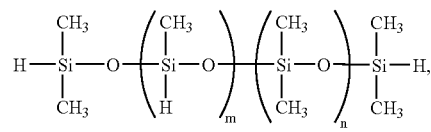

(m = 1~1000, n = 0~1000)

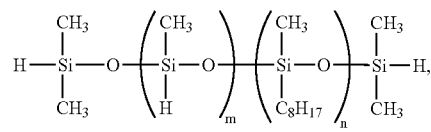

(m = 1~1000, n = 0~1000)

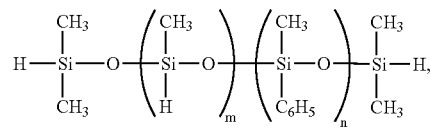

(m = 1~1000, n = 0~1000)

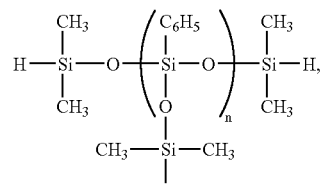

(n = 1~1000)

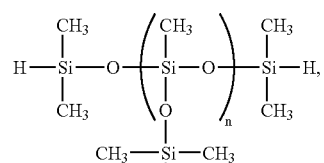

(n = 1~1000)

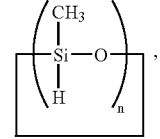

(n = 2~10)

-continued

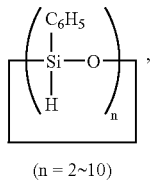

(n = 2~10)

and the like.

From the viewpoint that the compatibility with the component (α) tends to become better, those cyclic polyorganosiloxanes having at least three SiH groups in each molecule which are represented by the following general formula (IX):

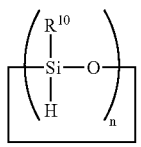

wherein $R^{10}$ represents an organic group containing 1 to 6 carbon atoms and n represents a number of 3 to 10, are preferred.

The substituent $R^{10}$ in the compounds represented by the general formula (IX) is preferably a substituent comprising C, H and/or O as exclusive constituent elements, more preferably a hydrocarbon group, still more preferably a methyl group.

As the compounds represented by the general formula (IX) 1,3,5,7-tetramethylcyclotetrasiloxane is preferred from the ready availability viewpoint, etc.

The component (β) may be used singly or as a mixture of two or more of them.

As the component (B), from the viewpoint of improving the mechanical properties, preferred is a compound obtainable by hydrosilylation reaction between a compound represented by the following general formula (III):

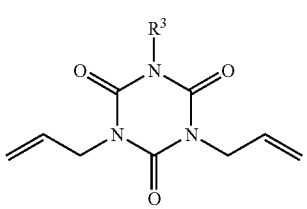

(III)

(in the formula, $R^3$ represents a hydrogen atom, or an organic group which does not contain a functional group subjectable to hydrosilylation reaction) and a compound having at least two SiH groups in each molecule, and/or a compound obtainable by hydrosilylation reaction between a compound represented by the following general formula

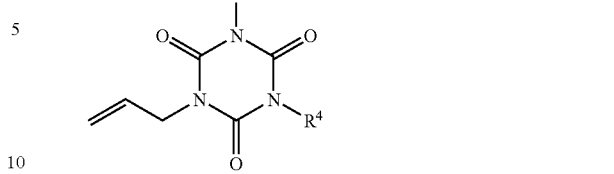

(IV)

(in the formula, $R^4$ represents a hydrogen atom, or an organic group which does not contain a functional group subjectable to hydrosilylation reaction, and each $R^4$ may be the same or different) and a compound having at least three SiH groups in each molecule.

The functional group subjectable to hydrosilylation reaction refers to a carbon-carbon unsaturated bond reactive with a SiH group, or a SiH group.

$R^3$ and $R^4$ are not particularly restricted and may be a hydrogen atom or any organic groups which does not contain the above functional group, but preferably a hydrogen atom or a univalent organic group containing 1 to 50 carbon atoms, more preferably a hydrogen atom or a univalent organic group containing 1 to 20 carbon atoms, and still more preferably a univalent organic group containing 1 to 10 carbon atoms. Specifically, there may be mentioned a hydrocarbon group, an organic group having an epoxy structure, and the like.

The compound represented by the above general formula (III) is not particularly restricted, but for example, there may be mentioned the following compounds, and the like.

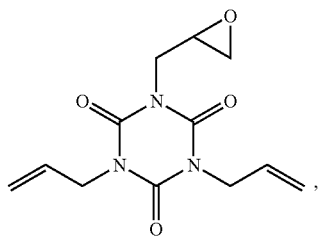

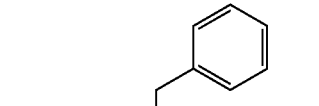

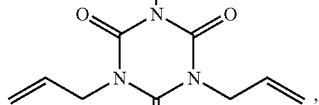

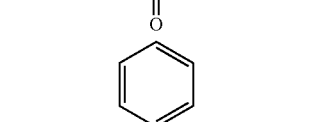

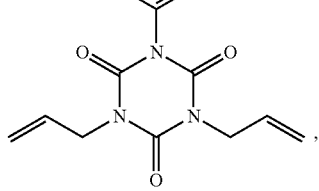

-continued
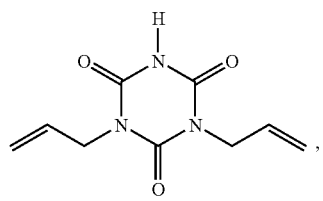
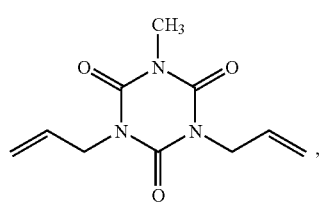
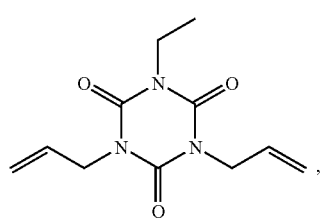
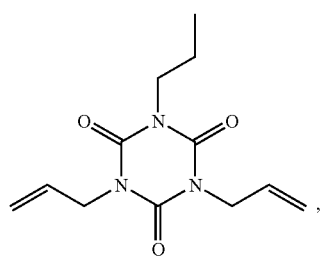
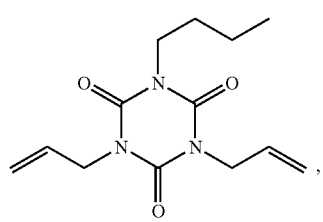
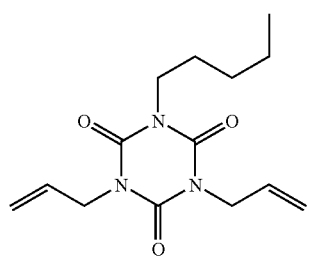
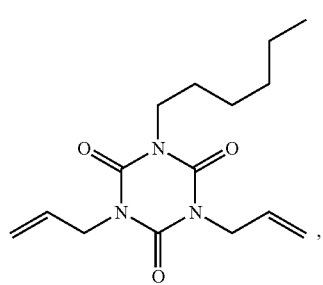
-continued
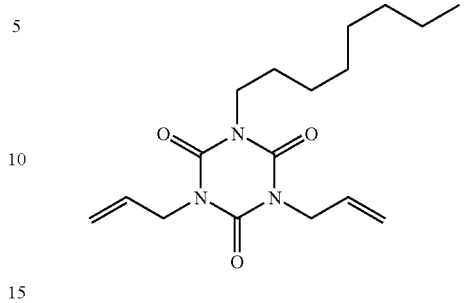
Among these, from the viewpoint that the mechanical and adhesive properties can be both obtained, monoallyl diglycidyl isocyanurate is particularly preferred.
The compound represented by the above general formula (IV) is not particularly restricted, but for example, there may be mentioned the following compounds, and the like.
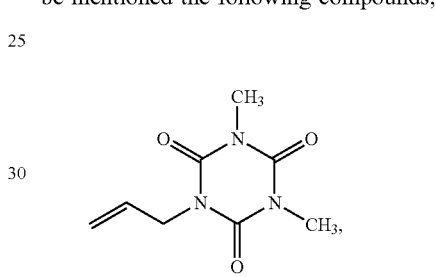
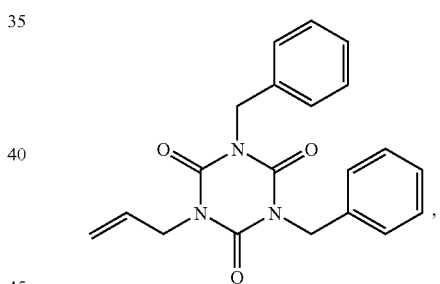
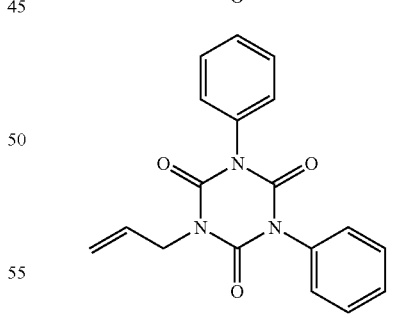
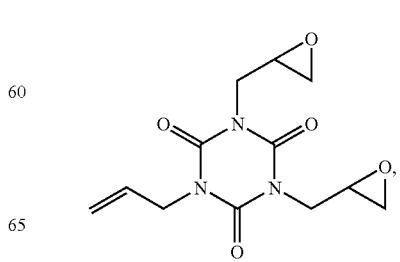

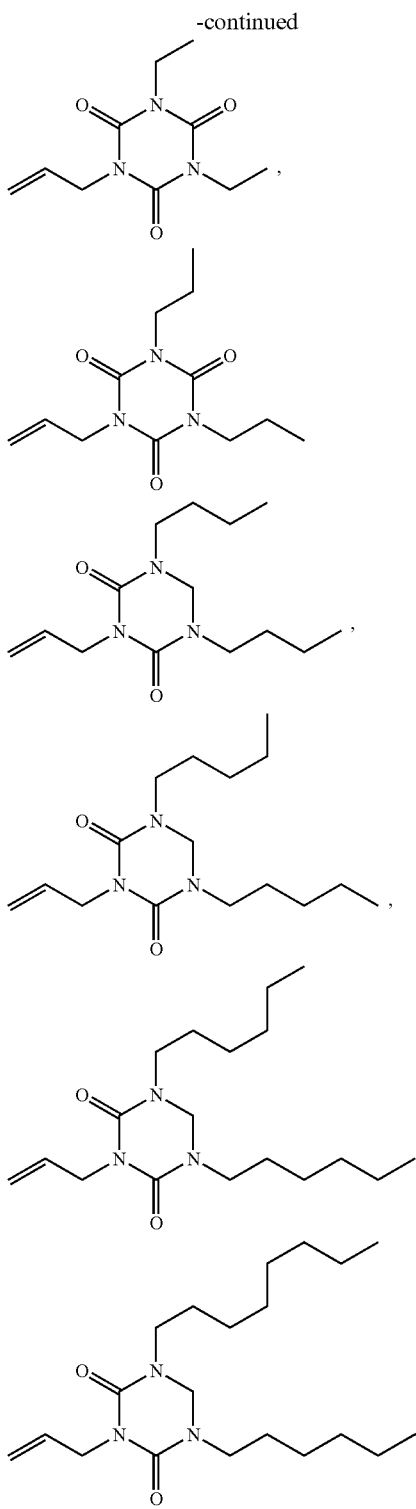

Among these, from the viewpoint that the mechanical and adhesive properties can be both obtained, diallyl monoglycidyl isocyanurate is particularly preferred.

As the compound having at least two SiH groups in each molecule for subjecting to hydrosilylation reaction with the compound represented by the above general formula (III), there may be mentioned those recited above.

As the compound having at least three SiH groups in each molecule for subjecting to hydrosilylation reaction with the compound represented by the above general formula (IV), preferably a linear and/or cyclic polyorganosiloxanes, and specifically there may be mentioned a compound having the following structure.

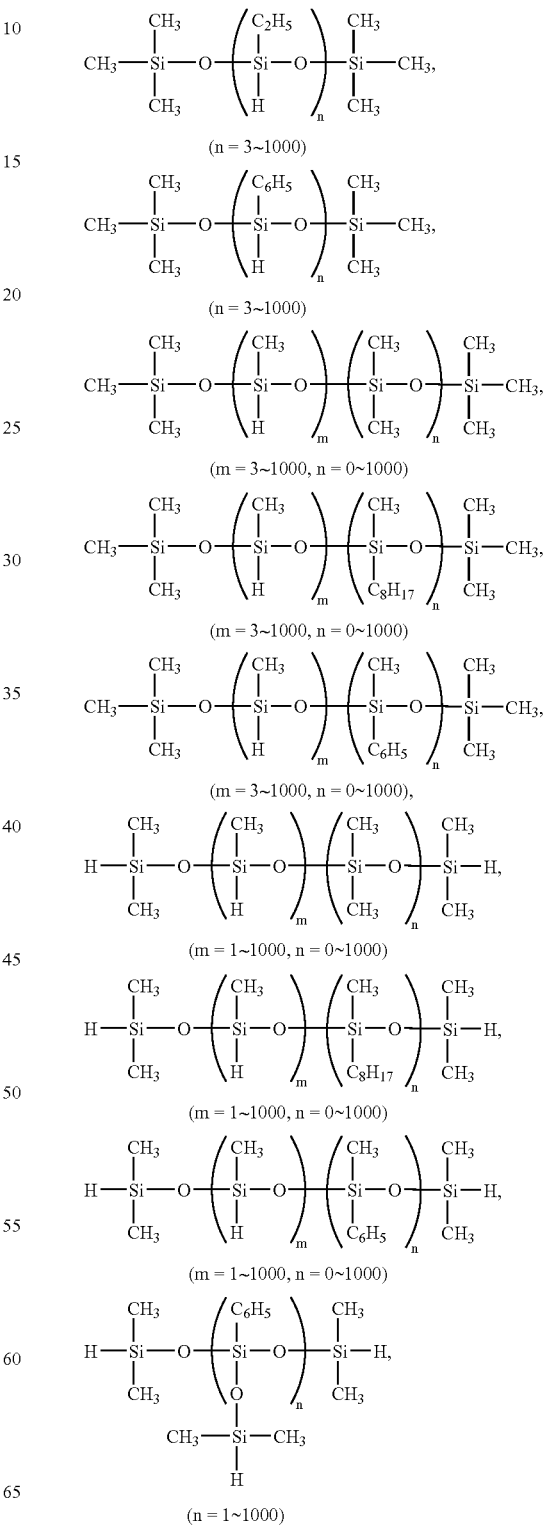

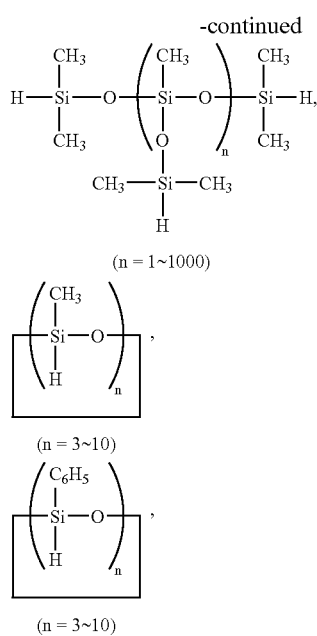

From the viewpoint of compatibility with the compound represented by the above general formula (IV), those cyclic polyorganosiloxanes having at least three SiH groups in each molecule which are represented by the above general formula (IX) is preferred.

As examples of the component (B), namely a reaction product from the components (α) and (β), there may be mentioned the bisphenol A diallyl ether-1,3,5,7-tetramethylcyclotetrasiloxane reaction product, vinylcyclohexene-1,3,5,7-tetramethylcyclotetrasiloxane reaction product, divinylbenzene-1,3,5,7-tetramethylcyclotetrasiloxane reaction product, dicyclopentadiene-1,3,5,7-tetramethylcyclotetrasiloxane reaction product, allyl glycidyl ether-1,3,5,7-tetramethylcyclotetrasiloxane reaction product, (α)-methylstyrene-1,3,5,7-tetramethylcyclotetrasiloxane reaction product, triallyl isocyanurate-1,3,5,7-tetramethylcyclotetrasiloxane reaction product, diallyl monoglycidyl isocyanurate-1,3,5,7-tetramethylcyclotetrasiloxane reaction product, diallyl monomethyl isocyanurate-1,3,5,7-tetramethylcyclotetrasiloxane reaction product, diallyl monoethyl isocyanurate-1,3,5,7-tetramethylcyclotetrasiloxane reaction product, diallyl monopropyl isocyanurate-1,3,5,7-tetramethylcyclotetrasiloxane reaction product, diallyl monophenyl isocyanurate-1,3,5,7-tetramethylcyclotetrasiloxane reaction product, diallyl monobenzyl isocyanurate-1,3,5,7-tetramethylcyclotetrasiloxane reaction product, monoallyl diglycidyl isocyanurate-1,3,5,7-tetramethylcyclotetrasiloxane reaction product, monoallyl dimethyl isocyanurate-1,3,5,7-tetramethylcyclotetrasiloxane reaction product, monoallyl diethyl isocyanurate-1,3,5,7-tetramethylcyclotetrasiloxane reaction product, monoallyl dipropyl isocyanurate-1,3,5,7-tetramethylcyclotetrasiloxane reaction product, monoallyl dibenzyl isocyanurate-1,3,5,7-tetramethylcyclotetrasiloxane reaction product, etc. From the viewpoint of the heat resistance and light resistance, the triallyl isocyanurate-1,3,5,7-tetramethylcyclotetrasiloxane reaction product is preferred. From the viewpoint of the high toughness and high transparency, the diallyl monoglycidyl isocyanurate-1,3,5,7-tetramethylcyclotetrasiloxane reaction product, and monoallyl diglycidyl isocyanurate-1,3,5,7-tetramethylcyclotetrasiloxane reaction product are preferred.

From the viewpoint of the high toughness and adhesive properties, diallyl monoglycidyl isocyanurate-1,3,5,7-tetramethylcyclotetrasiloxane reaction product, and monoallyl diglycidyl isocyanurate-1,3,5,7-tetramethylcyclotetrasiloxane reaction product are preferred.

(Reaction Between Component (α) and Component (β))

An explanation is now made of the hydrosilylation reaction between the component (α) and component (β), which is to be carried out in preparing a compound resulting from hydrosilylation reaction between the component (α) and component (β) for use as the component (B) of the invention.

The hydrosilylation reaction of the component (α) and component (β) may give a mixture of a plurality of compounds, including the component (B) of the invention in some instances. It is also possible to use the mixture as such in preparing the curable composition of the invention, without separating the component (B).

The mixing ratio between the component (α) and component (β) in carrying out the hydrosilylation reaction between the component (α) and component (β) is not particularly restricted but, when the strength of the curing product resulting from hydrosilylation of the component (A) with the component (B) obtained is taken into consideration, a higher SiH group content in the component (B) is preferred, so that the ratio of the total number (X) of carbon-carbon double bonds reactive with a SiH group as occurring in the component (α) to be admixed and the total number (Y) of SiH groups in the component (β) to be admixed is preferably such that it is not less than 2 (Y/X≧2), more preferably such that it is not less than 3 (Y/X≧3). From the viewpoint that the compatibility of the component (B) with the component (A) tends to become better, it is preferred that the ratio satisfied the relation 10≧Y/X, more preferably 5≧Y/X.

In subjecting the component (α) and component (β) to hydrosilylation reaction, an appropriate catalyst may be used. The catalyst is not particularly restricted but may be any one having catalytic activity in the hydrosilylation reaction. For example, there may be mentioned simple substance platinum, solid platinum supported on such a carrier as alumina, silica or carbon black, chloroplatinic acid, complexes of chloroplatinic acid with an alcohol, aldehyde, ketone, etc., platinum-olefin complexes (e.g. Pt(CH$_2$=CH$_2$)$_2$(PPh$_3$)$_2$, Pt(CH$_2$=CH$_2$)$_2$Cl$_2$), platinum-vinylsiloxane complexes (e.g. Pt(ViMe$_2$SiOSiMe$_2$Vi)$_n$, Pt[(MeViSiO)$_4$]$_m$), platinum-phosphine complexes (e.g. Pt(PPh$_3$)$_4$, Pt(PBu$_3$)$_4$), platinum-phosphite complexes (e.g. Pt[P(OPh)$_3$]$_4$, Pt[P(OBu)$_3$]$_4$) (in the formulas, Me represents a methyl group, Bu a butyl group, Vi a vinyl group and Ph a phenyl group, and n and m each represents an integer) dicarbonyldichloroplatinum, Karstedt catalyst, platinum-hydrocarbon complexes described in Ashby's U.S. Pat. Nos. 3,159,601 and 3,159,662, platinum-alcoholate catalysts described in Lamoreaux's U.S. Pat. No. 3,220,972, and so on. Furthermore, platinum chloride-olefin complexes described in Modic's U.S. Pat. No. 3,516,946 are also useful in the practice of the present invention.

As catalysts other than platinum compounds, there may be mentioned, for example, RhCl(PPh$_3$)$_3$, RhCl$_3$, RhAl$_2$O$_3$, RuCl$_3$, IrCl$_3$, FeCl$_3$, AlCl$_3$, PdCl$_2$.2H$_2$O, NiCl$_2$, TiCl$_4$, etc.

Among these, chloroplatinic acid, platinum-olefin complexes, platinum-vinylsiloxane complexes and the like are preferred from the catalytic activity viewpoint. These catalysts may be used singly or in combination of two or more.

The level of addition of the catalyst is not particularly restricted but, for attaining a sufficient level of curability and reducing the cost of the curable composition to a relatively low level, the lower limit to the addition level is preferably $10^{-8}$ mole, more preferably $10^{-6}$ mole, per mole of the SiH group in the component ($\beta$), and the upper limit to the addition level is preferably $10^{-1}$ mole, more preferably $10^{-2}$ mole, per mole of the SiH group in the component ($\beta$).

A promoter may be used in combination with the above catalyst. As the promoter, there maybe mentioned, for example, phosphorus compounds such as triphenylphosphine; 1,2-diester compounds such as dimethyl maleate; acetylene alcohol compounds such as 2-hydroxy-2-methyl-1-butyne; sulfur compounds inclusive of simple substance sulfur; amine compounds such as triethylamine; etc. The level of addition of the promoter is not particularly restricted but the lower limit to the addition level is preferably $10^{-2}$ mole, more preferably $10^{-1}$ mole, and the upper limit is $10^{2}$ mole, more preferably 10 moles, per mole of said catalyst.

As for the method of mixing up the component ($\alpha$), component ($\beta$) and catalyst in carrying out the reaction, various methods may be employed. Preferred is, however, the method comprising mixing the component ($\alpha$) with the catalyst and mixing the resulting mixture with the component ($\beta$). The method comprising mixing the catalyst with a mixture of the component ($\alpha$) and component ($\beta$) makes it difficult to control the reaction. When the method comprising mixing the component ($\alpha$) with a mixture of the component ($\beta$) and catalyst is employed, the component ($\beta$), which is reactive with moisture possibly contained therein in the presence of the catalyst, may cause denaturation in some instances.

The reaction temperature may be selected at various levels. In the instance case, the lower limit to the reaction temperature is preferably 30° C., more preferably 50° C., and the upper limit to the reaction temperature is preferably 200° C., more preferably 150° C. At lower reaction temperatures, the reaction time for the reaction to proceed to a satisfactory extent becomes long whereas higher reaction temperatures are not practical. The reaction may be carried out at a constant temperature, or the temperature may be varied stepwise or continuously according to need.

The reaction time and the pressure during reaction may also be selected at various levels according to need.

A solvent may be used in the hydrosilylation reaction. The solvent to be used is not particularly restricted but any of those which will not inhibit the hydrosilylation reaction. Specifically, hydrocarbon solvents such as benzene, toluene, hexane and heptane; ether solvents such as tetrahydrofuran, 1,4-dioxane, 1,3-dioxolane and diethyl ether; ketone solvents such as acetone and methyl ethyl ketone; and halogenated solvents such as chloroform, methylene chloride and 1,2-dichloroethane can be used satisfactorily. Such solvents can also be used in the form of a mixed solvent composed of two or more species. Preferred as the solvent are toluene, tetrahydrofuran, 1,3-dioxolane and chloroform. The amount of the solvent to be used can be adequately selected.

Further, various additives may be used for the purpose of controlling the reactivity, etc.

It is also possible, after reacting the component ($\alpha$) with the component ($\beta$), to remove the solvent, unreacted component ($\alpha$) and/or unreacted component ($\beta$). When these volatile components are removed, the component (B) obtained becomes free of such volatile components and, therefore, the problems of void formation and cracking due to volatile matter evaporation in the step of curing with the component (A) will hardly occur. The method of removal includes, for example, volatile matter removal under reduced pressure and, further, treatment with active carbon, aluminum silicate, silica gel or the like. In the case of volatile matter removal under reduced pressure, the treatment is preferably carried out at low temperatures. In this case, the upper limit to the temperature is preferably 100° C., more preferably 60° C. High temperature treatment tends to be accompanied by changes in properties, for example viscosity increase.

The mixing ratio between the component (A) and component (B) is not particularly restricted provided that the necessary strength is not lost. Preferably, the ratio of the number of SiH group (Y) in the component (B) relative to the number of carbon-carbon double bonds (X) in the component (A) is $3.0 \geq Y/X \geq 0.5$, more preferably $2.5 \geq Y/X \geq 0.7$, still more preferably $2.0 \geq Y/X \geq 0.8$, and particularly preferably $1.80 \geq Y/X \geq 0.9$. When the ratio is $3.0 < Y/X$, sufficient strength may not be obtained due to insufficient curability, and when the ratio is $Y/X < 0.7$, the number of carbon-carbon double bonds becomes in excess, and may possibly cause coloration.

The component (C) of the first aspect of the present invention is now explained.

The hydrosilylation catalyst, which is the component (C) is not particularly restricted but may be any one having catalytic activity in the hydrosilylation reaction. Thus, there may be mentioned, for example, simple substance platinum, solid platinum supported on such a carrier as alumina, silica or carbon black, chloroplatinic acid, complexes of chloroplatinic acid with an alcohol, aldehyde, ketone, etc., platinum-olefin complexes (e.g. $Pt(CH_2=CH_2)_2(PPh_3)_2$, $Pt(CH_2=CH_2)_2Cl_2$), platinum-vinylsiloxane complexes (e.g. $Pt(ViMe_2SiOSiMe_2Vi)_n$, $Pt[(MeViSiO)_4]_m$), platinum-phosphine complexes (e.g. $Pt(PPh_3)_4$, $Pt(PBu_3)_4$), platinum-phosphite complexes (e.g. $Pt[P(OPh)_3]_4$, $Pt[P(OBu)_3]_4$) (in the formulas, Me represents a methyl group, Bu a butyl group, Vi a vinyl group and Ph a phenyl group, and n and m each represents an integer), dicarbonyldichloroplatinum, Karstedt catalyst, platinum-hydrocarbon complexes described in Ashby's U.S. Pat. Nos. 3,159,601 and 3,159,662, platinum-alcoholate catalysts described in Lamoreaux's U.S. Pat. No. 3,220,972, and so on. Furthermore, platinum chloride-olefin complexes described in Modic's U.S. Pat. No. 3,516,946 are also useful in the practice of the present invention.

As hydrosilylation catalysts other than platinum compounds, there may be mentioned, for example, $RhCl(PPh)_3$, $RhCl_3$, $RhAl_2O_3$, $RuCl_3$, $IrCl_3$, $FeCl_3$, $AlCl_3$, $PdCl_2 \cdot 2H_2O$, $NiCl_2$, $TiCl_4$, etc.

Among these, chloroplatinic acid, platinum-olefin complexes, platinum-vinylsiloxane complexes and the like are preferred from the catalytic activity viewpoint. The above hydrosilylation catalysts may be used singly or in combination of two or more.

The level of addition of the hydrosilylation catalyst is not particularly restricted but, for attaining a sufficient level of curability and reducing the cost of the curable composition to a relatively low level, the lower limit to the addition level is preferably $10^{-8}$ mole, more preferably $10^{-6}$ mole, per mole of the SiH group in the component (B), and the upper limit to the addition level is preferably $10^{-1}$ mole, more preferably $10^{-2}$ mole, per mole of the SiH group in the component (B).

The component (D) of the first aspect of the present invention is now explained.

The component (D) is a silane coupling agent and/or an epoxy group-containing compound. The silane coupling agent is not particularly restricted but may be any of those compounds which have, within the molecule, at least one functional group reactive with an organic group and a hydrolyzable silyl group. The functional group reactive with an organic group is not particularly restricted but at least one functional group selected from among epoxy, methacryl, acryl, isocyanate, isocyanurate, vinyl and carbamate groups is preferred from the handleability viewpoint. From the viewpoint of curability and adhesive properties, epoxy, methacryl and acryl groups are more preferred. The hydrolyzable silyl group is not particularly restricted, but from the handleability viewpoint, preferred are alkoxysilyl groups and, from the reactivity viewpoint, methoxysilyl and ethoxysilyl groups are particularly preferred.

As preferred examples of the silane coupling agent, there may be mentioned epoxy group-containing alkoxysilanes such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and methacryl or acryl group-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

The level of addition of the silane coupling agent is not particularly restricted and can be selected at various levels. However, the lower limit to the addition level is preferably 0.1 part by weight, more preferably 0.5 part by weight, and the upper limit to the addition level is preferably 50 parts by weight, more preferably 25 parts by weight, per 100 parts by weight of [component (A)+component (B)]. At lower addition levels, the adhesive property-improving effect is hardly exerted and, at higher addition levels, the physical properties of the curing product may possibly be adversely affected.

The epoxy group-containing compound is not particularly restricted, and includes, for example, novolak phenol-based epoxy resins, biphenyl-based epoxy resins, dicyclopentadiene-based epoxy resins, bisphenol F diglycidyl ether, bisphenol A diglycidyl ether, 2,2'-bis(4-glycidyloxycyclohexyl)propane, 3,4-epoxycyclohexylmethyl-3,4-epoxycyclohexanecarboxylate, vinylcyclohexene dioxide, 2-(3,4-epoxycyclohexyl)-5,5-spiro(3,4-epoxycyclohexane)-1,3-dioxane, bis(3,4-epoxycyclohexyl)adipate, bisglycidyl 1,2-cyclopropanedicarboxylate, triglycidyl isocyanurate, monoallyl diglycidyl isocyanurate, diallyl monoglycidyl isocyanurate, and like epoxy resins as cured with an aliphatic acid anhydride such as hexahydrophthalic anhydride, methylhexahydrophthalic anhydride, trialkyltetrahydrophthalic anhydrides or hydrogenated methylnadic anhydride; bisphenol A-based epoxy resins; bisphenol F-based epoxy resins; brominated epoxy resins such as tetrabromo bisphenol A glycidyl ether; novolak-based epoxy resins; glycidyl ether-based epoxy resins such as bisphenol A propylene oxide adduct; glycidyl ester-based epoxy resins such as an aromatic carboxylic acid-epichlorohydrin reaction product and hydrogenated aromatic carboxylic acid-epichlorohydrin reaction product; glycidyl amine-based epoxy resins such as N,N-glycidyl aniline and N,N-diglycidyl-o-toluidine; urethan modified epoxy resins; hydrogenated bisphenol A-based epoxy resins, alicyclic epoxy resins such as

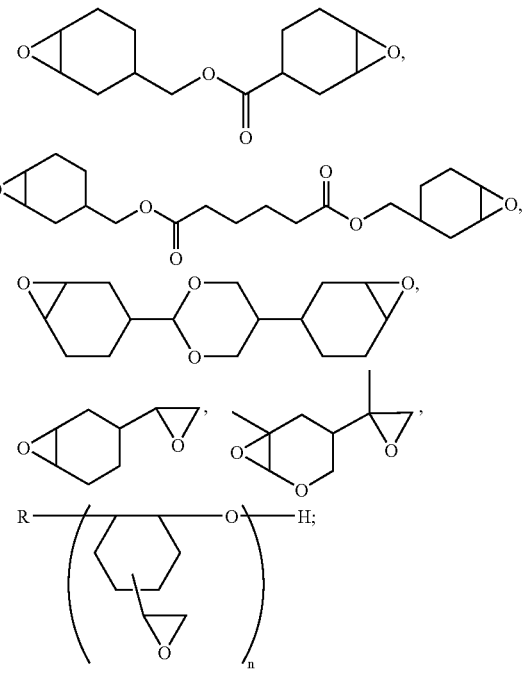

R represents an alkyl group or trimethylol propane residue
N represents an integer of 1 to 20 triglycidyl isocyanurate; polyhydric alcohol glycidyl ethers such as polyalkylene glycol diglycidyl ether and glycerine triglycidyl ether; hydantoin-based epoxy resins; unsaturated polymer epoxidized products such as petroleum resin, and the like. The epoxy compounds, if necessarily a curing agent, may respectively be used singly or in the form of a combination of a plurality of species.

The level of addition of the epoxy group-containing compound is not particularly restricted and can be selected at various levels. However, the lower limit to the addition level is preferably 0.1 part by weight, more preferably 0.5 part by weight, and the upper limit to the addition level is preferably 50 parts by weight, more preferably 25 parts by weight, per 100 parts by weight of [component (A)+component (B)]. At lower addition levels, the adhesive property-improving effect is hardly exerted and, at higher addition levels, the physical properties of the curing product may possibly be adversely affected.

The silane coupling agents may be used singly or two or more of them may be used in combination. The epoxy group-containing compounds may be used singly or two or more of them may be used in combination. Furthermore, the silane coupling agents and epoxy group-containing compounds may be combinedly used.

The component (E) of the first aspect. of the present invention is now explained.

The silanol condensation catalyst, which is the component (E), is not particularly restricted but may be any one having catalytic activity in the condensation reaction of hydrolysable silyl group. Among them, preferred are organoaluminum compounds, borate esters and titanium compounds from the viewpoint that improvement of the adhesive properties and/or stabilization are possible. More preferred are organoaluminum compounds and borate esters, and particularly preferred are borate esters from the viewpoint of low degrees of coloration in the step of curing and at high temperatures.

The level of addition of the silanol condensation catalyst is not particularly restricted, and can be selected at various levels. However, the lower limit to the addition level is preferably 0.1 part by weight, more preferably 1 part by weight, and the upper limit to the addition level is preferably 50 parts by weight, more preferably 30 parts by weight, per 100 parts by weight of the component (D). At lower addition levels, the adhesive property-improving effect is hardly exerted and, at higher addition levels, the physical properties of the curing product may possibly be adversely affected.

The above organoaluminum compound is not particularly restricted, but for example, there may be mentioned aluminum alcoholate compounds such as trimethoxyaluminum, triethoxyaluminum, triisopropoxyaluminum, trinormalpropoxyaluminum, sec-butoxy aluminum diisopropoxide, and aluminum tri-sec-butoxide; organic acid aluminum salts such as naphthenic acid, stearic acid, octylic acid and benzoic acid; and aluminum chelate compounds such as aluminum ethyl acetoacetate diisopropylate, aluminum ethyl acetoacetate diisobutylate, aluminum tris(ethyl acetoacetate), aluminum bis(ethyl acetoacetate)monoacetylacetonate, aluminum tris(acetylacetonate) and Alumi-chelate M (product of Kawaken Fine Chemicals Co., Ltd., alkyl acetoacetate aluminum diisopropoxide); etc. From the viewpoint of reactivity and/or sticking/adhesion to substrates, aluminum chelate compounds and aluminum alcoholate compounds are preferred, and aluminum tris(ethyl acetoacetate) is more preferred from the viewpoint of chemical compatibility with the hydrosilylation curing reaction.

The borate esters mentioned above is not particularly restricted, but preferably a compound represented by the following general formula (X) or (XI):

$$B(OR^{11})_3 \quad (X)$$

$$B(OCOR^{11})_3 \quad (XI)$$

in each formula, $R^{11}$ represents an organic group containing 1 to 48 carbon atoms (preferably a group comprising C, H and/or O as exclusive constituents, and more preferably a hydrocarbon group), and a plurality of $R^{11}$ may be the same or different.

As specific borate esters, there may be mentioned tri-2-ethylhexyl borate, trinormaloctadecyl borate, trinormaloctyl borate, triphenyl borate, trimethylene borate, tris(trimethylsilyl) borate, trinormalbutyl borate, tri-sec-butyl borate, tri-tert-butyl borate, triisopropyl borate, trinormalpropyl borate, triallyl borate, triethyl borate, trimethyl borate, boron methoxyethoxide and the like.

From the availability viewpoint, trimethyl borate, triethyl borate, and trinormalbutyl borate are more preferred, and trimethyl borate is still more preferred.

From the viewpoint of the possibility of volatility suppression in the step of curing, trinormaloctadecyl borate, trinormaloctyl borate, triphenyl borate, trimethylene borate, tris(trimethylsilyl) borate, trinormalbutyl borate, tri-sec-butyl borate, tri-tert-butyl borate, triisopropyl borate, trinormalpropyl borate, triallyl borate, and boron methoxyethoxide are preferred, and normaltrioctadecyl borate, tri-tert-butyl borate, triphenyl borate, and trinormalbutyl borate are still more preferred.

From the volatility suppression and/or workability viewpoint, trinormalbutyl borate, triisopropyl borate, and trinormalpropyl borate are more preferred, and trinormalbutyl borate is still more preferred.

From the viewpoint of low degrees of coloration at high temperatures, triethyl borate is more preferred, and trimethyl borate is still more preferred.

The titanium compounds mentioned above is not particularly restricted, but for example, there may be mentioned tetraalkoxytitaniums such as tetraisopropoxytitanium and tetrabutoxytitanium; titanium chelates such as titanium tetraacetylacetonate; common titanate coupling agents having such a residue as oxyacetic acid or ethylene glycol; etc.

The component (E) may be used singly or two or more of them may be used in combination.

The arbitrary component of the first aspect of the present invention is now explained.

The curable composition of the invention may contain a silanol source compound; carboxylic acids and/or acid anhydrides; curing retarder; thermosetting resin; thermoplastic resin; filler; antioxidant; radical inhibitor; ultraviolet absorber; adhesive property-improving agents, etc. according to need.

By adding a silanol source compound to the curable composition of the invention, adhesive-property improving effect can be more enhanced, whereby further improvement of the adhesive properties and/or stabilization can be achieved. The above silanol source compound is not particularly restricted, but there may be mentioned, for example, silanol compounds such as triphenyl silanol and diphenyldihydroxysilane, alkoxysilanes such as diphenyldimethoxysilane, tetramethoxysilane and methyltrimethoxysilane, etc.

When such a silanol source compound is used, the amount thereof to be used is not particularly restricted and can be selected at various levels. However, the lower limit to the addition level is preferably 0.1 part by weight, more preferably 1 part by weight, and the upper limit to the addition level is preferably 50 parts by weight, more preferably 30 parts by weight, per 100 parts by weight of the component (D). At lower addition levels, the adhesive property-improving effect is hardly exerted and, at higher addition levels, the physical properties of the curing product may possibly be adversely affected.

The above silanol source compounds may be used singly or two or more of them may be used in combination.

By incorporating carboxylic acids and/or acid anhydrides to the curable composition of the invention, effect obtained by the component (D) can be enhanced, whereby further improvement of the adhesive properties and/or stabilization can be achieved. The above carboxylic acid or acid anhydride is not particularly restricted, but for example, includes the following:

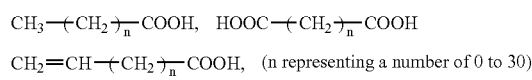
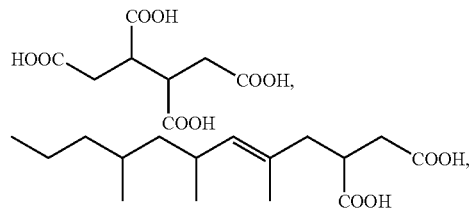

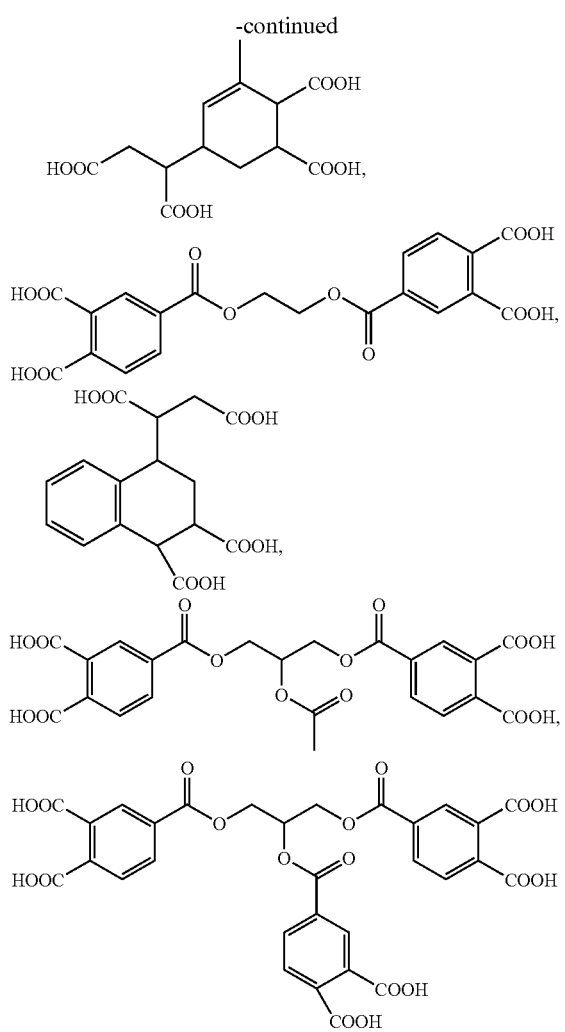

2-ethylhexanoic acid, cyclohexanecarboxylic acid, cyclohexanedicarboxylic acid, methylcyclohexanedicarboxylic acid, tetrahydrophthalic acid, methyltetrahydrophthalic acid, methylhimic acid, norbornenedicarboxylic acid, hydrogenated methylnadic acid, maleic acid, acetylenedicarboxylic acid, lactic acid, malic acid, citric acid, tartaric acid, benzoic acid, hydroxybenzoic acid, cinnamic acid, phthalic acid, trimellitic acid, pyromellitic acid, naphthalenecarboxylic acid, naphthalenedicarboxylic acid, and the like, as well as the acid anhydrides and mixed acid anhydrides thereof.

Among the above carboxylic acids and acid anhydrides, those having a carbon-carbon double bond reactive with a SiH group are preferred since they have hydrosilylation reactivity, are less capable of exuding from the curing product and hardly impair the physical properties of the resulting curing product. As preferred carboxylic acids and acid anhydrides, there may be mentioned, for example,

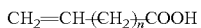

(n representing a number of 0 to 30), tetrahydrophthalic acid, methyltetrahydrophthalic acid, and anhydrides and mixed anhydrides thereof.

When such a carboxylic acid and/or acid anhydride is used, the level of addition thereof is not particularly restricted, and can be selected at various levels. However, the lower limit to the addition level is preferably 0.1 part by weight, more preferably 1 part by weight, and the upper limit to the addition level is preferably 50 parts by weight, more preferably 10 parts by weight, per 100 parts by weight of the component (D). At lower addition levels, the adhesive property-improving effect is hardly exerted and, at higher addition levels, the physical properties of the curing product may possibly be adversely affected.

The above carboxylic acids and/or acid anhydrides may be used singly or two or more of them may be used in combination.

A curing retarder may be incorporated for improving the storage stability of the curable composition of the invention or for adjusting the reactivity in the hydrosilylation reaction in the course of production. The curing retarder is not particularly restricted, but there may be mentioned aliphatic unsaturated bond-containing compounds, organophosphorus compounds, sulfur-containing compounds, nitrogen-containing compounds, tin compounds, organic peroxides, etc.

The aliphatic unsaturated bond-containing compounds include, for example, propargyl alcohols such as 2-hydroxy-2-methyl-3-butyne, 2-hydroxy-2-phenyl-3-butyne, 1-ethynyl-1-cyclohexanol, en-yne compounds, maleic acid esters such as dimethyl maleate, etc. The organophosphorus compounds include, for example, triorganophosphines such as triphenyl phosphine, diorganophosphines, organophosphones, triorganophosphites, etc. The sulfur-containing compounds include simple substance sulfur, organomercaptans, diorganosulfides, hydrogen sulfide, benzothiazole, benzothiazole disulfide, etc. The nitrogen-containing compounds include ammonia, primary to tertiary alkylamines, arylamines, urea, hydrazine, etc. The tin compounds include stannous halide dehydrates, stannous carboxylates, etc. The organic peroxides include di-tert-butyl peroxide, dicumyl peroxide, benzoyl peroxide, tert-butyl perbenzoate, etc.

From the good retarder activity and availability viewpoint, benzothiazole, thiazole, dimethyl maleate, 2-hydroxy-2-methyl-3-butyne, and 1-ethynyl-1-cyclohexanol are preferred among the above curing retarders.

The level of addition of the above curing retarder is not particularly restricted, and can be selected at various levels but the lower limit to the addition level is preferably $10^{-1}$ mole, more preferably 1 mole, and the upper limit to the addition level is preferably $10^3$ moles, more preferably 50 moles, per mole of the hydrosilylation catalyst.

These curing retarders may be used singly or two or more of them may be used in combination.

For modifying the characteristics of the curable composition of the invention, it is also possible to add thermosetting resins thereto. The above thermosetting resin is not particularly restricted, but there may be mentioned, for example, cyanate ester resins, phenol resins, polyimide resins, urethane resins, bismaleimide resins, etc.

The level of addition of the above thermosetting resin is not particularly restricted. However, the lower limit to the amount to be used is preferably 5% by weight, more preferably 10% by weight, and the upper limit to the amount to be used is preferably 50% by weight, more preferably 30% by weight, of the total weight of the curable composition. At lower addition levels, the desired effects, such as adhesive properties, can hardly be obtained and, at higher levels, the curing product tends to become brittle.

The thermosetting resin may comprise one single species or a combination of a plurality of species.

When the above thermosetting resin is incorporated into the curable composition of the invention, a raw resin and/or a cured resin of the thermosetting resin may be mixed with the component (A) and/or (B) by homogeneously dissolving therein, dispersing therein in the form of ground particles, dispersing therein in the form of a solution in a solvent, or the like. From the viewpoint that the resulting curing product readily becomes more transparent, the resin is preferably mixed with the component (A) and/or (B) by homogeneously dissolving therein. In this case, too, the thermosetting resin may be directly dissolved in the component (A) and/or (B) or homogeneously mixed therewith using a solvent or the like, or the solvent may be removed thereafter to attain a homogeneous dispersion state and/or mixture state.

When the thermosetting resin is dispersed, the average particle diameter can be selected at various levels. Preferably, however, the lower limit to the average particle diameter is 10 nm, and the upper limit to the average particle diameter is preferably 10 µm. The particle system may have a distribution and may be monodisperse or show a plurality of peak particle diameters. From the viewpoint that the curable composition tend to be low in viscosity and show better moldability, the coefficient of variation in particle diameter is preferably not more than 10%.

For modifying the characteristics of the curable composition of the invention, it is also possible to incorporate thermoplastic resins thereto. The above thermoplastic resin is not particularly restricted, but for example, there may be mentioned acrylic resins, typically poly(methyl methacrylate)-based resins such as methyl methacrylate homopolymers, or random, block or graft copolymers of methyl methacrylate and another monomer, or other polymers (e.g. Optorez, product of Hitachi Chemical, etc.), and poly(butyl acrylate)-based resins such as butyl acrylate homopolymers, or random, block or graft polymers of butyl acrylate and another monomer, or other polymers; polycarbonate-type resins such as polycarbonate resins containing bisphenol A, 3,3,5-trimethylcyclohexylidenebisphenol or the like as a monomer structure (e.g. APEC, product of Teijin, etc.); cycloolefin resins such as resins resulting from homopolymerization or copolymerization of norbornene derivatives, vinyl monomers and so forth, resins resulting from ring-opening metathetic polymerization of norbornene derivatives, or hydrogenation products derived therefrom (e.g. APEL, product of Mitsui Chemical; ZEONOR and ZEONEX, products of Zeon Corporation; ARTON, product of JSR; etc.); olefin-maleimide-based resins such as ethylene-maleimide copolymers (e.g. TI-PAS, product of Tosoh, etc.); polyester resins such as polyesters resulting from polycondensation of a bisphenol such as bisphenol A or bis(4-(2-hydroxyethoxy)phenyl)fluorine and/or a diol such as diethylene glycol and a phthalic acid such as terephthalic acid or isophthalic acid and/or an aliphatic dicarboxylic acid (e.g. O-PET, product of Kanebo, etc.); polyethersulfone resins; polyarylate resins; poly(vinyl acetal) resins; polyethylene resins; polypropylene resins; polystyrene resins: polyamide resins; silicone resins, fluororesins; rubber-like resins such as natural rubbers and EPDM; etc.

The above thermoplastic resin may have a carbon-carbon double bond(s) reactive with a SiH group and/or a SiH group(s) within the molecule. In view of the tendency for the resulting curing product to have an increased level of toughness, it is preferred that it has at least one carbon-carbon double bond reactive with a SiH group and/or at least one SiH group per molecule on average.

The above thermoplastic resin may have another or other crosslinking group or groups. As the above crosslinking groups, there may be mentioned epoxy, amino, radical-polymerizable unsaturated groups, carboxyl, isocyanate, hydroxyl, alkoxysilyl groups, etc. In view of the tendency for the resulting curing product to have an increased level of heat resistance, the occurrence of at least one crosslinking group per molecule on average is preferred.

The molecular weight of the above thermoplastic resin is not particularly restricted but, from the viewpoint of better compatibility with the component (A) and/or (B), the number average molecular weight is preferably not more than 10,000, more preferably not more than 5,000. Conversely, from the viewpoint of the tendency for the resulting curing product to readily become tougher, the number average molecular weight is preferably not less than 10,000, more preferably not less than 100,000. The molecular weight distribution is not particularly restricted, either. In view of the tendency for the mixture to have a lower viscosity and better moldability, however, the molecular weight distribution is preferably not more than 3, more preferably not more than 2, still more preferably not more than 1.5.

The level of incorporation of the thermoplastic resin is not particularly restricted but the lower limit to the amount to be used is preferably 5% by weight, more preferably 10% by weight, of the whole amount of the curable composition, and the upper limit to the amount to be used is preferably 50% by weight, more preferably 30% by weight, in the curable composition. When the addition level is lower, the curing product obtained tends to be brittle while higher addition levels tends to result in decreased heat resistance (elasticity at elevated temperatures).

The thermoplastic resin can be used singly or in a combination of a plurality of species.

When the above thermoplastic resin is incorporated into the curable composition of the invention, it may be mixed with the component (A) and/or (B) by homogeneously dissolving therein, dispersing therein in the form of ground particles, dispersing therein in the form of a solution in a solvent, or the like. From the viewpoint that the resulting curing product readily becomes more transparent, the resin is preferably mixed with the component (A) and/or (B) by homogeneously dissolving therein. In this case, too, the thermoplastic resin may be directly dissolved in the component (A) and/or (B) or homogeneously mixed therewith using a solvent or the like, or the solvent may be removed thereafter to attain a homogeneous dispersion state and/or mixture state.

When the thermoplastic resin is dispersed, the average particle diameter can be selected at various levels. Preferably, however, the lower limit to the average particle diameter is 10 nm, and the upper limit to the average particle diameter is preferably 10 µm. The particle system may have a distribution and may be monodisperse or show a plurality of peak particle diameters. In view of the tendency for the curable composition to readily become low in viscosity and show better moldability, the coefficient of variation in particle diameter is preferably not more than 10%.

A filler may be added to the curable composition of the invention.

The above filler is not particularly restricted, but there may be mentioned, for example, silica type filler such as quartz, fumed silica, precipitated silica, silicic anhydride, fused silica, crystalline silica and ultrafine amorphous silica; inorganic fillers such as silicon nitride, silver powders, alumina, aluminum hydroxide, titanium oxide, glass fibers, carbon fibers, mica, carbon black, graphite, diatomaceous earth, terra alba, clay, talc, calcium carbonate, magnesium carbonate, barium sulfate and inorganic ballon; those fillers in common use in and/or proposed as fillers for the conventional sealing member, such as an epoxy type filler; and the like.

As the filler, those low in radioactivity are preferred from the viewpoint that semiconductors or electric materials to be sealed are hardly damaged.

The filler may be surface-treated where appropriate. The surface treatment is not particularly restricted, but includes alkylation treatment, trimethylsilylation treatment, silicone treatment, treatment with a coupling agent, etc.

As examples of the above coupling agent, there may be mentioned a silane coupling agent. The silane coupling agent is not particularly restricted but maybe any of those compounds which have, within the molecule, at least one functional group reactive with an organic group and at least one hydrolyzable silyl group. The functional group reactive with an organic group is not particularly restricted, and is preferably at least one functional group selected from among epoxy, methacryl, acryl, isocyanate, isocyanurate, vinyl and carbamate groups from the handleability viewpoint. From the viewpoint of curability and adhesive properties, epoxy, methacryl and acryl groups are particularly preferred. The hydrolyzable silyl group is not particularly restricted, and is preferably an alkoxysilyl group and, from the reactivity viewpoint, a methoxysilyl and an ethoxysilyl groups are particularly preferred.

As preferred examples of the silane coupling agent, there may be mentioned epoxy group-containing alkoxysilanes such as 3-glycidoxypropyltrimethoxysilane, 3-glycidoxypropyltriethoxysilane, 2-(3,4-epoxycyclohexyl)ethyltrimethoxysilane and 2-(3,4-epoxycyclohexyl)ethyltriethoxysilane; and methacryl or acryl group-containing alkoxysilanes such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane and acryloxymethyltriethoxysilane.

As a process for incorporating the filler to the curable composition of the invention, other than the method of mixing the filler with the composition of the invention, there may also be mentioned, for example, a method of forming a filler in the curable composition which comprises adding a hydrolyzable silane monomer or oligomer, such as an alkoxysilane, acyloxysilane or halogenated silane, or an alkoxide, acyloxide or halide of a metal, such as titanium or aluminum, to the composition of the invention and allowing the filler formation reaction to proceed in the composition or the partial reaction product derived from the composition.

Among the above fillers, a silica type filler is preferred from the viewpoint that it makes it difficult for the curing reaction to be inhibited and is highly effective in reducing the coefficient of linear expansion.

The above filler preferably has an average particle diameter of not more than 10 μm, more preferably not more than 5 μm, since good permeability to narrow gaps of a sealing member can be easily obtained then. From the better permeability to narrow gaps of a sealing member viewpoint, the proportion of particles having a diameter of 50 μm or larger in the filler is preferably not more than 1% by weight, more preferably not more than 0.1% by weight. The average particle diameter of the filler and the proportion of particles not smaller than 50 μm in the filler can be determined using a laser microtrack particle size analyzer.

The particle diameter distribution of the above filler can be selected in various ways, typically in those ways employed in and/or proposed for the fillers in the conventional sealing members such as the epoxy type ones. For example, particles larger than 24 μm may amount to not less than 15% by weight while particles not larger than 1 μm may amount to not less than 3% by weight.

The specific surface area of the above filler can be selected at various levels, typically at the levels employed and/or proposed for the fillers in the conventional sealants, such as the epoxy-based ones. For example, levels of not less than 4 $m^2/g$, not more than 4 $m^2/g$, not more than 10 $m^2/g$ and so forth may be optionally employed. The specific surface area can be measured using a BET method-based monosorb specific surface area measuring apparatus.

The vitrification percentage of the above filler can be selected at various levels, typically at the levels employed and/or proposed for the fillers in the conventional sealing members, such as the epoxy-based ones. For example, levels of not less than 97%, and the like can be optionally employed.

The above filler preferably has a spherical shape from the viewpoint that the sealing member viscosity tends to become low.

The filler may comprise one single species or a combination of two or more species.

The level of addition of the above filler is not particularly restricted but, from the viewpoint that the linear expansion coefficient reducing effect is high and the composition has good fluidity, the lower limit to the addition level is preferably 30% by weight, more preferably 50% by weight, of the whole composition, and the upper limit to the addition level is preferably 80% by weight, more preferably 70% by weight, of the whole composition.

Various methods can be employed for filler incorporation. For better storage stability of the intermediate material of the composition, the method comprising mixing the component (B) with a mixture prepared by mixing the component (A) with the component (C) and the filler is preferred. When the component (A) is mixed with a mixture prepared by mixing the component (B) with the component (C) and/or the filler, the composition may undergo denaturation during storage, etc. since the component (B) has reactivity with the moisture in the environment and/or with the filler in the presence and/or absence of the component (C).

An antioxidant may be added to the curable composition of the invention. The antioxidant is not particularly restricted, and includes those in conventional use, for example citric acid, phosphoric acid, sulfur-containing antioxidants, etc. The sulfur-containing antioxidants are not particularly restricted, and there may be mentioned mercaptans, mercaptan salts, sulfide carboxylic acid esters, hindered phenol type sulfides and other sulfides, polysulfides, dithiocarboxylic acid salts, thioureas, thiophosphates, sulfonium compounds, thioaldehydes, thioketones, mercaptals, mercaptols, monothio acids, polythio acids, thioamides, sulfoxides, etc. The above antioxidants may be used singly or two or more of them may be used in combination.

A radical inhibitor may be added to the curable composition of the invention. The radical inhibitor is not particularly restricted, and includes, for example, phenolic radical inhibitors such as 2,6-di-tert-butyl-3-methylphenol (BHT), 2,2'-methylenebis(4-methyl-6-tert-butylphenol) and tetrakis (methylene-3-(3,5-di-tert-butyl-4-hydroxyphenyl)propionate)methane, amine type radical inhibitors such as phenyl-β-naphthylamine, α-naphthylamine, N,N'-sec-butyl-p-phenylenediamine, phenothiazine and N,N'-diphenyl-p-phenylenediamine, etc. The above radical inhibitors may be used singly or two or more of them may be used in combination.

An ultraviolet absorber may be added to the curable composition of the invention. The ultraviolet absorber is not particularly restricted, and includes, for example, 2-(2'-hydroxy-3',5'-di-tert-butylphenyl)benzotriazole, bis(2,2,6,6-tetramethyl-4-piperidine) sebacate, and so on. The above ultraviolet absorbers may be used singly or two or more of them may be used in combination.

To the curable composition of the invention, an adhesion property-improving agent may be incorporated. The adhesion property-improving agent is not particularly restricted, and includes, for example, adhesives in general use, a coupling agent, phenol resin, coumarone-indene resin, rosin ester resin, terpene-phenol resin, α-methylstyrene-vinyl toluene copolymer, polyethyl methylstyrene, aromatic polyisocyanate, and the like.

(Fluorescent Substance)

To the curable composition of the invention, fluorescent substances may be incorporated. Thereby, it becomes possible to provide a light-emitting diode which can absorb the light emitting from a light emitting element, carry out wavelength conversion, and has a different color tone from that of the light emitting element.

Usable as the fluorescent substance in the light-emitting diode is, mainly, at least one fluorescent substance selected from among those emitting blue light, those emitting green light, those emitting yellow light, and those emitting red light. These fluorescent substances are added to the curable composition of the invention, and mixed until the mixture become approximately uniform. This mixture is disposed on peripheral part of the light emitting element. This fluorescent substance absorbs the light emitted from the light emitting element, carries out wavelength conversion, and emits the light having a different wavelength from that of the light emitting element. Thereby, a part of the light emitted from the light emitting element, and a part of the light emitted from the fluorescent substance are mixed, thus it becomes possible to prepare a light-emitting diode of multicolor system including white color.

There are various fluorescent substances for those emitting blue light, those emitting green light, those emitting yellow light, and those emitting red light as mentioned above.

The fluorescent substances emitting green light include, for example, $SrAl_2O_4$:Eu, $Y_2SiO_5$:Ce, Tb, $MgAl_{11}O_{19}$:Ce, Tb, $Sr_7Al_{12}O_{25}$:Eu, (at least one of Mg, Ca, Sr, Ba)$Ga_2S_4$:Eu, and the like.

The fluorescent substances emitting blue light include, for example, $Sr_5(PO_4)_3Cl$:Eu, $(SrCaBa)_5(PO_4)_3Cl$:Eu, $(BaCa)_5(PO_4)_3Cl$:Eu, (at least one of Mg, Ca, Sr, Ba)$_2B_5O_9Cl$:Eu, Mn (at least one of Mg, Ca, Sr, Ba) $(PO_4)_6Cl_2$:Eu, Mn, and the like.

The fluorescent substances emitting green to yellow light include an yttrium aluminum oxide fluorescent substance activated with at least cerium, an yttrium gadolinium aluminum oxide fluorescent substance activated with at least cerium, an yttrium aluminum garnet oxide fluorescent substance activated with at least cerium, an yttrium gallium aluminum oxide fluorescent substance activated with at least cerium (so-called YAG fluorescent substance). Specifically, it is possible to use $Ln_3M_5O_{12}$:R (Ln is at least one selected from among Y, Gd, and La; M includes at least either Al and Ca; R is lanthanoid), $Y_{1-x}Ga_x)_3(Al_{1-y}Ga_y)_5O_{12}$:R (R is at least one selected from among Ce, Tb, Pr, Sm, Eu, Dy, and Ho; 0<R<0.5).

The fluorescent substances emitting red light include, for example, $Y_2O_2S$:Eu, $La_2O_2S$:Eu, $Y_2O_3$:Eu, $Gd_2O_2S$:Eu, and the like.

However, the fluorescent substances emitting green, blue, yellow, red, etc. lights are not limited to the above fluorescent substances, and various ones can be used.

To the composition of the invention, other than the above components, there may further be added colorants, mold release agents, flame retardants, flame retardant auxiliaries, surfactants, antifoaming agents, emulsifiers, leveling agents, cissing preventing agents, ion trapping agents, thixotropic agents, tackifiers, storage stability improving agents, antiozonants, light stabilizers, thickening agents, plasticizers, reactive diluents, antioxidants, heat stabilizers, electric conductivity providing agents, antistatic agents, antiradiation agents, nucleating agents, phosphorus-containing peroxide decomposers, lubricants, pigments, metal inactivators, thermal conductivity providing agents, physical property modifiers and so forth, each within the range within which the object and effect of the invention will not be defeated or weakened.

The curable composition of the invention can also be used in the form of a solution in a solvent. The solvent that can be used is not particularly restricted but, for example, there may be mentioned hydrocarbon solvents such as benzene, toluene, hexane and heptane; ether solvents such as tetrahydrofuran, 1,4-dioxane, 1,3-dioxolane and diethyl ether; ketone solvents such as acetone, methyl ethyl ketone and methyl isobutyl ketone; and halogenated solvents such as chloroform, methylene chloride and 1,2-dichloroethane. Among these, preferred are toluene, tetrahydrofuran, 1,3-dioxolane, and chloroform.

The amount of the solvent to be used is not particularly restricted, and can be selected optionally. However, the lower limit to the amount to be used is preferably 0.1 mL, and the upper limit thereto is preferably 10 mL, per gram of the curable composition. When the solvent amount used is small, the effects of the use of a solvent, for example the viscosity reducing effect and the like effect, tends to become difficult to obtain and, when it is large, the solvent tends to remain in the material, readily causing heat crack and other problems, and tends to become disadvantageous from the cost viewpoint, thus the industrial utility value becomes decrease.

The above solvents may be used singly or in the form of a mixed solvent composed of two or more species.

The curable composition of the invention may be incorporated with an additive for improving various properties of the light-emitting diode. The above additive is not particularly restricted, but for example, there may be mentioned cerium-activated yttrium aluminum garnet type fluorescent substances which absorb the light from the light emitting element and emit a longer wavelength fluorescent light, and the like fluorescent substances; colorants such as a bluing agent which absorb a specific wavelength; inorganic or organic diffusing agents for diffusing the light such as titanium oxide, aluminum oxide, silica, silicon oxide e.g. silica glass, talc, carcium carbonate, melamine resins, CTU guanamine resins and benzoguanamine resins; thermally conductive fillers such as glass, metal oxide e.g. aluminosilicate, etc. and metal nitrides i.e. aluminum nitride, boron nitride, etc.; etc.

The additive for improving the light-emitting diode properties may be uniformly contained or may be contained in a gradient manner in the composition. The above additive-containing resin part can be formed as a sealing member of the back side of the light emitting surface by pouring a resin for a sealing member of the front side of the light emitting surface into a mold, and successively pouring a resin containing the above additive. Moreover, the above additive-containing resin part can also be formed by covering a lead terminal by taping both sides after forming a sealing member, and in this condition, immersing the whole lead frame in a tank filled with the above additive-containing resin in such manner that the lower half of the sealing member of the light-emitting diode being immersed, withdrawing thereof, and drying.

The curable composition of the first aspect of the present invention can be cured by preliminary mixing the respective components, followed by allowing part or the whole of the carbon-carbon double bond reactive with a SiH group and the SiH groups in the composition to react with each other to give a curing product.

While various methods can be employed for the mixing, it is preferred that a mixture of the components (A), (C) and (E) be mixed with a mixture of the components (B) and (D). When a mixture of the components (A) and (B) is mixed with the component (C), the control of the reaction is difficult. In the case of a mixture of the components (B) and (C) and/or (E), the reaction of the component (B) with water is promoted in the presence of the components (C) and/or (E), hence deterioration may occur during storage, etc., thus it is not preferable.

On the occasion of curing of the composition by allowing the reaction to proceed, the respective necessary amounts of the components (A), (B), (C), (D) and (E) may be mixed up all at once, or the method comprising mixing up part of them, then allowing the reaction to proceed, thereafter adding the residual component and, after mixing up with the remaining portions, further allowing the reaction to proceed, or the method comprising allowing, after mixing up, only part of the functional groups in the composition to react (converting to a B stage) by controlling the reaction conditions and/or utilizing the differences in reactivity among the substituents, then carrying out such a treatment as molding, and allowing curing to further proceed may also be employed. These methods make it easy to control the viscosity in the step of molding.

As a process for curing, the reaction may be allowed to proceed by mere mixing or by heating. From the viewpoint that the reaction rate is rapid and materials generally high in heat resistance are readily obtainable, the method comprising heating to allow the reaction to proceed is preferred.

The reaction temperature is not particularly restricted and may be selected at various levels. However, the lower limit to the temperature is preferably 30° C., more preferably 100° C., still more preferably 150° C., and the upper limit to the temperature is preferably 300° C., more preferably 250° C., still more preferably 200° C. At lower reaction temperatures, the reaction time for the reaction to proceed to a satisfactory extent becomes long, whereas at higher temperatures, molding process tends to be difficult. The reaction may be carried out at a constant temperature, or the temperature may be varied stepwise or continuously according to need.

The reaction time can also be selected at various levels.

The pressure during reaction also can be selected at various levels according to need. Thus, the reaction can be carried out at ordinary pressure, at an elevated pressure or under reduced pressure.

The shapes of the optical material obtained by curing is not particularly restricted since various shapes are applicable according to its application, and include, for example, film, sheet, tube, rod, coat film, and bulk shapes.

Molding methods also include various methods including conventional methods for molding thermoplastic resins. For example, molding methods such as casting method, press method, cast molding method, transfer molding method, coating method, and RIM method can be applied. As molding tools, polished glass, hard stainless polished board, polycarbonate board, polyethylene terephthalate board, polymethyl methacrylate board, etc. can be applied. Moreover, for improving mold-releasing ability with the molding tool, it is possible to use a polyethylene terephthalate film, polycarbonate film, polyvinyl chloride film, polyethylene film, polytetrafluoroethylene film, polypropylene film, polyimide film, etc.

In the molding, various treatments may be applied according to need. For example, such treatments can also be applied as one comprising defoaming the composition or partly-reacted composition by centrifugation, reduced pressure, etc. for inhibiting generation of a void in the step of the molding, or one comprising releasing pressure once in the step of pressing.

The curable composition of the invention is applicable to various optical materials. The optical materials in the invention refer to materials in general used for transmitting light therein such as visible light, infrared rays, ultraviolet rays, X-rays, and laser. Although there is no particularly restriction, there may be mentioned, for example, materials used for liquid crystal display devices such as a color filter overcoat, TFT flattening film, and substrate material; and materials used for light-emitting diodes (LED) such as a sealing member and die-bonding agent. In addition, the sealing member in this specification is a concept including a molding agent or a sealant.

There may also be mentioned a substrate material, optical waveguide, prism sheet, deflection plate, wave plate, viewing angle correction film, polarizer protection film, a color filter, etc. used in liquid crystal display fields; and various coating agents, protection films, sealing members, adhesives, etc. used for them.

There may also be mentioned a sealing member of LED elements, sealing member of LED, protection film of front face glass, and alternate material for front face glass used in LED display devices; and various coating agents, protection films, sealing members, adhesives, etc. used for them.

There may also be mentioned an antireflective film, optical correction film, housing material, protection film of front face glass, and alternate material for front face glass used in color PDPs (plasma display); and various coating agents, protection films, sealing members, adhesives, etc. used for them. There may also be mentioned a substrate material, optical waveguide, prism sheet, deflection plate, wave plate, viewing angle correction film, and polarlizer protection film in plasma address liquid crystal (PALC) displays; and various coating agents, protection films, sealing members, adhesives, etc. used for them. There may also be mentioned a protection film of front face glass, and alternate material for front face glass in organic electro luminescence displays; and various coating agents, protection films, sealing members, adhesives, etc. used for them. There may also be mentioned various film substrates, a protection film of front face glass, and alternate material for front face glass in field emission displays (FED); and various coating agents, protection films, sealing members, adhesives, etc. used for them.

In the optical record fields, there may be mentioned VD (video disk), CD/CD-ROM, CD-R/RW, DVD-R/DVD-RAM, MO/MD, PD (phase change disk), disk substrate material for optical cards, pickup lens, and protection film;

and various coating agents, protection films, sealing members, adhesives, etc. used for them.

In the optical apparatus fields, there may be mentioned a lens material for steel cameras, finder prism, target prism, finder cover, and light-sensitive sensor part; and various coating agents, protection films, sealing members, adhesives, etc. used for them. There may also be mentioned a photographing lens for video cameras, and finder; and various coating agents, protection films, sealing members, adhesives, etc. used for them. There may also be mentioned a projection lens and protection film for projection TVs; and various coating agents, protection films, sealing members, adhesives, etc. used for them. There may also be mentioned a lens material and various films for optical sensing apparatus; and various coating agents, protection films, sealing members, adhesives, etc. used for them.

In the optical part fields, there may be mentioned a fiber material for the peripheral of optical switch, lens, waveguide, element in optical communication systems; and various coating agents, protection films, sealing members, adhesives, etc. used for them. There may also be mentioned an optical fiber material and ferrule for the peripheral of optical connectors; and various coating agents, protection films, sealing members, adhesives, etc. used for them. As optical passive parts and optical circuit parts, there may be mentioned a lens and waveguide; and various coating agents, protection films, sealing members, adhesives, etc. used for them. There may also be mentioned a substrate material and fiber material for the periphery of opto-electronic integrated circuit (OEIC); and various coating agents, protection films, sealing members, adhesives, etc. used for them.

In the optical fiber fields, there may be mentioned sensors for industrial application such as lightning for ornament displays and light guide, optical fibers for connecting communication infrastructure and domestic digital equipment such as a display and indicator; and various coating agents, protection films, sealing members, adhesives, etc. used for them.

In the semiconductor integrated circuit peripheral materials, there may be mentioned resist a material of micro lithography for LSI and super LSI materials.

In the car and transport plane fields, there may be mentioned lump materials such as for headlight, taillight and indoor lamp for cars, a lamp reflector, a lamp lens, various interior and exterior products such as an exterior and interior panel, and glass substitute; and various coating agents, protection films, sealing members, adhesives, etc. used for them. There may also be mentioned an exterior part and glass substitute for railway vehicles; and various coating agents, protection films, sealing members, adhesives, etc. used for them. There may also be mentioned an exterior part and glass substitute for airplanes; and various coating agents, protection films, sealing members, adhesives, etc. used for them.

In the architectural fields, there maybe mentioned a glass intermediate film, glass substitute, and solar cell peripheral material; and various coating agents, protection films, sealing members, adhesives, etc. used for them. For agriculture, there may be mentioned a coating film for green houses.

As the optical and electric functional organic materials for the next generation, there may be mentioned an organic EL element peripheral material, organic photorefractive element, optical amplification element which is a light-light conversion device, optical calculation element, substrate material for the peripheral of organic solar cells, fiber material, sealing member of element; and various coating agents, protection films, sealing members, adhesives, etc. used for them.

<Second Aspect of the Invention>

The curable composition of the second aspect of the present invention contains a compound represented by the above general formula (II) as the component (A). In the curable composition of the second aspect of the invention, the component (A) may comprise the compound represented by the above general formula (II) as an exclusive constituent, or may contain an organic compound containing at least two carbon-carbon double bonds reactive with a SiH group in each molecule other than the compound represented by the above general formula (II). The above organic compound is same as the component (A) in the first aspect of the invention.

The curable composition of the second aspect of the invention contains the same components (B) and (C) as in the first aspect of the invention. The curable composition of the second aspect of the invention may or may not contain the same component (D) as in the first aspect of the invention. The curable composition of the second aspect of the invention may or may not contain the same component (E) as in the first aspect of the invention. The curable composition of the second aspect of the invention may or may not contain the same arbitrary component as in the first aspect of the invention.

The curable composition of the second aspect of the invention can be cured by preliminary mixing the respective components, followed by allowing part or the whole of the carbon-carbon double bond reactive with a SiH group and the SiH groups in the composition to react with each other to give a curing product.

As for the method of mixing, various methods may be employed. Preferred is, however, the method comprising mixing the component (A) and component (C) and mixing the resulting mixture with the component (B). The method comprising mixing the component (C) with a mixture of the component (A) and component (B) makes it difficult to control the reaction. In the case of a mixture of the components (B) and (C), the reaction of the component (B) with water is promoted, hence deterioration may occur during storage, etc., thus it is not preferable.

The curing and molding methods according to the curable composition of the second aspect of the invention are the same as in the case of the first aspect of the invention.

The curable composition of the second aspect of the invention can be used in the same applications as the curable composition of the first aspect of the invention.

<Third Aspect of the Invention>

The curable composition of the third aspect of the present invention contains, as the component (B), a compound obtainable by hydrosilylation reaction between a compound represented by the above general formula (III) and a compound having at least two SiH groups in each molecule, and/or a compound obtainable by hydrosilylation reaction between a compound represented by the above general formula (IV) and a compound having at least three SiH groups in each molecule. In the curable composition of the third aspect of the invention, the component (B) may comprises the above compounds as exclusive constituents, or may contain a compound having at least two SiH groups in each molecule other than the above compounds. The compound having at least two SiH groups in each molecule is same as the component (B) of the first aspect of the invention.

The curable composition of the third aspect of the invention contains the same components (A) and (C) as in the first aspect of the invention. The curable composition of the third aspect of the invention may or may not contain the same component (D) as in the first aspect of the invention. The curable composition of the third aspect of the invention may or may not contain the same component (E) as in the first aspect of the invention. The curable composition of the third aspect of the invention may or may not contain the same arbitrary component as in the first aspect of the invention.

The mixing method according to the curable composition of the third aspect of the invention is same as in the case of the second aspect of the invention. The curing and molding methods according to the curable composition of the third aspect of the invention are the same as in the case of the first aspect of the invention.

The curable composition of the third aspect of the invention may be used in the same applications as the curable composition of the first aspect of the invention.

<Fourth Aspect of the Invention>

The fourth aspect of the present invention is a light-emitting diode sealed with the curable composition according to the first, second and third aspects of the present invention. As specific embodiment, it is a light-emitting diode which comprises a light emitting element, a substrate on the top surface of which is formed with an external electrode to be disposed with said light emitting element, and a sealing member disposed adjacently onto said substrate, the contact surface between said electrode and said sealing member being 50 to 90% when the contact surface between said substrate and said sealing member is set at 100%, and said sealing member being the curable composition of the first aspect of the invention.

As another embodiment, it is a light-emitting diode which comprises a light emitting element, a package comprising an aperture having a bottom surface to be disposed with said light emitting element and sidewalls, and a sealing member for sealing said aperture, said package being formed of a molding resin by a monolithic process with one end of the external electrode being exposed on said aperture bottom, the area of said external electrode on said aperture bottom being 50 to 90% when the surface area of said aperture bottom is set at 100% and said sealing member being the curable composition of the first aspect of the invention.

The light-emitting diode of the invention can be produced by coating the light emitting element with the composition mentioned above.

The above light emitting element is not particularly restricted, and may be any of the light emitting elements which can be used in the light-emitting diodes. For example, there may be mentioned those produced by layering a semiconductor material, by any of various methods, for example the MOCVD, HDVPE, and liquid phase growth methods, on a substrate, if necessary provided with a buffer layer such as a GaN, AlN layer, etc.

The above substrate is not particularly restricted, but various materials can be used, for example sapphire, spinel, SiC, Si, ZnO, GaN single crystals, etc. Among these, the use of sapphire is preferred since GaN with good crystallinity can be formed with ease and the industrial utility is high.

The above semiconductor material to be layered is not particularly restricted, but includes, for example, GaAs, GaP, GaAlAs, GaAsP, AlGaInP, GaN, InN, AlN, InGaN, InGaAlN, SiC, etc. Among these, nitride compound semiconductors ($In_xGa_yAl_xN$) are preferred from the high brightness viewpoint. The above semiconductor materials may contain an activator, etc.

The structure of the above light emitting element is not particularly restricted, but there may be mentioned, for example, the homojunction, heterojunction, and double-hetero structure having a MIS junction, pn junction or PIN junction. The single or multiple quantum well structure may also be employed.

The light emitting element may have a passivation layer or have no passivation layer.

The light emitting element can be provided with electrodes by any of the methods known in the art.

The electrodes on the light emitting element can be electrically connected with lead terminals and so forth by various methods. The electrically connecting members are not particularly restricted, but preferably ones showing good ohmic and mechanical connectivity with the electrodes of the light emitting element, etc., for example bonding wires made of gold, silver, copper, platinum, aluminum, or alloys thereof, etc. Conductive adhesives or the like composed of a conductive filler, such as silver or carbon, and of a resin filled therewith may also be used. From the good workability viewpoint, aluminum wires or gold wires are preferably used among them.

In the present invention, the light emitting element showing luminous intensity in the perpendicular direction is not less than 1 cd is preferred. When the light emitting element has a luminous intensity in the perpendicular direction of not less than 2 cd, however, the effects of the invention can be produced more significantly and, when the luminous intensity is not less than 3 cd, the effects of the invention are still more significant.

The emission output of the above light emitting element is not particularly restricted. When the light emitting element shows an output of not less than 1 mW at 20 mA, however, the effects of the invention are significant. When the light emitting element shows an output of not less than 4 mW at 20 mA, the effects of the invention are more significant and, when the light emitting element shows an output of not less than 5 mW at 20 mA, the effects of the invention are still more significant.

The above light emitting element that can be used is not particularly restricted, but may be diverse in emission wavelength range, from the ultraviolet to the infrared region. When the element shows a main emission peak wavelength of not longer than 550 nm, however, the effects of the invention are significant. Only one of the above light emitting element may be used for monochromic light emission, or a plurality of such elements may be used for monochromic or polychromic light emission.

The lead terminals to be used in the light-emitting diode of the invention are not particularly restricted, but are preferably ones showing good adhesion to electric connection members, such as bonding wires, good electric conductivity, etc. Thus, the lead terminals preferably have an electric resistance of not more than 300 μΩ·cm, more preferably not more than 3 μΩ·cm. The material of these lead terminals are not particularly restricted, but there may be mentioned, for example, iron, copper, iron-containing copper, tin-containing copper and, further, the products of plating of these with silver, nickel, or the like, etc. The glossiness of these lead terminals may be appropriately adjusted for attaining good spreading of light.

The light-emitting diode of the invention can be produced by coating the light emitting element with the curable composition of the first aspect of the invention. The above-mentioned "coating" includes, within the meaning thereof, not only direct sealing of the light emitting element but also indirect coating. Specifically, the above light emitting element may be directly sealed with the curable composition of the first aspect of the invention by various methods conventionally in use, or after sealing the light emitting element with sealing resins such as epoxy resins, silicone resins, acrylic resins, urea resins and imide resins, or glass, and then the above or surround the resultant may be coated with the curable composition of the first aspect of the invention. Moreover, after sealing the above light emitting element with the curable composition of the first aspect of the invention, the resultant may be molded (also called as sealed) with epoxy resins, silicone resins, acrylic resins, urea resins, imide resins, etc. By these methods, utilizing differences of reflective index and specific gravity, various effects such as lens effect can be provided.

Various methods can be applied as the method of sealing. For example, a liquid composition may be poured into a cup, cavity, package hollow, etc., with the light emitting element disposed on the bottom thereof in advance, using a dispenser or by any other method, followed by curing by heating, etc. It is also possible to allowing a solid composition or highly viscous liquid composition to flow by heating, etc., pouring the same into a package hollow or the like in the same manner and causing curing by heating, etc. The above package can be produced using any of various materials, and there may be mentioned, for example, polycarbonate resins, polyphenylene sulfide resins, epoxy resins, acrylic resins, silicone resins, ABS resins, polybutylene terephthalate resins, polyphthalamide resins, etc. Moreover, a method comprising pouring the composition into a molding form in advance, immersing a lead flame or the like fixed with the light emitting element thereto, and then curing the composition can also be applied. Or the sealing layer comprising the composition may be molded and cured by pouring using a dispenser into a form inserted with the light emitting element, transfer molding, or injection molding, etc. It is also possible to simply cure the composition in a liquid or flowage form by dropwise addition in the shape of the light emitting element or coating. The curable composition can also be molded and cured by mimeographing, screen printing, application via a mask, and the like. Or a method comprising fixing a composition partially cured or cured in a plate-like shape or lens-like shape on the light emitting element can also be applied. Moreover, the composition can be used as a die-bonding agent for fixing the light emitting element to a lead terminal or a package, or as a passivation layer on the light emitting element. Further, it can also be used as a package substrate.

The shape of the coated portion is not particularly restricted but may be diverse. For example, there may be mentioned lens-like shapes, plate-like shapes, thin film shapes, those shapes described in Japanese Kokai Publication Hei-06-244458, and the like shapes. These shapes maybe formed by molding and curing of a composition or by curing of a composition, followed by after-working.

The light-emitting diode of the invention can be applied in various types. For example, either types such as lump type, SMD type, and tip type can be applied. As a packaging substrate of SMD and tip types, various ones may be used, and there may be mentioned, for example, epoxy resins, BT resins, ceramics, etc.

Further, various modes can be applied to the light-emitting diode of the invention. For example, there may be mentioned the mode in which a light-reflecting or light-collecting layer is provided on the back of the light emitting element, the mode in which a complementarily colored portion is provided on the bottom to cope with sealant resin yellowing, the mode in which a thin film capable of absorbing shorter wavelength light than the main emission peak is disposed on the light emitting element, the mode in which the light emitting element is sealed with a soft or liquid sealing member and then the circumference is molded with a hard material, the mode in which the light emitting element is sealed with a material containing a fluorescent substance absorbing the light from the light emitting element and emitting a longer wavelength fluorescent light and the circumference is then molded, the mode in which a material containing a fluorescent substance is shaped in advance and then molded together with the light emitting element, the mode in which a sealing member is formed into a special shape to thereby increase the emission efficiency, as described in Japanese Kokai Publication Hei-06-244458, the mode in which the package is provided with a two-stage hollow to reduce the unevenness of brightness, the mode in which the light-emitting diode is immobilized by insertion into a through hole, the mode in which a thin film capable of absorbing a shorter wavelength light than the main emission wavelength is formed on the light emitting element surface, the mode in which the light emitting element is connected with lead members and the like by flip chip bonding or the like using solder bumps, etc., for taking out light in the direction of the substrate and the like modes.

The light-emitting diode of the invention can be used in various fields of use known in the art. Specifically, such uses include backlights, illumination, light sources for sensors, light sources for gauges in vehicles, signal lamps, display lamps, display devices, light sources for planar light emitters, displays, decorations, various lights, etc.

BEST MODE FOR CARRYING OUT THE INVENTION

The following examples and comparative examples illustrate the present invention. They are, however, by no means limitative of the scope of the present invention.

Firstly, a synthesis example of a compound containing at least two SiH groups in each molecule, which is the component (B), is described.

SYNTHESIS EXAMPLE 1

A 5-L separable flask was charged with 1.8 kg of toluene and 1.44 kg of 1,3,5,7-tetramethylcyclotetrasiloxane, and heated until the inside temperature arrived at 104° C. Thereto was added dropwise a mixture of 200 g of triallyl isocyanurate, 1.44 mL of platinum-vinylsiloxane complex solution in xylene (containing 3% by weight of platinum) and 200 g of toluene. The resulting mixture was heated under reflux in an oil bath at 120° C. for 7 hours. Then, 1.7 g of 1-ethynyl-1-cyclohexanol was added. The unreacted portion of 1,3,5,7-tetramethylcyclotetrasiloxane and the toluene were distilled off under reduced pressure. $^1$H-NMR revealed that the product was the reaction product resulting from part of the SiH groups of 1,3,5,7-tetramethylcyclotetrasiloxane with triallyl isocyanurate (hereinafter referred to as partial reaction product B1, SiH value: 8.2 mmol/g, allyl value: 0.12 mmol/g) The product is a mixture but contains, as a main component, the compound having the structure given below, which is the component (B) of the invention. It also contains the platinum-vinylsiloxane complex, which is the component (C) of the invention.

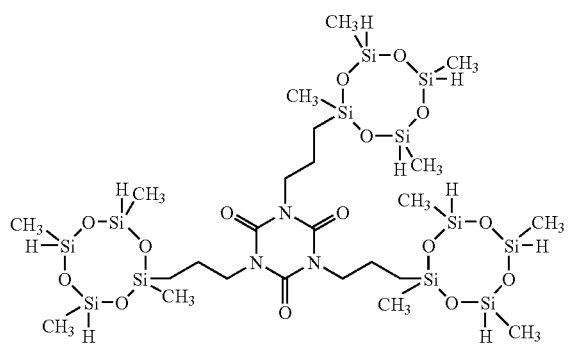

EXAMPLE 1

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 0.75 g of γ-glycidoxypropyltrimethoxysilane as the component (D), and 0.15 g of aluminum tris(ethyl acetoacetate) (Kawaken Fine Chemicals Co., Ltd., product name: ALCH-TR) as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 1 hour, 70° C. for 1 hour, 80° C. for 1 hour, 120° C. for 1 hour and 150° C. for 1 hour, in that order, followed by curing. The visually uniform, colorless and transparent curing product with the thickness of approximately 3 mm was obtained.

COMPARATIVE EXAMPLE 1

Triallyl isocyanurate (1.0 g) was used as the component (A), 1.49 g of the reaction product (B1) prepared in Synthesis Example 1 as the component (B), and 7.5 mg of a platinum-vinylsiloxane complex solution in xylene (containing 3% by weight of platinum) as the component (C). A mixture (mixture A) was prepared in advance by mixing up the above components (A) and (C) with stirring. A one-pot mixture was prepared by mixing up the above mixture A and the component (B) with stirring and degassing. The above one-pot mixture was poured into a cell produced by inserting a 3-mm-thick silicone rubber sheet as a spacer between two glass plates, heated in a hot air drier at 60° C. for 1 hour, 70° C. for 1 hour, 80° C. for 1 hour, 120° C. for 1 hour and 150° C. for 1 hour, in that order, followed by curing. The visually uniform, colorless and transparent curing product with the thickness of approximately 3 mm was obtained.

COMPARATIVE EXAMPLE 2

Triallyl isocyanurate (1.0 g) was used as the component (A), 1.49 g of the reaction product (B1) prepared in Synthesis Example 1 as the component (B), 7.5 mg of a platinum-vinylsiloxane complex solution in xylene (containing 3% by weight of platinum) as the component (C), and 0.125 g of γ-glycidoxypropyltrimethoxysilane as the component (D). A mixture (mixture A) was prepared in advance by mixing up the above components (A) and (C) with stirring. Separately, a mixture (mixture B) was prepared in advance by mixing up the above components (B) and (D) with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 1 hour, 70° C. for 1 hour, 80° C. for 1 hour, 120° C. for 1 hour and 150° C. for 1 hour, in that order, followed by curing. The visually uniform, colorless and transparent curing product with the thickness of approximately 3 mm was obtained.

MEASUREMENT EXAMPLE 1

The one-pot mixtures prepared in Example 1, and Comparative Examples 1 and 2 were applied on an aluminum plate (A-1050P) to prepare coating films of approximately 20 μm, and the films were heated at 120° C. for 1 hour. The optical materials were colorless and transparent. After cooling the films to room temperature, adhesion property test was carried out according to JISK 5400 cross-cut taping method (25 grids of 2 mm square) The obtained results are shown in Table 1.

MEASUREMENT EXAMPLE 2

For the curing products obtained in Example 1, and Comparative Examples 1 and 2, a heat and light resistance test was carried out using Suga Test Instruments' M6T-type metering weatherometer (black panel temperature 120° C., irradiation intensity: 50 MJ/m$^2$), and coloration and the light transmittance at 470 nm using a spectrophotometer (U-3300, Hitachi, Ltd.) were determined before and after the test. The obtained results are shown in Table 1.

TABLE 1

| | | Example 1 | Compar. Ex. 1 | Compar. Ex. 2 |
|---|---|---|---|---|
| Cross-cut adhesion test on aluminum base | | ○ | ▲ | X |
| Before the heat and light resistance test | Coloration | Colorless and transparent | Colorless and transparent | Colorless and transparent |
| | Light transmittance at 470 nm | 88.49% | 89.68% | 90.21% |
| After the heat and light | Coloration | Pale yellow and transparent | Pale yellow and transparent | Pale yellow and transparent |

TABLE 1-continued

|  |  | Example 1 | Compar. Ex. 1 | Compar. Ex. 2 |
|---|---|---|---|---|
| resistance test | Light transmittance at 470 nm | 83.90% | 84.26% | 89.45% |

Evaluation of cross-cut adhesion test
○: No peeling
▲: peeled area 50% or more
Δ: peeled area 50% or less
X: 100% peeled From Table 1, it is found that the curable compositions of the invention are excellent in adhesion properties, not subjected to coloration due to heat and light deterioration, and has high heat and light resistances.

EXAMPLE 2

The sheet-shaped curing product produced in Example 1 is cut into an appropriate form, and fixed on a light-transmitting window disposed on a metal cap for can type. Meanwhile, a light emitting element having a double-hetero structure in which an Si- and Zn-doped InGaN active layer formed on a sapphire substrate by MOCVD (Metal Organic Chemical Vapor Deposition) method being sandwiched with n- and p-type AlGaN clad layers is prepared. Successively, this light emitting element is mounted on a metal stem for can type, and p- and n-electrodes were wire-bonded with an Au line to the respective leads. This is air-sealed with the above metal cap for can type. In this manner, a can type light-emitting diode can be produced.

EXAMPLE 3

On a washed sapphire substrate, by MOCVD (Metal Organic Chemical Vapor Deposition) method, the below-mentioned layers are laminated in the following order: n-type GaN layer which is an undoped nitride semiconductor; GaN layer which is to be an n-type contact layer formed with an Si-doped n-type electrode; n-type GaN layer which is an undoped nitride semiconductor; GaN layer which is to be a barrier layer constituting a light emitting layer; InGaN layer constituting a well layer; GaN layer which is to be a barrier layer (quantum well structure); AlGaN layer as a p-type clad layer doped with Mg on a light emitting layer; and GaN layer which is an Mg-doped p-type contact layer. By etching, the surfaces of p- and n-contact layers are exposed on the same side of the nitride semiconductor on the sapphire substrate. On the respective contact layers, Al is deposited by a sputtering method to form positive and negative electrodes. A scribing line was drawn on the prepared semiconductor wafer, and then the wafer is divided by external pressure to form a light emitting element.

On the bottom surface of a silver-plated mount lead cup constituted of iron-containing copper, the above light emitting element is die-bonded using an epoxy resin composition as a die bond resin. The resultant is heated at 170° C. for 75 minutes to cure the epoxy resin composition to fix the light emitting element. Next, the positive and negative electrodes of the light emitting element, the mount lead and inner lead are wire-bonded with an Au line to gain electric access.

A curable composition prepared in the same manner as Example 1 is poured into a casting case, which is a bombshell-shaped molding form. Parts of the mount lead and inner lead, the cup of which is disposed with the above light emitting element, are inserted into the casting case to carry out an initial curing at 100° C. for 1 hour. The light-emitting diode is withdrawn from the casting case and cured at 120° C. for 1 hour under nitrogen atmosphere. Thereby, a lump type light-emitting diode such as a bombshell-shaped one can be produced.

EXAMPLE 4

A curable composition is produced by the method described in Example 1.

A pair of copper foil patterns is formed on a glass epoxy resin by etching to produce a substrate having lead electrodes. A light emitting element is die-bonded on the glass epoxy resin using an epoxy resin. The respective electrodes of the light emitting element and respective lead electrodes are wire-bonded with an Au line to gain electric access. On the substrate, a glass epoxy resin having a through hole is fixed and disposed to function as a mask and sidewall. In this condition, the resultant is disposed in vacuum equipment, the curable composition is dispensed on the glass epoxy resin substrate disposed with the light emitting element, and the curable composition is filled into a cavity utilizing the through hole. In this condition, the composition is cured at 100° C. for 1 hour, and further at 150° C. for 1 hour. By dividing with every light-emitting diode tip, a tip type light-emitting diode can be produced.

EXAMPLE 5

A curable composition is produced by the method described in Example 1.

By insert molding, a package of a tip type light-emitting diode is formed using a PPS resin. Inside of the package, an aperture to be disposed with a light emitting element is equipped and a silver-plated copper plate is placed as an external electrode. A light emitting element is fixed by die bonding inside the package using an epoxy resin. An Au line, which is a conductive wire, is electrically connected to the respective electrodes of the light emitting element and the respective external electrodes disposed in the package by wire bonding. Inside of the package aperture, a curable composition is filled as a sealing member. In this condition, the composition is cured at 100° C. for 1 hour, and further at 150° C. for 1 hour. In this manner, a tip type light-emitting diode can be produced.

EXAMPLE 6

A composition is produced by the method described in Example 1.

A light-emitting diode of Example 6 is equipped with a light emitting element emitting blue or bluish light, a package having an aperture comprising a bottom surface on which said light emitting element is to be disposed and side walls, and a sealing member for sealing said aperture. In this sealing member, the composition produced by the method described in Example 1, and a YAG fluorescent substance having a composition of $(Y_{0.8}Gd_{0.2})_3Al_5O_{12}$:Ce are used. The composition of Example 1 and YAG fluorescent substance are uniformly mixed, and then the mixture is poured into the aperture of the package which is to be disposed with a light emitting element. After the pouring, the mixture was heated in a hot air drier at 60° C. for 6 hours, 70° C. for 1 hour, 80° C. for 1 hour, 120° C. for 1 hour and 150° C. for 1 hour, in that order, followed by curing. Thereby, a light-emitting diode emitting white or whity light was produced.

COMPARATIVE EXAMPLE 3

By the same method in Example 6, a light-emitting diode was produced using an epoxy resin in lieu of the curable composition of the invention. Said epoxy resin was prepared by mixing 30 g of Celoxide 2021 P (product of Daicel Chemical Industries, Ltd.), 70 g of YX 8000 (product of Japan Epoxy Resins Co., Ltd.), and 1 g of San-aid SI-100L (product of Sanshin Chemical Industry Co., Ltd.). This epoxy resin and the YAG fluorescent substance having the above composition are uniformly mixed, and then this mixture is poured into the aperture of the package which is to be disposed with a light emitting element. After the pouring, the epoxy resin was heated in a hot air drier at 90° C. for 3 hours and 150° C. for 4 hours, followed by curing. Thereby, a light-emitting diode of Comparative Example 3 was produced.

Conventionally, in sealing members for protecting light emitting elements, an epoxy resin has been used to produce a light-emitting diode. The epoxy resin is excellent in adhesive properties, light transmittance, strength, hardness, and the like properties. However, the epoxy resin tends to absorb moisture. Thus, moisture is penetrated from an external surface of the epoxy resin protecting a light emitting element. As mentioned below, this water penetration from a sealing member causes problems such as corrosion of package electrodes, or peeling of light emitting element due to heat generation involved with electric conduction of the light emitting element. Particularly, phreatic explosion occurs in the step of reflow packaging of the light-emitting diode, and peeling has been easily caused. Thus, problems on moisture resistance in a resin-sealed type light emitting element are significantly important.

(Driving Test of the Light-Emitting Diode)

Using the light-emitting diodes produced in Example 6 and Comparative Example 3, a driving test was carried out. Table 2 shows the result of the driving test of the light-emitting diodes of Example 6 and Comparative Example 3 under the predetermined condition.

TABLE 2

| | Room temperature 10 mA (%) | Room temperature 20 mA (%) | 60° C., 90%, 10 mA (%) | 85° C., 10 mA (%) | 85° C., 85%, 5 mA (%) |
|---|---|---|---|---|---|
| Example 6 | 100 | 100 | 101 | 101 | 98 |
| Compar. Ex. 3 | 89 | 80 | 62 | 108 | 26 |

A surface-mounted type plastic package has the following problems. By carrying out reflow after allowing the surface-mounted plastic package to absorb moisture, phreatic explosion occurs at the time of reflowing. By this phreatic explosion, peeling occurs at the interface between the light emitting element and package. Due to this peeling, a gap is generated between the interface of the light emitting element and package. Usually, in the condition that there is no gap between the interface of the light emitting element and package, when the light emitting element is charged with electricity, heat generated from the light emitting element is released through the package by peeling. Therefore, the light emitting element is hardly deteriorated. On the contrary, in the case where a gap is generated between the interface of the light emitting element and package, when the light emitting element is charged with electricity, heat generated from the light emitting element is not sufficiently transmitted to the package Therefore, heat generated from the light emitting element is hardly released to outside. Thereby, heat deterioration of the resin part in the peripheral of the light emitting element is promoted to decrease optical output. Moreover, moisture and impurities are penetrated into the gap generated by peeling to cause corrosion of the light emitting element. Furthermore, when a package crack arrives at the package surface, or when the package swells to change its shape, appearance becomes defective to loose its commercial value.

In high temperature/high humidity regions, a sufficient amount of moisture is absorbed for generating cracks by mere leaving of the package in air. The light-emitting diode was allowed to stand and absorb moisture at 30° C. and humidity of 70% for 168 hours, and then packaged by reflowing. After the packaging, under the predetermined temperature and humidity condition, the driving test of the light-emitting diode was carried out.

The outline of the driving test of the light-emitting diode is as follows: at the predetermined temperature and humidity, the light-emitting diode is charged with a certain level of forward direction current and the relation between the optical output and the lapsed time was determined. The optical output immediately after the reflowing was measured and the obtained value was set at 100%. Then, the optical output after the electric charging for 1000 hours was measured and its relative value was obtained. As higher this relative value is, the more resistance the diode has for long term storage and driving.

First, to the light-emitting diodes obtained in Example 6 and Comparative Example 3, 10 mA of forward direction current was charged at room temperature and the optical output after the lapse of 1000 hours was measured. As the result, the light-emitting diode of Example 6 showed higher optical output than that of Comparative Example 3. Moreover, the optical output of the light-emitting diode of Example 6 did not decrease.

Secondly, to the light-emitting diodes obtained in Example 6 and Comparative Example 3, 20 mA of forward direction current was charged at room temperature and the optical output after the lapse of 1000 hours was measured. As the result, the light-emitting diode of Example 6 showed higher optical output than that of Comparative Example 3. Moreover, the optical output of the light-emitting diode of Example 6 did not decrease.

Next, to the light-emitting diodes obtained in Example 6 and Comparative Example 3, 10 mA of forward direction current was charged under high temperature and high humidity condition at 60° C. and humidity of 90%, and the optical output after the lapse of 1000 hours was measured. As the result, the light-emitting diode of Example 6 showed higher optical output than that of Comparative Example 3. Moreover, the optical output of the light-emitting diode of Example 6 did not decrease.

Then, to the light-emitting diodes obtained in Example 6 and Comparative Example 3, 10 mA of forward direction current was charged under high temperature condition at 85° C., and the optical output after the lapse of 1000 hours was measured. As the result, the optical output of the light-emitting diode of Example 6 did not decrease.

Furthermore, to the light-emitting diodes obtained in Example 6 and Comparative Example 3, 5 mA of forward direction current was charged under high temperature and high humidity condition at 85° C. and humidity of 85%, and the optical output after the lapse of 1000 hours was measured. As the result, the light-emitting diode of Example 6 showed higher optical output than that of Comparative Example 3. Moreover, the optical output of the light-emitting diode of Example 6 did not decrease.

From the above-mentioned test results, it is found that the light-emitting diode of the invention can maintain high reliability even under strict storage, packaging, and use conditions.

EXAMPLE 7

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of trimethyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 8

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of trinormalbutyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 9

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of triisopropyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 10

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of trinormalpropyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

MEASUREMENT EXAMPLE 3

To resin-made packages of 2.5 mm in width, 3 mm in length, and 2 mm in depth and having lead electrodes, the curable compositions of Examples 7 to 10 and Example 1 were filled. The packages were heated at 60° C. for 6 hours, 70° C. for 1 hour, 80° C. for 1 hour, 120° C. for 1 hour and 150° C. for 1 hour, in that order, and subjected to a thermal shock test. The thermal shock test was carried out by repeating the following cycle for 100 times: exposing the packages to −40° C. for 5 minutes, heating to 100° C., exposing to 100° C. for 5 minutes, cooling to −40° C., and exposing to −40° C. for 5 minutes. After completion of 100 cycles, the packages sealed with the curing products of Examples 7 to 10 showed preferable adhesive properties with the package bottom and side surfaces, the result was equivalent to that of the curing product of Example 1.

MEASUREMENT EXAMPLE 4

For the samples obtained in Example 7 and Example 1, tensile elasticity and tensile elongation were evaluated. The test samples were prepared as follows. The plate-shaped curing products of 3 mm in thickness were cut into rectangles of 6×55×3 mm, and near the center of longitudinal sides thereof were notched from both sides in U shape of r=1.0 mm and depth of 1 mm. The measurement was carried out using an autograph placed under the condition of 50% RH at 23° C., and the distance between the chucks was set at 15 mm. The U-notch parts of the test samples were placed near the center of the chucks, both ends thereof were pinched with the chucks, and tensile test was carried out at a tensile speed of 1 mm/min. The obtained results are shown in Table 3.

TABLE 3

|  | Tensile characteristics | |
|---|---|---|
|  | strength, MPa | elongation, % |
| Example 7 | 30 | 6 |
| Example 1 | 21 | 3 |

From Table 3, it is found that the curing product of the invention comprising a borate ester as the component (E) has high tensile strength and elongation.

MEASUREMENT EXAMPLE 5

For the samples obtained in Examples 7 to 10 and Example 1, the light transmittance at a wavelength of 470 nm was evaluated at the initial stage, after heating at 180° C. for 24 hours, 190° C. for 24 hours, and 200° C. for 24 hours. A spectrophotometer U-3300 manufactured by Hitachi, Ltd. was used as measurement equipment. The obtained results are shown in Table 4.

TABLE 4

|  | Light transmittance at 470 nm, % | | | |
|---|---|---|---|---|
|  | Initial stage | 180° C./24 h | 190° C./24 h | 200° C./24 h |
| Example 7 | 90 | 82 | 79 | 72 |
| Example 8 | 89 | 82 | 65 | 52 |
| Example 9 | 90 | 82 | 66 | 52 |
| Example 10 | 89 | 81 | 61 | 51 |
| Example 1 | 88 | 34 | 18 | 11 |

From Table 4, it is found that the curing products of the invention comprising a borate ester as the component (E) have small changes in the light transmittance at high temperatures.

EXAMPLE 11

The sheet-shaped curing product produced in Example 7 is cut into an appropriate form, and fixed on a light-transmitting window disposed on a metal cap for can type. Meanwhile, a light emitting element having a double-hetero structure in which an Si- and Zn-doped InGaN active layer formed on a sapphire substrate by MOCVD (Metal Organic Chemical Vapor Deposition) method being sandwiched with n- and p-type AlGaN clad layers is prepared. Successively, this light emitting element is mounted on a metal stem for can type, and p- and n-electrodes were wire-bonded with an Au line to the respective leads. This is air-sealed with the above metal cap for can type. In this manner, a can type light-emitting diode can be produced.

EXAMPLE 12

On a washed sapphire substrate, by MOCVD (Metal Organic Chemical Vapor Deposition) method, the below-mentioned layers are laminated in the following order: n-type GaN layer which is an undoped nitride semiconductor; GaN layer which is to be an n-type contact layer formed with an Si-doped n-type electrode; n-type GaN layer which is an undoped nitride semiconductor; GaN layer which is to be a barrier layer constituting a light emitting layer; InGaN layer constituting a well layer; GaN layer which is to be a barrier layer (quantum well structure); AlGaN layer as a p-type clad layer doped with Mg on a light emitting layer; and GaN layer which is an Mg-doped p-type contact layer. By etching, the surfaces of p- and n-contact layers are exposed on the same side of the nitride semiconductor on the sapphire substrate. On the respective contact layers, Al is deposited by a sputtering method to form positive and negative electrodes. A scribing line was drawn on the prepared semiconductor wafer, and then the wafer is divided by external pressure to form a light emitting element.

On the bottom surface of a silver-plated mount lead cup constituted of iron-containing copper, the above light emitting element is die-bonded using an epoxy resin composition as a die bond resin. The resultant is heated at 170° C. for 75 minutes to cure the epoxy resin composition to fix the light emitting element. Next, the positive and negative electrodes of the light emitting element, the mount lead and inner lead are wire-bonded with an Au line to gain electric access.

A curable composition prepared in the same manner as Example 7 is poured into a casting case, which is a bomb-shell-shaped molding form. Parts of the mount lead and inner lead, the cup of which is disposed with the above light emitting element, are inserted into the casting case to carry out an initial curing at 100° C. for 1 hour. The light-emitting diode is withdrawn from the casting case and cured at 120° C. for 1 hour under nitrogen atmosphere. Thereby, a lump type light-emitting diode such as a bombshell-shaped one can be produced.

EXAMPLE 13

A curable composition is produced by the method described in Example 7.

A pair of copper foil patterns is formed on a glass epoxy resin by etching to produce a substrate having lead electrodes. A light emitting element is die-bonded on the glass epoxy resin using an epoxy resin. The respective electrodes of the light emitting element and respective lead electrodes are wire-bonded with an Au line to gain electric access. On the substrate, a glass epoxy resin having a through hole is fixed and disposed using an epoxy resin to function as a mask and sidewall. In this condition, the resultant is disposed in vacuum equipment, the curable composition is dispensed on the glass epoxy resin substrate disposed with the light emitting element, and the curable composition is filled into a cavity utilizing the through hole. In this condition, the composition is cured at 100° C. for 1 hour, and further at 150° C. for 1 hour. By dividing with every light-emitting diode tip, a tip type light-emitting diode can be produced.

EXAMPLE 14

A curable composition is produced by the method described in Example 7.

By insert molding, a package of a tip type light-emitting diode is formed using a PPS resin. Inside of the package, an aperture to be disposed with a light emitting element is equipped and a silver-plated copper plate is placed as an external electrode. A light emitting element is fixed using an epoxy resin by die bonding inside the package. An Au line, which is a conductive wire, is electrically connected to the respective electrodes of the light emitting element and the respective external electrodes disposed in the package by wire bonding. Inside of the package aperture, a curable composition is filled as a sealing member. In this condition, the composition is cured at 100° C. for 1 hour, and further at 150° C. for 1 hour. In this manner, a tip type light-emitting diode can be produced.

EXAMPLE 15

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of trinormalbutyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 15° C. for 1 hour and 17° C. for 30 minutes, in that order, to obtain a transparent and hard molding.

EXAMPLE 16

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of triisopropyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 150° C. for 1 hour and 170° C. for 30 minutes, in that order, to obtain a transparent and hard molding.

EXAMPLE 17

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane as the component (D), and 150 mg of trinormalpropyl borate as the component (E). A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 150° C. for 1 hour and 170° C. for 30 minutes, in that order, to obtain a transparent and hard molding.

COMPARATIVE EXAMPLE 4

Triallyl isocyanurate (12.06 g) was used as the component (A), 17.96 g of the reaction product (B1) prepared in Synthesis Example 1 as the component (B), 95 mg of a platinum-vinylsiloxane complex solution in xylene (containing 3% by weight of platinum) as the component (C), and 0.75 g of γ-glycidoxypropyltrimethoxysilane as the component (D). A mixture (mixture A) was prepared in advance by mixing up the above components (A) and (C) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 1 hour, 70° C. for 1 hour, 80° C. for 1 hour, 120° C. for 1 hour, 150° C. for 1 hour and 170° C. for 30 minutes, in that order, followed by curing to obtain a transparent and hard molding.

COMPARATIVE EXAMPLE 5

Triallyl isocyanurate (30.0 g) was used as the component (A), 44.7 g of the reaction product (B1) prepared in Synthesis Example 1 as the component (B), 224 mg of a platinum-vinylsiloxane complex solution in xylene (containing 3% by weight of platinum) as the component (C). A mixture (mixture A) was prepared in advance by mixing up the above components (A) and (C) with stirring. Separately, a mixture (mixture B) was prepared in advance by mixing up the above component (B) and 224 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 1 hour, 70° C. for 1 hour, 80° C. for 1 hour, 120° C. for 1 hour, 150° C. for 1 hour and 170° C. for 30 minutes, in that order, followed by curing to obtain a transparent and hard molding.

MEASUREMENT EXAMPLE 6

For curing products prepared by heating the curing products obtained in Example 7 and Example 1 at 170° C. for 10 minutes, the light transmittance at a wavelength of 470 nm was evaluated at the initial stage, after heating at 180° C. for 24 hours, 190° C. for 24 hours, and 200° C. for 24 hours. A spectrophotometer U-3300 manufactured by Hitachi, Ltd. was used as measurement equipment. The obtained results are shown in Table 5.

TABLE 5

| | Light transmittance at 470 nm, % | | | |
|---|---|---|---|---|
| | Initial stage | 180° C./24 h | 190° C./24 h | 200° C./24 h |
| Example 7 | 90 | 81 | 68 | 57 |
| Example 1 | 88 | 34 | 18 | 11 |

From Table 5, it is found that the curing product of the invention comprising a borate ester as the component (E) has a small change in the light transmittance at high temperatures.

MEASUREMENT EXAMPLE 7

Using a resin mainly containing a semicrystalline polymer resin comprising high melting point crystals in a thermosetting member, as a package molding resin, silver-plated lead frame was insert-molded to resin packages for surface mounting. To the insert-molded resin packages for surface mounting, the curable compositions of Examples 7 to 10, Examples 15 to 17 and Example 1 were filled. The packages were heated at 60° C. for 1 hour, 70° C. for 1 hour, 80° C. for 1 hour, 120° C. for 1 hour, 150° C. for 1 hour and 170° C. for 30 minutes, in that order, and subjected to a thermal shock test. The thermal shock test was carried out by repeating the following cycle for 1000 times: exposing the packages to −40° C. for 5 minutes, heating to 100° C., exposing to 100° C. for 5 minutes, cooling to −40° C., and exposing to −40° C. for 5 minutes. After completion of 1000 cycles, the packages sealed with the curing products of Examples 7 to 10 and 15 to 17 showed preferable adhesive properties with the package bottom and side surfaces, the result was equivalent to that of the curing product of Example 1.

MEASUREMENT EXAMPLE 8

Using a resin mainly containing a semicrystalline polymer resin comprising high melting point crystals in a thermosetting member, as a package molding resin, silver-plated lead frame was insert-molded to resin packages for surface mounting. To the insert-molded resin packages for surface mounting, the curable composition of Comparative Example 4 was filled. The packages were heated at 60° C. for 1 hour, 70° C. for 1 hour, 80° C. for 1 hour, 120° C. for 1 hour, 150° C. for 1 hour and 170° C. for 30 minutes, in that order. After completion of the curing, the packages filled with the curable composition of Comparative Example 4 was found to have peeling in the side face in 60% of the total resins and packages. Furthermore, these packages were subjected to a thermal shock test. The thermal shock test was carried out by repeating the following cycle for 1000 times: exposing the packages to −40° C. for 5 minutes, heating to 100° C., exposing to 100° C. for 5 minutes, cooling to −40° C., and exposing to −40° C. for 5 minutes. After completion of 1000 cycles, in the packages sealed with the curing product of Comparative Example 4, whole curing products were peeled off from the bottom and side surfaces of the packages.

MEASUREMENT EXAMPLE 9

Using a resin mainly containing a semicrystalline polymer resin comprising high melting point crystals in a thermosetting member, as a package molding resin, silver-plated lead frame was insert-molded to resin packages for surface mounting. To the insert-molded resin packages for surface mounting, the curable composition of Comparative Example 5 was filled. The packages were heated at 60° C. for 1 hour, 70° C. for 1 hour, 80° C. for 1 hour, 120° C. for 1 hour, 150° C. for 1 hour and 170° C. for 10 minutes, in that order. After completion of the curing, the packages filled with the curable composition of Comparative Example 5 was found to have peeling in the side face of resins and packages in 70% of the total.

It is found that the curable composition of the invention comprising a borate ester as the component (E) has higher strength and elongation than Measurement Examples 4 and 6, and can provide a curing product which is less susceptible to coloration under high temperature conditions. Moreover, it is also found that the composition has superior adhesive properties to Measurement Example 7 in a LED package. On the other hand, from Measurement Examples 8 and 9, it was found that the use of either component (D) or (E) alone is insufficient to exhibit the effect of the first aspect of the present invention, and from comparison with Measurement Example 7, the combined use of the components (D) and (E) is important to exhibit the effect of the first aspect of the present invention.

EXAMPLE 18

In this Example, a light-emitting diode is formed which is specified in having the contact surface between an external electrode and a sealing member of 75% when the contact surface between a glass epoxy resin substrate on the top surface of which is formed with a pair of external electrodes and the sealing member to be disposed on said glass epoxy resin substrate is set at 100%.

The light-emitting diode of this Example is specified in having the ratio of the contact surface with the external electrode in the whole contact surface of the sealing member being not less than 50% to not more than 90%. In addition, by using the curable composition of the invention which is low in hygroscopicity in said sealing member, adhesion in the interface with the bottom surface of said sealing member is enhanced. Thus, it becomes possible to obtain a light-emitting diode capable of maintaining high reliability even under the strict use environment.

In recent years, use of surface-mounted light-emitting diodes has been widely spread, and miniaturization and high densification of electric apparatus have been realized. Such surface-mounted light-emitting diodes are mounted on a circuit substrate printed with cream solder, the whole of the resultant diodes is passed through reflow equipment which is an infrared heating furnace, said cream solder is melted and fixed. Moreover, at present, from environmental concerns, it is assumed preferable to use solder without containing lead. Such solder without containing lead has extremely high melting point, thus the upper temperature limit required for light-emitting diodes is further increased.

Particularly in the case of light-emitting diodes, on the external electrode surface, precious metal layers which have high light reflectivity are formed to preferably take out the light from the light emitting elements to be mounted to outside. Such precious metals have no oxidized film being formed on the surface thereof, adhesion to resin components is supposedly low. In the case where the contact surface between a resin substrate on the top surface of which is formed with external electrodes and a sealing member disposed on said resin substrate is set at 100%, when the contact surface between said external electrodes and said sealing member is 50% or more, adhesion between the bottom surface of the package aperture and the bottom surface of the sealing member is poor, thus peeling tends to occur at such extent that a crucial function is given to the light-emitting diode.

Then, for the purpose of improving the contact performances with external electrodes, it can be supposed to use an epoxy resin having a chemical structure containing many hydroxyl groups within a molecule or a chemical structure generating a hydroxyl group after curing. However, when a light-emitting diode applied with a sealing member comprising an epoxy resin is subjected to reflow solder packaging under the severe temperature environments, interface peelings between the sealing member and external electrode tend to occur in many cases.

When the hygroscopicity of a sealing member is high, it is considered that moisture absorbed from the sealing member surface which is exposed to air is diffused to the bottom of the sealing member which is in contact with an internal external electrode, thus moisture intervenes at the interface between the sealing member and external electrode. Therefore, even in the case of a light-emitting diode which has preferable adhesion at the interface of the external electrode and sealing member, it is considered that when moisture intervenes at the above interface, by an exposure to high temperatures, moisture present in the above interface causes phreatic explosion, thus peeling occurs at the above interface. For inhibiting this, the storage condition must be strict.

On the other hand, it can be said that the peeling degree between a sealing member and a package depends on the contact surface between the sealing member and external electrodes as mentioned above. Thus, it is considered to enhance adhesion between the sealing member and package by reducing the area of the external electrodes to be exposed on the above aperture bottom as much as possible.

However, if the external electrode area is extremely decreased, heat releasing ability is decreased, thus it becomes difficult to mount a high-output light emitting element with high reliability. Moreover, when the area of a resin with lower optical reflectivity than that of external electrodes becomes large at the contact surface with a sealing member, optical extraction efficiency of a light emitting element disposed inside the sealing member decreases. Furthermore, if the area of external electrodes becomes small, it becomes difficult to mount a plurality of light emitting elements to gain electric access, thus multi-functionalization of light emitting equipment becomes impossible.

In the present invention, by using a sealing member which is a curing product obtained from a curable composition satisfying heat resistance, preferable adhesive properties, and low hygroscopicity at the same time, it becomes possible to provide a light-emitting diode capable of maintaining high reliability without impairing multi-functionalization.

EXAMPLE 19

A light-emitting diode is formed in the same manner as Example 18 except for that a package used in this Example is equipped with an aperture comprising a bottom surface and side walls, and when the area of said bottom surface is set at 100%, the area of the external electrode exposed on the bottom surface being 75%. Thus, the same effect can be obtained.

The light-emitting diode of this Example is specified in having the ratio of the contact surface with an external electrode in the whole contact surface of a sealing member being not less than 50% to not more than 90%. In addition, by using the curable composition of the invention which is low in hygroscopicity in said sealing member, adhesion at the interface between a resin package and the bottom surface of the sealing member is enhanced. Thus, it becomes possible to obtain a light-emitting diode capable of maintaining high reliability even under the strict use environment.

EXAMPLE 20

A light-emitting diode is formed in the same manner as Example 19 except for respective ends of an external positive electrode and an external negative electrode being exposed at a predetermined distance on a package aperture bottom, and at least a pair of resin exposure parts of the molding resin of the package being disposed on the respective external electrodes. Such package is capable of having higher junction strength with a sealing member for sealing said aperture as compared with the case in which the above resin exposure part is not disposed. Moreover, the pair of exposure parts is preferably disposed symmetrically to an axis of the center line which is vertical to opposed one edge of the respective electrodes. Thereby, the index characteristics of light emitting equipment can be made symmetrical. Moreover, this resin exposure part is formed by notching, etc. the external electrode, and forming a molding resin inside the notch, etc. Thereby, the external electrode and the molding resin can be firmly fixed, thus peeling thereof can also be prevented.

EXAMPLE 21

In this Example, a light-emitting diode is formed in the same manner as Example 18 except for forming a substrate having a lead electrode by forming a pair of copper foil patterns by etching on a semicrystalline polymer resin substrate comprising high melting point crystals in a thermosetting member. Thus, a light-emitting diode having higher reliability can be obtained. Herein, in this specification, a semicrystalline polymer resin refers to a polymer resin having the crystallization degree of 10% by weight to 60% by weight. The semicrystalline polymer resin used in this Example is aromatic polyphthalamide having the melting point of 280° C., glass-transition temperature of 100° C., and the crystallization degree of 25% by weight. Thus, since a package comprising a resin low in glass-transition temperature is an isotropic material as well as low in hygroscopicity, peeling from a sealing member by heat stress can be inhibited. In addition, various additives can be added to the semicrystalline polymer resin according to the purpose. For example, titanium oxide which is to be a reflectivity improving material, glass fiber which is to be a mechanical strength improving agent, paraffine wax which is to be a mold-releasing agent, and a bromination agent which is to be a fire retardent can be preferably added.

Moreover, beyond this Example, by disposing a sealing member after washing the surface disposed with at least the sealing member by various washing methods conventionally in use, adhesion between the respective members can be more improved.

Furthermore, the contact angle of liquid to the semicrystalline polymer resin is smaller than that to a liquid crystal polymer (contact angle 69.3), and the surface energy of semicrystalline polymer resin is larger. Thereby, a solid surface comprising the semicrystalline polymer resin can be said to have more preferable wettability to the curable composition of the invention than a solid surface comprising a liquid crystal polymer. Therefore, adhesion between a package comprising the semicrystalline polymer resin and a sealing member comprising the curable composition of the invention is preferable. For example, there is a case that peeling occurs at the interface of a package and a molding resin in the step of cooling in a curing process after filling the molding resin, but in the case of aromatic polyamide, which is a semicrystalline polymer, interface peeling occurs much less than the case of semicrystalline polymer.

In addition, in order to measure the contact angle of a resin substrate to which a sealing member is disposed on the border thereof, or a material to be a package, contact angle meter CA-X150 type manufactured by Kyowa Interface Science Co., Ltd. (liquid sample is pure water) can be used.

EXAMPLE 22

In this Example, a light-emitting diode is formed in the same manner as Example 19 except for using a composition mainly containing a semicrystalline polymer resin comprising high melting point crystals in a thermosetting member as a package molding resin.

40 mA of forward direction current is charged to the light-emitting diode obtained in this Example at room temperature (25° C.) and the relation between the output and the lapse of time is measured, the output does not decrease even after the lapse of 1000 hours. Furthermore, 10 mA of forward direction current is charged under high temperature and high humidity condition at 85° C. and humidity of 85% and the relation between the output and the lapse of time is measured, the output is maintained after the lapse of up to 700 hours. Even after the lapse of 1000 hours, the relative output is not less than 90%. Moreover, when the light-emitting diode of this Example is packaged on a packaging substrate with a Pb-free conductive member and subjected to reflow process at 260° C. for approximately 10 seconds, the output does not decrease after 2, and further 3 cycles of reflow process. Thus, the light-emitting diode of this Example can maintain high reliability even under strict storage, packaging, and use conditions.

Furthermore, when the sealing member surface of the light-emitting diode which has been subjected to one cycle of the above-mentioned reflow process is washed with a cleaning liquid, sprayed with a red dyeing penetration toxic ink (NEW MICRO-CHECK, product of Kohzai Corporation), and then allowed to stand for approximately 3 hours, in 100% of the whole contact surface between the sealing member and the external electrode exposed on the package aperture, the area dyed red is less than 50%. Thereby, it can be said that peeling does not occur to such extent that crucial function is given by the above reflow process in the light-emitting diode of this Example, and high reliability is provided.

EXAMPLE 23

A light-emitting diode is formed in the same manner as Example 19 except for mounting a light emitting element equipped with a pair of electrodes disposed across a semiconductor layer of the light emitting element in the lamination direction of said semiconductor by means of a conductive member on the external electrode in the package aperture. Thus, the same effect as Example 19 can be obtained.

Peeling at the interface of the external electrode and the above light emitting element mounted on said external electrode is attributable to thermal expansion of the sealing member covering said element. As in this Example, in the case where electric access is gained at the interface of the external electrode and the light emitting element mounted on said external electrode, peeling of said interface leads to lights-out. However, in this Example, by combinedly using the curable composition of the invention and a package, thermal expansion of the sealing member can be inhibited and peeling of the light emitting element disposed inside from the external electrode can be prevented.

EXAMPLE 24

A light-emitting diode is formed in the same manner as Example 19 except for forming a sealing member after mounting the above light emitting element together with a zener diode as a protection element on the external electrode exposed on the package aperture. In the package used in this Example, the area of the external electrode exposed on the aperture bottom is 75%, i.e. it is fully possible to mount a plurality of elements on the external electrode. In addition, by forming a sealing member inside the above aperture with the curable composition of the invention, adhesion at the interface between said external electrode and the respective elements can be maintained. Thereby, reliability of light emitting equipment can be more enhanced by mounting the light emitting element together with the protection element. When the above pretreatment and moisture absorption test are carried out for the thus obtained light-emitting diode, the same effect as Example 18 can be obtained. Thus, the light-emitting diode of the invention can be provided with high reliability without causing peeling among the respective constituent members even a plurality of elements is mounted as this Example.

EXAMPLE 25

A light-emitting diode is formed in the same manner as Example 18 except for mounting a blue light-emitting LED, green light-emitting LED, and red-light emitting LED in which a pair of electrodes is mounted across a GaAs semiconductor layer, as light emitting elements having the constitution of the above light emitting element on the external electrodes exposed on the package aperture, and the same effect as Example 18 can be obtained. As in this case, in the light-emitting diode having a plurality of light emitting elements, and particularly in the case where the respective emitted colors are in a complementary color relation, when at least one light emitting element goes out of electric access, emitted colors observed on the light emitting surface of the light-emitting diode significantly changes. However, in this Example, by combinedly using a sealing member comprising the curable composition of the invention which is low in hygroscopicity and excellent in adhesive properties, and a package capable of increasing adhesion with the sealing member, it becomes possible to prevent peeling at the conductive joint interface between the electrode disposed on the bottom surface side of said GaAs light emitting element with the above external electrode. Thus, a light-emitting diode excellent in the optical characteristics and reliability can be obtained.

COMPARATIVE EXAMPLE 6

A light-emitting diode is formed in the same manner as Example 22 except for forming a sealing member comprising an epoxy resin. In the same way as Example 22, 40 mA of forward direction current is charged at room temperature (25° C.) to measure the relation between the output and lapse of time, then the output decreases with the lapse of time, and the relative output becomes 45% after the lapse of 1000 hours. Moreover, 10 mA of forward direction current is charged under high temperature and high humidity condition at 85° C. and humidity of 85% to measure the relation between the output and lapse of time, then the relative output decreases to 60% after the lapse of 600 hours, and further to 38% after the lapse of 1000 hours. In addition, the light-emitting diode of Comparative Example 5 is packaged on a packaging substrate with a Pb-free conductive member and subjected to reflow process at 260° C. for approximately 10 seconds, and then the relative output decreases to 88% in 1 cycle of the reflow process. After 2 cycles, the output decreases to 82%. That is, it can be said that when the light-emitting diode of Comparative Example 6 is mounted on the main surface side of packaging substrate to carry out a first reflow, and other light emitting equipment, a heat sink or the like is loaded on the back surface side to carry out a second reflow, i.e. both sides reflow is carried out, the output of the light-emitting diode of Comparative Example 6 significantly decreases. Such decrease in the output is supposedly attributable to peeling of the sealing member from the bottom surface of package aperture, i.e. light from the light emitting element is closed in the peeled part, thus optical extraction effect becomes poor as well as local deterioration of the sealing member is promoted.

Moreover, when the sealing member surface of the light-emitting diode which has been subjected to one cycle of the above-mentioned reflow process in the same manner as Example 22 is washed with a cleaning liquid, sprayed with a red dyeing penetration toxic ink (NEW MICRO-CHECK, product of Kohzai Corporation), and then allowed to stand for approximately 3 hours, 100% of the whole contact surface between the sealing member and the external electrode exposed on the package aperture is dyed red. Thereby, it can be said that the sealing member and the bottom surface of the package aperture are completely detached in the light-emitting diode of Comparative Example 5, and heat treatment in reflow process can cause sufficient damage to give crucial function.

COMPARATIVE EXAMPLE 7

A light-emitting diode is formed in the same manner as Example 22 except for forming a sealing member comprising a liquid crystal polymer. Although the sealing member and the sidewalls of the package aperture are firmly attached preferably, the adhesion between the sealing member and the bottom surface of the package aperture is weak. This is supposedly because the liquid crystal polymer is an anisotropy material. The resin package formed by insert molding of the external electrode can be obtained by inserting an external electrode into a molding die, pouring a molding resin from a molding resin pouring gate, and monolithic molding of the external electrode and molding resin. When an anisotropy material is used as the molding resin, since crystallization proceeds in the flowage direction of the molding resin, crystals of the formed package become anisotropic between X-axis and Y-axis directions, i.e. side walls and bottom surface of the aperture. Since the package in this Example has the molding resin pouring gate in the bottom surface side oppositely to the circuit substrate, adhesion between the sealing member of anisotropic material and the bottom surface of the package aperture is weak.

EXAMPLE 26

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane and 3.0 g of the epoxy-containing compound shown below as the component (D), and 150 mg of trimethyl borate as the component (E).

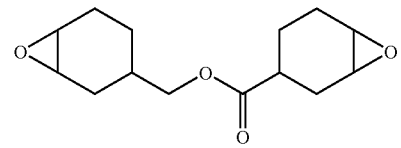

A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 150° C. for 1 hour, and 180° C. for 30 minutes, in that order, to obtain a transparent and hard molding.

EXAMPLE 27

Triallyl isocyanurate (12.04 g) was used as the component (A), 17.96 g of the reaction product (B1) prepared in Synthesis Example 1 as the component (B), 90 mg of a platinum-vinylsiloxane complex solution in xylene (containing 3% by weight of platinum) as the component (C), 750 mg of γ-glycidoxypropyltrimethoxysilane and 3.0 g of the epoxy-containing compound shown below as the component (D), and 150 mg of trimethyl borate as the component (E).

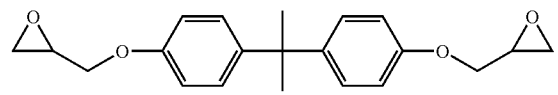

A mixture (mixture A) was prepared in advance by mixing up the above components (A), (C) and (E) with stirring. Separately, a mixture (mixture B) was prepared in advance by mixing up the above components (B) and (D), together with 90 mg of 1-ethynyl-1-cyclohexanol with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour, 150° C. for 1 hour, and 180° C. for 30 minutes, in that order, to obtain a transparent and hard molding.

MEASUREMENT EXAMPLE 10

The one-pot mixtures prepared in Examples 26 and 27 and Comparative Examples 1 and 2 were applied on an aluminum plate (A-1050P) to prepare coating films of approximately 20 μm, and the films were heated at 120° C. for 1 hour. The optical materials were colorless and transparent. After cooling the films to room temperature, adhesion property test was carried out according to JISK 5400 cross-cut taping method (25 grids of 2 mm square). The obtained results are shown in Table 6.

MEASUREMENT EXAMPLE 11

For the curing products obtained in Examples 26 and 27 and Comparative Examples 1 and 2, a heat and light resistance test was carried out using Suga Test Instruments' M6T-type metering weatherometer (black panel temperature 120° C., irradiation intensity: 50 MJ/m$^2$), and coloration and the light transmittance at 470 nm using a spectrophotometer (U-3300, Hitachi, Ltd.) were determined before and after the test. The obtained results are shown in Table 6.

TABLE 6

|  |  | Example 26 | Example 27 | Compar. Ex. 1 | Compar. Ex. 2 |
|---|---|---|---|---|---|
| Cross-cut adhesion test on aluminum base | | ○ | ○ | ▲ | X |
| Before the heat and light resistance test | Coloration | Colorless and transparent | Colorless and transparent | Colorless and transparent | Colorless and transparent |
| | Light transmittance at 470 nm | 88.0% | 89.0% | 89.68% | 90.21% |
| After the heat and light resistance test | Coloration | Pale yellow and transparent | Pale yellow and transparent | Pale yellow and transparent | Pale yellow and transparent |
| | Light transmittance at 470 nm | 85.0% | 85.0% | 84.26% | 89.45% |

Evaluation of cross-cut adhesion test
○: No peeling
▲: peeled area 50% or more
Δ: peeled area 50% or less
X: 100% peeled From Table 6, it is found that the curable compositions of the invention are excellent in adhesion properties, not subjected to coloration due to heat and light deterioration, and has high heat and light resistances.

EXAMPLE 28

Triallyl isocyanurate (10.3 g) and 2.75 g of diallyl monoglycidyl isocyanurate (21% by weight in component (A)) were used as the component (A), 17.96 g of the reaction product (B1) prepared in Synthesis Example 1 as the component (B), 93 mg of a platinum-vinylsiloxane complex solution in xylene (containing 3% by weight of platinum) as the component (C). A mixture (mixture A) was prepared in advance by mixing up the above components (A), (C) and 310 mg of aluminum tris(ethyl acetoacetate) (Kawaken Fine Chemicals Co., Ltd., product name: ALCH-TR) with stirring. Separately, a mixture (mixture B) was prepared in advance by mixing up the above component (B), 93 mg of 1-ethynyl-1-cyclohexanol, and 1.55 g of γ-glycidoxypropyltrimethoxysilane with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 29

Triallyl isocyanurate (7.23 g) and 7.70 g of diallyl monoglycidyl isocyanurate (52% by weight in component (A)) were used as the component (A), 17.96 g of the reaction product (B1) prepared in Synthesis Example 1 as the component (B), 99 mg of a platinum-vinylsiloxane complex solution in xylene (containing 3% by weight of platinum) as the component (C). A mixture (mixture A) was prepared in advance by mixing up the above components (A), (C) and 329 mg of aluminum tris(ethyl acetoacetate) (Kawaken Fine Chemicals Co., Ltd., product name: ALCH-TR) with stirring. Separately, a mixture (mixture B) was prepared in advance by mixing up the above component (B), 99 mg of 1-ethynyl-1-cyclohexanol, and 1.64 g of γ-glycidoxypropyltrimethoxysilane with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 30

Triallyl isocyanurate (7.23 g) and 7.70 g of diallyl monoglycidyl isocyanurate (52% by weight in component (A)) were used as the component (A), 17.96 g of the reaction product (B1) prepared in Synthesis Example 1 as the component (B), 99 mg of a platinum-vinylsiloxane complex solution in xylene (containing 3% by weight of platinum) as the component (C). A mixture (mixture A) was prepared in advance by mixing up the above components (A), (C) and 164 mg of trimethyl borate with stirring. Separately, a mixture (mixture B) was prepared in advance by mixing up the above component (B), 99 mg of 1-ethynyl-1-cyclohexanol, and 822 mg of γ-glycidoxypropyltrimethoxysilane with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 31

Triallyl isocyanurate (6.06 g) and 9.67 g of diallyl monoglycidyl isocyanurate (61% by weight in component (A)) were used as the component (A), 18.07 g of the reaction product (B1) prepared in Synthesis Example 1 as the component (B), 103 mg of a platinum-vinylsiloxane complex solution in xylene (containing 3% by weight of platinum) as the component (C). A mixture (mixture A) was prepared in advance by mixing up the above components (A), (C) and 171 mg of trimethyl borate with stirring. Separately, a mixture (mixture B) was prepared in advance by mixing up the above component (B), 103 mg of 1-ethynyl-1-cyclohexanol, and 857 mg of γ-glycidoxypropyltrimethoxysilane with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, and then further heated at 180° C. for 30 minutes to obtain a transparent and hard molding.

MEASUREMENT EXAMPLE 12

For the samples obtained in Examples 28 to 31, tensile elasticity and tensile elongation were evaluated. The test samples were prepared as follows. The plate-shaped curing products of 3 mm in thickness were cut into rectangles of 6×55×3 mm, and near the center of longitudinal sides thereof were notched from both sides in U shape of r=1.0 mm and depth of 1 mm. The measurement was carried out using an autograph placed under the condition of 50% RH at 23° C., and the distance between the chucks was set at 15 mm. The U-notch parts of the test samples were placed near the center of the chucks, both ends thereof were pinched with the chucks, and tensile test was carried out at a tensile speed of 1 mm/min. The obtained results are shown in Table 7.

TABLE 7

| | Tensile characteristics | |
|---|---|---|
| | strength, MPa | elongation, % |
| Example 28 | 28 | 4 |
| Example 29 | 30 | 5 |
| Example 30 | 31 | 6 |
| Example 31 | 26 | 6 |

From table 7, it is found that the curing product of the invention has high tensile strength and elongation, as well as high toughness.

MEASUREMENT EXAMPLE 13

For the samples obtained in Examples 28 to 31, the light resistance was evaluated at the initial stage and after 70 hours irradiation by a xenon weatherometer. The light transmittance at a wavelength of 470 nm was evaluated before and after the testing. The test was carried out using Suga Test Instruments' super xenon weatherometer (18 minutes of raining+1 hour and 42 minutes of irradiation) as evaluation equipment under the following test conditions for 70 hours: irradiation illuminance 180 W/m$^2$, black panel temperature 63° C., and humidity 50%. As transmittance measuring equipment, spectrophotometer U-3300 manufactured by Hitachi, Ltd. was used. The obtained results are shown in Table 8.

TABLE 8

| | Light transmittance at 470 nm, % | |
|---|---|---|
| | Initial stage | After light resistance test |
| Example 28 | 88 | 89 |
| Example 29 | 85 | 86 |
| Example 30 | 89 | 88 |
| Example 31 | 89 | 88 |

From table 8, it is found that the curing products of the invention have excellent light resistance.

EXAMPLE 32

The sheet-shaped curing product produced in Example 31 is cut into an appropriate form, and fixed on a light-transmitting window disposed on a metal cap for can type. Meanwhile, a light emitting element having a double-hetero structure in which an Si- and Zn-doped InGaN active layer formed on a sapphire substrate by MOCVD (Metal Organic Chemical Vapor Deposition) method being sandwiched with n- and p-type AlGaN clad layers is prepared. Successively, this light emitting element is mounted on a metal stem for can type, and p- and n-electrodes were wire-bonded with an Au line to the respective leads. This is air-sealed with the above metal cap for can type. In this manner, a can type light-emitting diode can be produced.

EXAMPLE 33

On a washed sapphire substrate, by MOCVD (Metal Organic Chemical Vapor Deposition) method, the below-mentioned layers are laminated in the following order: n-type GaN layer which is an undoped nitride semiconductor; GaN layer which is to be an n-type contact layer formed with an Si-doped n-type electrode; n-type GaN layer which is an undoped nitride semiconductor; GaN layer which is to be a barrier layer constituting a light emitting layer; InGaN layer constituting a well layer; GaN layer which is to be a barrier layer (quantum well structure); AlGaN layer as a p-type clad layer doped with Mg on a light emitting layer; and GaN layer which is an Mg-doped p-type contact layer. By etching, the surfaces of p- and n-contact layers are exposed on the same side of the nitride semiconductor on the sapphire substrate. On the respective contact layers, Al is deposited by a sputtering method to form positive and negative electrodes. A scribing-line was drawn on the prepared semiconductor wafer, and then the wafer is divided by external pressure to form a light emitting element.

On the bottom surface of a silver-plated mount lead cup constituted of iron-containing copper, the above light emitting element is die-bonded using an epoxy resin composition as a die bond resin. The resultant is heated at 170° C. for 75 minutes to cure the epoxy resin composition to fix the light emitting element. Next, the positive and negative electrodes of the light emitting element, the mount lead and inner lead are wire-bonded with an Au line to gain electric access.

A curable composition prepared in the same manner as Example 31 is poured into a casting case, which is a bombshell-shaped molding form. Parts of the mount lead and inner lead, the cup of which is disposed with the above light emitting element, are inserted into the casting case to carry out an initial curing at 100° C. for 1 hour. The light-emitting diode is withdrawn from the casting case and cured at 120° C. for 1 hour under nitrogen atmosphere. Thereby, a lump type light-emitting diode such as a bombshell-shaped one can be produced.

EXAMPLE 34

A curable composition is produced by the method described in Example 31.

A pair of copper foil patterns is formed on a glass epoxy resin by etching to produce a substrate having lead electrodes. A light emitting element is die-bonded on the glass epoxy resin using an epoxy resin. The respective electrodes of the light emitting element and respective lead electrodes are wire-bonded with an Au line to gain electric access. On the substrate, a glass epoxy resin having a through hole is fixed and disposed to function as a mask and sidewall. In this condition, the resultant is disposed in vacuum equipment, the curable composition is dispensed on the glass epoxy resin substrate disposed with the light emitting element, and the curable composition is filled into a cavity utilizing the through hole. In this condition, the composition is cured at 100° C. for 1 hour, and further at 150° C. for 1 hour. By dividing with every light-emitting diode tip, a tip type light-emitting diode can be produced.

EXAMPLE 35

A curable composition is produced by the method described in Example 31.

By insert molding, a package of a tip type light-emitting diode is formed using a PPS resin. Inside of the package, an aperture to be disposed with a light emitting element is equipped and a silver-plated copper plate is placed as an external electrode. A light emitting element is fixed by die bonding inside the package using an epoxy resin. An Au line, which is a conductive wire, is electrically connected to the respective electrodes of the light emitting element and the respective external electrodes disposed in the package by wire bonding. Inside of the package aperture, a curable composition is filled as a sealing member. In this condition, the composition is cured at 100° C. for 1 hour, and further at 150° C. for 1 hour. In this manner, a tip type light-emitting diode can be produced.

EXAMPLE 36

A hard molding is produced by the method described in Example 28.

A light-emitting diode of Example 36 is equipped with a light emitting element emitting blue or bluish light, a package having an aperture comprising a bottom surface on which said light emitting element is to be disposed and side walls, and a sealing member for sealing said aperture. In this sealing member, the hard molding produced by the method described in Example 28, and a YAG fluorescent substance having a composition of $(Y_{0.8}Gd_{0.2})_3Al_5O_{12}:Ce$ are used. The hard molding of Example 28 and YAG fluorescent substance are uniformly mixed, and then the mixture is poured into the aperture of the package which is to be disposed with a light emitting element. After the pouring, the mixture was heated in a hot air drier at 60° C. for 6 hours, 70° C. for 1 hour, 80° C. for 1 hour, 120° C. for 1 hour and 150° C. for 1 hour, in that order, followed by curing. Thereby, a light-emitting diode emitting white or whity light was produced.

COMPARATIVE EXAMPLE 8

By the same method in Example 36, a light-emitting diode was produced using an epoxy resin in lieu of the curable composition of the invention. Said epoxy resin was prepared by mixing 30 g of Celoxide 2021 P (product of Daicel Chemical Industries, Ltd.), 70 g of YX 8000 (product of Japan Epoxy Resins Co., Ltd.), and 1 g of San-aid SI-100L (product of Sanshin Chemical Industry Co., Ltd.). This epoxy resin and the YAG fluorescent substance having the above composition are uniformly mixed, and then this mixture is poured into the aperture of the package which is to be disposed with a light emitting element. After the pouring, the epoxy resin was heated in a hot air drier at 90° C. for 3 hours and 150° C. for 4 hours, followed by curing. Thereby, a light-emitting diode of Comparative Example 8 was produced.

(Adhesive Property Test)

The light-emitting diode of Example 36 had higher adhesive properties than that of the light-emitting diode of Comparative Example 8. Moreover, the light-emitting diode of Example 36 had higher thermal shock ability than that of the light-emitting diode of Comparative Example 8.

SYNTHESIS EXAMPLE 2

A 5-L separable flask was charged with 1.38 kg of toluene and 1.36 kg of 1,3,5,7-tetramethylcyclotetrasiloxane, and heated until the inside temperature arrived at 100° C. Thereto was added dropwise a mixture of 300 g of diallyl monoglycidyl isocyanurate, 1.36 mL of platinum-vinylsiloxane complex solution in xylene (containing 3% by weight of platinum) and 300 g of toluene. The addition was completed in 30 minutes. During the addition, the inside temperature arose to 109° C. The unreacted portion of 1,3,5,7-tetramethylcyclotetrasiloxane and the toluene were distilled off under reduced pressure. $^1$H-NMR revealed that the product was the reaction product resulting from part of the SiH groups of 1,3,5,7-tetramethylcyclotetrasiloxane with diallyl monoglycidyl isocyanurate (hereinafter referred to as partial reaction product B2, SiH value: 8.7 mmol/g). The product is a mixture but contains, as a main component, the compound having the structure given below, which is the component (B) of the invention. It also contains the platinum-vinylsiloxane complex, which is the component (C) of the invention.

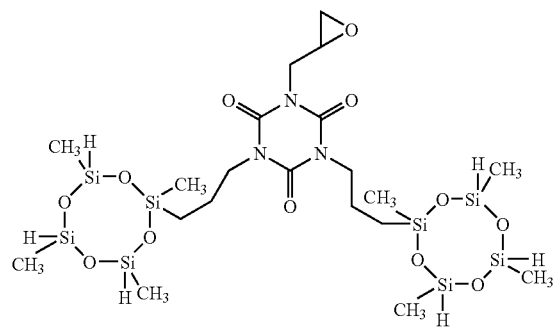

SYNTHESIS EXAMPLE 3

A 1-L separable flask was charged with 0.2 kg of toluene and 0.2 kg of 1,3,5,7-tetramethylcyclotetrasiloxane, and heated until the inside temperature arrived at 100° C. Thereto was added dropwise a mixture of 234 g of monoallyl diglycidyl isocyanurate, 0.50 mL of platinum-vinylsiloxane complex solution in xylene (containing 3% by weight of platinum) and 234 g of toluene. The addition was completed in 25 minutes. During the addition, the inside temperature arose to 106° C. The unreacted portion of 1,3,5,7-tetramethylcyclotetrasiloxane and the toluene were distilled off under reduced pressure. $^1$H-NMR revealed that the product was the reaction product resulting from part of the SiH groups of 1,3,5,7-tetramethylcyclotetrasiloxane with monoallyl diglycidyl isocyanurate (hereinafter referred to as partial reaction product B3, SiH value: 3.9 mmol/g). The product is a mixture but contains, as a main component, the compound having the structure given below, which is the component (B) of the invention. It also contains the platinum-vinylsiloxane complex, which is the component (C) of the invention.

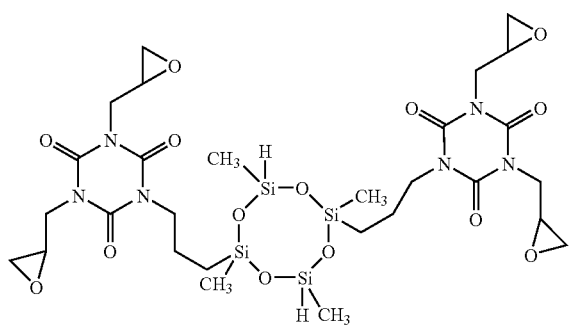

EXAMPLE 37

Triallyl isocyanurate (6.68 g) and 7.11 g of diallyl monoglycidyl isocyanurate were used as the component (A), 18.87 g of the reaction product (B2) prepared in Synthesis Example 2 as the component (B), 98 mg of a platinum-vinylsiloxane complex solution in xylene (containing 3% by weight of platinum) as the component (C). A mixture (mixture A) was prepared in advance by mixing up the above components (A), (C) and 327 mg of aluminum tris(ethyl acetoacetate) (Kawaken Fine Chemicals Co., Ltd., product name: ALCH-TR) with stirring. Separately, a mixture (mixture B) was prepared in advance by mixing up the above components (B), 98 mg of 1-ethynyl-1-cyclohexanol, and 1.63 g of γ-glycidoxypropyltrimethoxysilane with stirring. A one-pot mixture was prepared by mixing up the above mixtures A and B with stirring and degassing. The above one-pot mixture was poured into a cell produced by inserting a 3-mm-thick silicone rubber sheet as a spacer between two glass plates, heated in a hot air drier at 60° C. for 6 hours, 70° C. for 1 hour, 80° C. for 1 hour, 120° C. for 1 hour and 150° C. for 1 hour, in that order, to obtain a transparent and hard molding.

EXAMPLE 38 TO EXAMPLE 45

On the basis of the formulations shown in Table 9, the components were formulated, cured in the same condition as Example 37, and transparent and hard moldings were obtained.

TABLE 9

| | | Example 37 | Example 38 | Example 39 | Example 40 | Example 41 | Example 42 | Example 43 | Example 44 | Example 45 |
|---|---|---|---|---|---|---|---|---|---|---|
| (Mixture A) | | | | | | | | | | |
| TAIC[1] | g | 6.68 | 3.04 | 6.68 | 4.45 | 3.32 | 2.53 | 1.33 | 6.13 | 1.67 |
| DA-MGIC[2] | g | 7.11 | 12.93 | 7.11 | 4.74 | 6.56 | 10.77 | 12.70 | — | 7.12 |
| PTVTS[3] | mg | 98 | 105 | 98 | 65 | 67 | 87 | 89 | 75 | 83 |
| ALCH-TR[4] | mg | 327 | 348 | — | — | — | — | — | — | — |
| B(OMe)$_3$ | g | — | — | 0.16 | 0.22 | 0.23 | 0.15 | 0.15 | 0.13 | 0.14 |
| (Mixture B) | | | | | | | | | | |
| Partial reaction product (B2) | g | 18.87 | 18.87 | 18.87 | 12.58 | 12.58 | 15.72 | 15.72 | — | — |
| Partial reaction product (B3) | g | — | — | — | — | — | — | — | 18.87 | 18.87 |
| 1-ECH[5] | mg | 98 | 105 | 98 | 65 | 67 | 87 | 89 | 75 | 83 |
| A-187[6] | g | 1.63 | 1.74 | 0.82 | 1.09 | 1.12 | 0.73 | 0.74 | 0.63 | 0.69 |

[1] Triallyl isocyanurate, Nihon Kasei Chemical Co., Ltd.
[2] Diallyl monoglycidyl isocyanurate, Shikoku Corp.
[3] Platinum vinylsiloxane complex solution in xylene (containing 3 wt % of platinum), OMG Precious Metals Japan
[4] Kawaken Fine Chemicals, Co., Ltd.
[5] 1-ethynyl-1-cyclohexanol, Aldrich.
[6] γ-glycidoxy propyl trimethoxy silane, Nippon Unicar Co., Ltd.

MEASUREMENT EXAMPLE 14

For the samples obtained in Examples 37 to 45, tensile elasticity and tensile elongation were evaluated. The test samples were prepared as follows. The plate-shaped curing products of 3 mm in thickness were cut into rectangles of 6×55×3 mm, and near the center of longitudinal sides thereof were notched from both sides in U shape of r=1.0 mm and depth of 1 mm. The measurement was carried out using an autograph placed under the condition of 50% RH at 23° C., and the distance between the chucks was set at 15 mm. The U-notch parts of the test samples were placed near the center of the chucks, both ends thereof were pinched with the chucks, and tensile test was carried out at a tensile speed of 1 mm/min. The obtained results are shown in Table 10.

TABLE 10

| | Example 37 | Example 38 | Example 39 | Example 40 | Example 41 | Example 42 | Example 43 | Example 44 | Example 45 |
|---|---|---|---|---|---|---|---|---|---|
| Tensile strength MPa | 31.6 | 35.1 | 43.1 | 39.4 | 42.9 | 53.3 | 52.3 | 56.5 | 53.4 |
| Elongation % | 5.8 | 4.9 | 7.3 | 10.6 | 14.7 | 12.2 | 9.4 | 10.3 | 11.3 |

From Table 10, it is found that the curing products of the invention have high tensile strength and elongation, as well as high toughness.

MEASUREMENT EXAMPLE 15

For the samples obtained in Examples 37 to 45, the light transmittance at a wavelength of 470 nm was measured. As transmittance measuring equipment, spectrophotometer U-3300 manufactured by Hitachi, Ltd. was used. The obtained results are shown in Table 11.

TABLE 11

| | Example 37 | Example 38 | Example 39 | Example 40 | Example 41 | Example 42 | Example 43 | Example 44 | Example 45 |
|---|---|---|---|---|---|---|---|---|---|
| Light Transmittance % | 87 | 87 | 90 | 90 | 90 | 90 | 90 | 90 | 90 |

From Table 11, it is found that the curing products of the invention have high light transmittance as high as those of the curing products obtained in Comparative Examples.

EXAMPLE 46

The sheet-shaped curing product produced in Example 37 is cut into an appropriate form, and fixed on a light-transmitting window disposed on a metal cap for can type. Meanwhile, a light emitting element having a double-hetero structure in which an Si- and Zn-doped InGaN active layer formed on a sapphire substrate by MOCVD (Metal Organic Chemical Vapor Deposition) method is being sandwiched with n- and p-type AlGaN clad layers is prepared. Successively, this light emitting element is mounted on a metal stem for can type, and p- and n-electrodes were wire-bonded with an Au line to the respective leads. This is air-sealed with the above metal cap for can type. In this manner, a can type light-emitting diode can be produced.

EXAMPLE 47

On a washed sapphire substrate, by MOCVD (Metal Organic Chemical Vapor Deposition) method, the below-mentioned layers are laminated in the following order: n-type GaN layer which is an undoped nitride semiconductor; GaN layer which is to be an n-type contact layer formed with an Si-doped n-type electrode; n-type GaN layer which is an undoped nitride semiconductor; GaN layer which is to be a barrier layer constituting a light emitting layer; InGaN layer constituting a well layer; GaN layer which is to be a barrier layer (quantum well structure); AlGaN layer as a p-type clad layer doped with Mg on a light emitting layer; and GaN layer which is an Mg-doped p-type contact layer. By etching, the surfaces of p- and n-contact layers are exposed on the same side of the nitride semiconductor on the sapphire substrate. On the respective contact layers, Al is deposited by a sputtering method to form positive and negative electrodes. A scribing line was drawn on the prepared semiconductor wafer, and then the wafer is divided by external pressure to form a light emitting element.

On the bottom surface of a silver-plated mount lead cup constituted of iron-containing copper, the above light emitting element is die-bonded using an epoxy resin composition as a die bond resin. The resultant is heated at 170° C. for 75 minutes to cure the epoxy resin composition to fix the light emitting element. Next, the positive and negative electrodes of the light emitting element, the mount lead and inner lead are wire-bonded with an Au line to gain electric access.

A curable composition prepared in the same manner as Example 37 is poured into a casting case, which is a bombshell-shaped molding form. Parts of the mount lead and inner lead, the cup of which is disposed with the above light emitting element, are inserted into the casting case to carry out an initial curing at 100° C. for 1 hour. The light-emitting diode is withdrawn from the casting case and cured at 120° C. for 1 hour under nitrogen atmosphere. Thereby, a lump type light-emitting diode such as a bombshell-shaped one can be produced.

EXAMPLE 48

A curable composition is produced by the method described in Example 37.

A pair of copper foil patterns is formed on a glass epoxy resin by etching to produce a substrate having lead electrodes. A light emitting element is die-bonded on the glass epoxy resin using an epoxy resin. The respective electrodes of the light emitting element and respective lead electrodes are wire-bonded with an Au line to gain electric access. On the substrate, a glass epoxy resin having a through hole is fixed and disposed using an epoxy resin to function as a mask and sidewall. In this condition, the resultant is disposed in vacuum equipment, the curable composition is dispensed on the glass epoxy resin substrate disposed with the light emitting element, and the curable composition is filled into a cavity utilizing the through hole. In this condition, the composition is cured at 100° C. for 1 hour, and further at 150° C. for 1 hour. By dividing with every light-emitting diode tip, a tip type light-emitting diode can be produced.

EXAMPLE 49

A curable composition is produced by the method described in Example 37.

By insert molding, a package of a tip type light-emitting diode is formed using a PPS resin. Inside of the package, an aperture to be disposed with a light emitting element is equipped and a silver-plated copper plate is placed as an external electrode. A light emitting element is fixed by die bonding inside the package using an epoxy resin. An Au line, which is a conductive wire, is electrically connected to the respective electrodes of the light emitting element and the respective external electrodes disposed in the package by wire bonding. Inside of the package aperture, a curable composition is filled as a sealing member. In this condition, the composition is cured at 100° C. for 1 hour, and further at 150° C. for 1 hour. In this manner, a tip type light-emitting diode can be produced.

EXAMPLE 50

A hard molding is produced by the method described in Example 39.

A light-emitting diode of Example 50 is equipped with a light-emitting element emitting blue or bluish light, a package having an aperture comprising a bottom surface on which said light emitting element is to be disposed and side walls, and a sealing member for sealing said aperture. In this sealing member, the hard molding produced by the method described in Example 39, and a YAG fluorescent substance having a composition of $(Y_{0.8}Gd_{0.2})_3Al_5O_{12}$:Ce are used. The hard molding of Example 39 and YAG fluorescent substance are uniformly mixed, and then the mixture is poured into the aperture of the package which is to be disposed with a light emitting element. After the pouring, the mixture was heated in a hot air drier at 60° C. for 6 hours, 70° C. for 1 hour, 80° C. for 1 hour, 120° C. for 1 hour and 150° C. for 1 hour, in that order, followed by curing. Thereby, a light-emitting diode emitting white or whity light was produced.

COMPARATIVE EXAMPLE 9

By the same method in Example 50, a light-emitting diode was produced using an epoxy resin in lieu of the curable composition of the invention. Said epoxy resin was prepared by mixing 30 g of Celoxide 2021 P (product of Daicel Chemical Industries, Ltd.), 70 g of YX 8000 (product of Japan Epoxy Resins Co., Ltd.), and 1 g of San-aid SI-100L (product of Sanshin Chemical Industry Co., Ltd.). This epoxy resin and the YAG fluorescent substance having the above composition are uniformly mixed, and then this mixture is poured into the aperture of the package which is to be disposed with a light emitting element. After the pouring, the epoxy resin was heated in a hot air drier at 90° C. for 3 hours and 150° C. for 4 hours, followed by curing. Thereby, a light-emitting diode of Comparative Example 9 was produced.

(Driving Test of the Light-Emitting Diode)

Using the light-emitting diodes produced in Example 50 and Comparative Example 9, a driving test was carried out. Table 12 shows the result of the driving test of the light-emitting diodes of Example 50 and Comparative Example 9 under the predetermined condition.

TABLE 12

| | Room temperature, 20 mA 1000 hours (%) | Room temperature, 40 mA 1000 hours (%) | Room temperature, 60 mA 1000 hours (%) | 60° C., 90%, 20 mA 1000 hours (%) |
|---|---|---|---|---|
| Example 50 | 108 | 107 | 80 | 100 |
| Compar. Ex. 9 | 90 | 62 | 21 | 60 |

The light-emitting diode was allowed to stand and absorb moisture at 30° C. and humidity of 70% for 168 hours, and then packaged by reflowing. After the packaging, under the predetermined temperature and humidity condition, the driving test of the light-emitting diode was carried out.

The outline of the driving test of the light-emitting diode is as follows: at the predetermined temperature and humidity, the light-emitting diode is charged with a certain level of forward direction current and the relation between the optical output and the lapsed time was determined. The optical output immediately after the reflowing was measured and the obtained value was set at 100%. Then, the optical output after the electric charging for 1000 hours was measured and its relative value was obtained. As higher this relative value is, the more resistance the diode has for long term storage and driving.

First, to the light-emitting diodes obtained in Example 50 and Comparative Example 9, 20 mA of forward direction current was charged at room temperature and the optical output after the lapse of 1000 hours was measured. As the result, the light-emitting diode of Example 50 showed higher optical output than that of Comparative Example 9. Moreover, the optical output of the light-emitting diode of Example 50 did not decrease.

Secondary, to the light-emitting diodes obtained in Example 50 and Comparative Example 9, 40 mA of forward direction current was charged at room temperature and the optical output after the lapse of 1000 hours was measured. As the result, the light-emitting diode of Example 50 showed significantly higher optical output than that of Comparative Example 9. Moreover, the optical output of the light-emitting diode of Example 50 did not decrease.

Then, to the light-emitting diodes obtained in Example 50 and Comparative Example 9, 60 mA of forward direction current was charged at room temperature and the optical output after the lapse of 1000 hours was measured. As the result, the light-emitting diode of Example 50 showed significantly higher optical output than that of Comparative Example 9.

Furthermore, to the light-emitting diodes obtained in Example 50 and Comparative Example 9, 20 mA of forward direction current was charged under high temperature and high humidity condition at 60° C. and humidity of 90%, and the optical output after the lapse of 1000 hours was measured. As the result, the light-emitting diode of Example 50 showed significantly higher optical output than that of Comparative Example 9. Moreover, the optical output of the light-emitting diode of Example 50 scarcely decreased.

From the above-mentioned test results, it is found that the light-emitting diode of the invention can maintain high reliability even under strict storage, packaging, and use conditions.

INDUSTRIAL APPLICABILITY

The curable composition of the invention used for a light-emitting diode is excellent in adhesive properties and has high transparency. Furthermore, since the composition is high in toughness and transparency, it can be used as a sealing member for light-emitting diodes.

The invention claimed is:

1. A curable composition which contains
   (A) an organic compound containing at least two carbon-carbon double bonds reactive with a SiH group in each molecule,
   (B) a compound having at least two SiH groups in each molecule,
   (C) a hydrosilylation catalyst,
   (D) a silane coupling agent and/or an epoxy group-containing compound, and
   (B) a silanol condensation catalysts,
   wherein the component (E) is a borate ester.

2. The curable composition according to claim 1,
   wherein the component (D) is a silane coupling agent having at least one functional group selected from the group consisting of epoxy, methacryl, acryl, isocyanate, isocyanurate, vinyl and carbamate group and hydrolyzable silyl group in each molecule.

3. The curable composition according to claim 1,
   wherein the component (D) is a silane coupling agent having an epoxy group and a hydrolyzable silyl group in each molecule.

4. The curable composition according to claim 1,
   wherein the component (B) is at least one species selected from the group consisting of trinormaloctadecyl borate, trinormaloctyl borate, trinormalbutyl borate, triisopropyl borate, trinormalpropyl borate, triethyl borate and trimethyl borate.

5. The curable composition according to claim 1,
   wherein the component (A) is a compound represented by the following general formula (I):

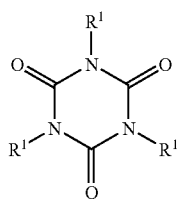

in the formula, each $R^1$ represents a univalent organic group containing 1 to 50 carbon atoms and each $R^1$ group may be the same or different.

6. The curable composition according to claim 1,
   wherein the component (A) is triallyl isocyanurate and the component (B) is a reaction product from 1,3,5,7-tetramethylcyclotetrasiloxane and triallyl isocyanurate.

7. The curable composition according to claim 1,
   which contains a compound represented by the following general formula (II) as the component (A):

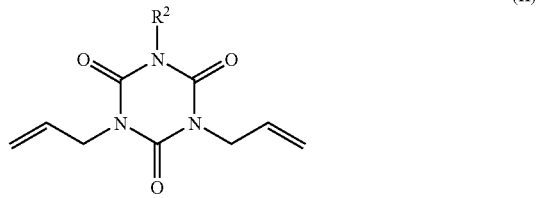

in the formula, $R^2$ represents a hydrogen atom, or an organic group which does not contain a functional group subjectable to hydrosilylation reaction.

8. The curable composition according to claim 7,
   which further contains triallyl isocyanurate as the component (A).

9. The curable composition according to claim 7,
   wherein $R^2$ represents a hydrogen atom, or a univalent organic group containing 1 to 50 carbon atoms.

10. The curable composition according to claim 7,
    wherein the compound represented by the general formula (II) accounts for 20% by weight or more in the component (A).

11. The curable composition according to claim 8,
    wherein the compound represented by the general formula (II) is diallyl monoglycidyl isocyanurate.

12. The curable composition according to claim 11,
    wherein the component (B) is a reaction product from 1,3,5,7-tetramethylcyclotetrasiloxane and triallyl isocyanurate.

13. The curable composition according to any one of claim 1,
    wherein the component (B) contains
    a compound obtained by hydrosilylation reaction between a compound represented by the following general formula (III)

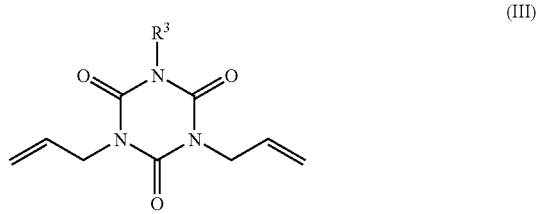

in the formula, $R^3$ represents a hydrogen atom, or an organic group which does not contain a functional group subjectable to hydrosilylation reaction: and a compound having at least two SiH groups in each molecule, and/or
a compound obtained by hydrosilylation reaction between a compound represented by the following general formula (IV):

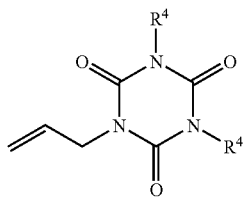

(IV)

in the formula, R⁴ represents a hydrogen atom, or an organic group which does not contain a functional group subjectable to hydrosilylation reaction, and each R⁴ may be the same or different: and a compound having at least three SiH groups in each molecule.

14. The curable composition according to claim 13, wherein R³ and R⁴ represent hydrogen atoms or univalent organic groups containing 1 to 50 carbon atoms.

15. The curable composition according to claim 13, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate.

16. The curable composition according to claim 13, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate as exclusive constituents.

17. The curable composition according to claim 13, wherein the component (A) is triallyl isocyanurate.

18. The curable composition according to claim 13, wherein the component (A) is a mixture of triallyl isocyanurate and diallyl monoglycidyl isocyanurate.

19. A cured product which is obtained by curing the curable composition according to claim 1.

20. A process for producing a cured product which comprises curing the curable composition according to claim 1.

21. A light-emitting diode which is sealed with the cured product according to claim 19.

22. A curable composition which contains
(A) an organic compound containing at least two carbon-carbon double bonds reactive with a SiH group in each molecule,
(B) a compound having at least two SiH groups in each molecule, and
(C) a hydrosilylation catalyst,
in which a compound represented by the following general formula (II):

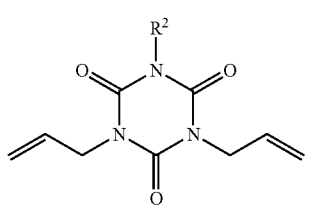

(II)

in the formula, R² represents a hydrogen atom, or an organic group which does not contain a functional group subjectable to hydrosilylation reaction: is contained as the component (A), and the compound represented by the general formula (II) accounts for 20% by weight or more in the component (A).

23. The curable composition according to claim 22, which further contains triallyl isocyanurate as the component (A).

24. The curable composition according to claim 22, wherein R² represents a hydrogen atom, or a univalent organic group containing 1 to 50 carbon atoms.

25. The curable composition according to claim 23, wherein the compound represented by the general formula (II) is diallyl monoglycidyl isocyanurate.

26. The curable composition according to claim 22, wherein the component (B) is a reaction product from 1,3,5,7-tetramethylcyclotetrasiloxane and triallyl isocyanurate.

27. A cured product which is obtained by curing the curable composition according to claim 22.

28. A process for producing a cured product which comprises curing the curable composition according to claim 22.

29. A curable composition which contains
(A) an organic compound containing at least two carbon-carbon double bonds reactive with a SiH group in each molecule,
(B) a compound having at least two SiH groups in each molecule, and
(C) a hydrosilylation catalyst,
in which the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate.

30. The curable composition according to claim 29, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate as exclusive constituents.

31. The curable composition according to claim 29, wherein the component (A) is triallyl isocyanurate.

32. The curable composition according to claim 29, wherein the component (A) is a mixture of triallyl isocyanurate and diallyl monoglycidyl isocyanurate.

33. A cured product which is obtained by curing the curable composition according to claim 29.

34. A process for producing a cured product which comprises curing the curable composition according to claim 29.

35. A light-emitting diode which comprises a light emitting element, a substrate on the top surface of which is formed with an external electrode to be disposed with said light emitting element, and a sealing member disposed adjacently onto said substrate, the contact surface between said electrode and said sealing member being 50 to 90% when the contact surface between said substrate and said sealing member is set at 100%, and said sealing member being a curing product obtained from a curable composition containing
(A) an organic compound containing at least two carbon-carbon double bonds reactive with a SiH group in each molecule,
(B) a compound having at least two SiH groups in each molecule,
(C) a hydrosilylation catalyst,
(D) a silane coupling agent and/or an epoxy group-containing compound, and
(E) a silanol condensation catalyst,
wherein the component (E) is a borate ester.

36. The light emitting diode according to claim 35, wherein the substrate is formed from a composition containing a semicrystalline polymer resin.

37. A light-emitting diode which comprises a light emitting element, a package comprising an aperture having a bottom surface to be disposed with said light emitting element and sidewalls, and a sealing member for sealing said aperture, said package being formed of a molding resin by a monolithic process with one end of the external electrode being exposed on said aperture bottom, the area of said external electrode on said aperture bottom being 50 to 90% when the surface area of said aperture bottom is set at 100%, and said sealing member being a curing product obtained from a curable composition containing
(A) an organic compound containing at least two carbon-carbon double bonds reactive with a SiH group in each molecule,
(B) a compound having at least two SiH groups in each molecule,
(C) a hydrosilylation catalyst,
(D) a silane coupling agent and/or an epoxy group-containing compound, and
(E) a silanol condensation catalysts,
wherein the component (E) is a borate ester.

38. The light-emitting diode according to claim 37, wherein the package is formed of a molding resin by a monolithic process with the respective ends of an external positive electrode and an external negative electrode being exposed at a predetermined distance on the aperture bottom, and said respective exposed external electrode on said aperture bottom having at least one pair of resin exposure parts of the molding resin of the package.

39. The light-emitting diode according to claim 37, wherein the molding resin of the package is a composition containing a semicrystalline polymer resin.

40. The light-emitting diode according to claims 35 or 37, wherein the component (D) is a silane coupling agent having at least one functional group selected from the group consisting of epoxy, methacryl, acryl, isocyanate, isocyanurate, vinyl and carbamate group and a hydrolyzable silyl group in each molecule.

41. The light-emitting diode according to claims 35 or 37, wherein the component (B) is at least one species selected from the group consisting of trinormaloctadecyl borate, trinormaloctyl borate, trinormalbutyl borate, triisopropyl borate, trinormalpropyl borate, triethyl borate and trimethyl borate.

42. The light-emitting diode according to claims 35 or 37, wherein the component (A) is triallyl isocyanurate and the component (B) is a reaction product from 1,3,5,7-tetramethylcyclotetrasiloxane and triallyl isocyanurate.

43. The light-emitting diode according to claims 35 or 37, wherein the curable composition contains a compound represented by the following general formula (II) as the component (A):

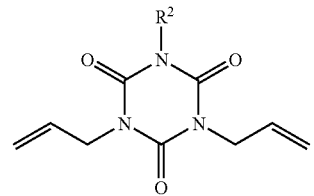

(II)

in the formula, $R^2$ represents a hydrogen atom, or an organic group which does not contain a functional group subjectable to hydrosilylation reaction.

44. The light-emitting diode according to claim 43, wherein the curable composition further contains triallyl isocyanurate as the component (A).

45. The light-emitting diode according to claim 43, wherein the compound represented by the general formula (II) accounts for 20% by weight or more in the component (A).

46. The light-emitting diode according to claim 43, wherein the compound represented by the general formula (II) is diallyl monoglycidyl isocyanurate.

47. The light-emitting diode according to claim 46, wherein the component (B) is a reaction product from 1,3,5,7-tetramethylcyclotetrasiloxane and triallyl isocyanurate.

48. The light-emitting diode according to claims 35 or 37, wherein the component (B) contains a compound obtained by hydrosilylation reaction between a compound represented by the following general formula (III):

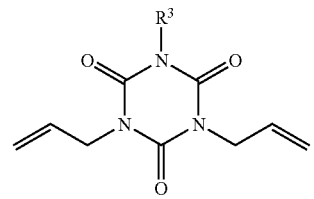

(III)

in the formula, $R^3$ represents a hydrogen atom, or an organic group which does not contain a functional group subjectable to hydrosilylation reaction: and a compound having at least two SiH groups in each molecule, and/or
a compound obtained by hydrosilylation reaction between a compound represented by the following general formula (IV):

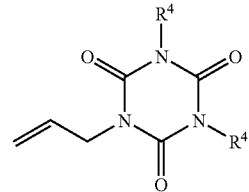

(IV)

in the formula, $R^4$ represents a hydrogen atom, or an organic group which does not contain a functional group subjectable to hydrosilylation reaction and each R⁴ may be the same or different: and a compound having at least three SiH groups in each molecule.

49. The light-emitting diode according to claim 48, wherein the component (B) contains a reaction product from 1,3,5,7-tetramethylcyclotetrasiloxane and diallyl monoglycidyl isocyanurate, and/or a reaction product from 1,3,5,7-tetramethylcyclotetrasiloxane and monoallyl diglycidyl isocyanurate.

50. The light-emitting diode according to claim 48, wherein the curable composition contains, as the component (B), a reaction product from 1,3,5,7-tetramethyl-cyclotetrasiloxane and diallyl monoglycidyl isocyanurate, and/or a reaction product from 1,3,5,7-tetramethylcyclotetrasiloxane and monoallyl diglycidyl isocyanurate as exclusive constituents.

51. The light-emitting diode according to claim 48, wherein the component (A) is triallyl isocyanurate.

52. The light-emitting diode according to claim 48, wherein the component (A) is a mixture of triallyl isocyanurate and diallyl monoglycidyl isocyanurate.

53. A light-emitting diode which comprises a light emitting element, a package comprising an aperture having a bottom surface to be disposed with said light emitting element and sidewalls, and a sealing member for sealing said aperture, said package being formed of a molding resin by a monolithic process with one end of the external electrode being exposed on said aperture bottom, the area of said external electrode on said aperture bottom being 50 to 90% when the surface area of said aperture bottom is set at 100%, and said sealing member containing the curing product according to claims 27 or 33.

54. The light-emitting diode according to claim 53, wherein the package is formed of a molding resin by a monolithic process with the respective ends of an external positive electrode and an external negative electrode being exposed at a predetermined distance on the aperture bottom, and said respective exposed external electrode on said aperture bottom having at least one pair of resin exposure parts of the molding resin of the package.

55. The light-emitting diode according to claim 53, wherein the molding resin of the package is a composition containing a semicrystalline polymer resin.

* * * * *

UNITED STATES PATENT AND TRADEMARK OFFICE
CERTIFICATE OF CORRECTION

PATENT NO. : 7,371,462 B2  Page 1 of 1
APPLICATION NO. : 10/512135
DATED : May 13, 2008
INVENTOR(S) : Tsumura et al.

It is certified that error appears in the above-identified patent and that said Letters Patent is hereby corrected as shown below:

Col. 97 claim 1
Line 10, change "(B)" to --(E)--; and change "catalysts" to --catalyst--

Col. 97 claim 4
Line 2, change "(B)" to --(E)--

Col. 98 claim 13
Line 1, delete "(any one of)"

Col. 100 claim 26
Line 1, change "22" to --25--

Col. 101 claim 37
Line 22, change "catalysts" to --catalyst--

Col. 101 claim 41
Line 2, change "(B)" to --(E)--

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

PATENT NO.         : 7,371,462 B2                                              Page 1 of 1
APPLICATION NO. : 10/512135
DATED              : May 13, 2008
INVENTOR(S)        : Tsumura et al.

It is certified that error appears in the above-identified patent and that said Letters Patent is hereby corrected as shown below:

Col. 97 claim 1
Line 24, change "(B)" to --(E)--; and change "catalysts" to --catalyst--

Col. 97 claim 4
Line 39, change "(B)" to --(E)--

Col. 98 claim 13
Line 41, delete "(any one of)"

Col. 100 claim 26
Line 16, change "22" to --25--

Col. 101 claim 37
Line 35, change "catalysts" to --catalyst--

Col. 101 claim 41
Line 55, change "(B)" to --(E)--

This certificate supersedes the Certificate of Correction issued January 20, 2009.

Signed and Sealed this

Seventeenth Day of February, 2009

JOHN DOLL
*Acting Director of the United States Patent and Trademark Office*